(12) United States Patent
Gotoh

(10) Patent No.: US 8,629,797 B2
(45) Date of Patent: Jan. 14, 2014

(54) SWITCHED CAPACITOR CIRCUIT AND STAGE CIRCUIT FOR AD CONVERTER

(75) Inventor: Kunihiko Gotoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 138 days.

(21) Appl. No.: 13/411,018

(22) Filed: Mar. 2, 2012

(65) Prior Publication Data

US 2012/0162000 A1     Jun. 28, 2012

Related U.S. Application Data

(63) Continuation of application No. PCT/JP2009/065528, filed on Sep. 4, 2009.

(51) Int. Cl.
*H03M 1/12*     (2006.01)

(52) U.S. Cl.
USPC ........................................... 341/172; 341/155

(58) Field of Classification Search
USPC ............... 341/172, 110, 150, 131, 122; 330/9
See application file for complete search history.

(56) References Cited

U.S. PATENT DOCUMENTS

| | | |
|---|---|---|
| 2002/0027453 A1 | 3/2002 | Kulhalli et al. |
| 2004/0075601 A1 * | 4/2004 | Carreau et al. ................. 341/172 |
| 2005/0110669 A1 | 5/2005 | Mishra et al. |
| 2006/0061502 A1 | 3/2006 | Yoshioka et al. |

FOREIGN PATENT DOCUMENTS

| | | |
|---|---|---|
| JP | 2000-101434 A | 4/2000 |
| JP | 2006-86981 A | 3/2006 |
| WO | WO 2007/142327 A1 | 12/2007 |

OTHER PUBLICATIONS

R E Ahmed, "New Design Technique for Two-Step Flash A/D Convertors", Electronics Letters, Jul. 19, 1990, pp. 1185-1187, vol. 26, No. 15.
S Kawahito, "Low-Power Design of Pipeline A/D Converters", IEEE 2006 Custom Intergrated Circuits Conference (CICC), Sep. 10, 2006, pp. 505-512.

* cited by examiner

*Primary Examiner* — Joseph Lauture
(74) *Attorney, Agent, or Firm* — Arent Fox LLP

(57) ABSTRACT

A switched capacitor circuit, which is operable in two or more kinds of operation modes including a first and second operation modes, includes an amplifier and two or more internal capacitors with switches for controlling connection/disconnection of the capacitor. In the first operation mode that precedes the second operation mode, the switched capacitor circuit generates the first analog output voltage by using the first internal capacitor connected between an input terminal and output terminal of the amplifier by using its switches, the other internal capacitances connected between an input terminal of the amplifier and each analog input voltage supply by using its switches. In the second operation mode, the switched capacitor circuit generates the second analog output voltage with larger feedback factor of the amplifier than it in the first operation mode, by removing some of the internal capacitors, except the first internal capacitor, from the first operation mode.

20 Claims, 58 Drawing Sheets

FIG.2A
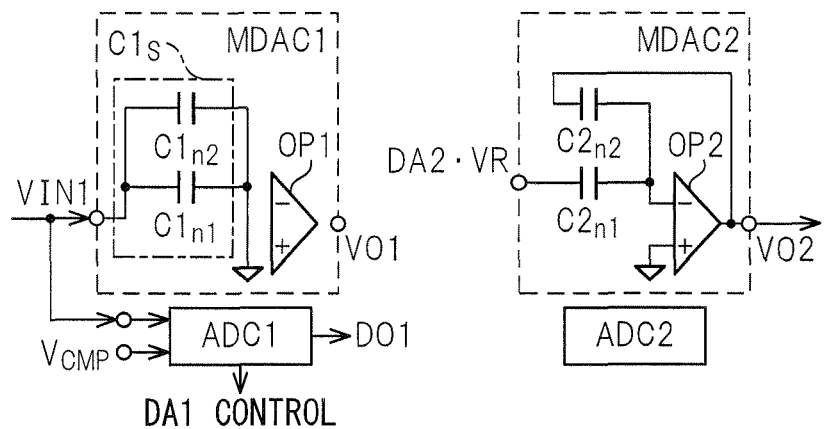
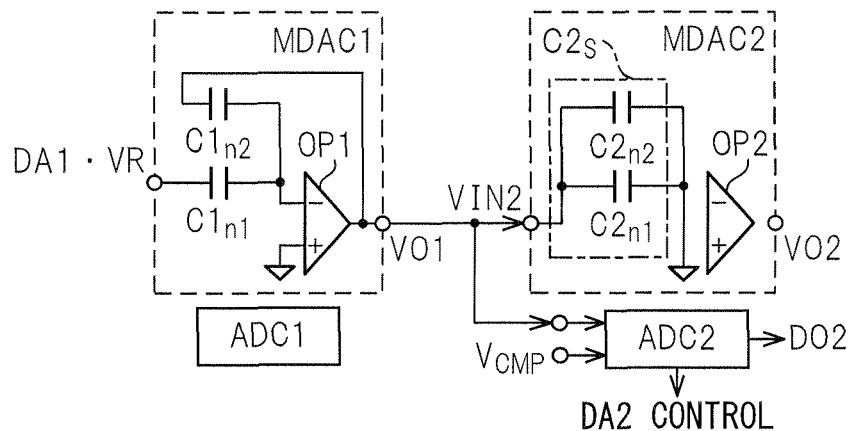

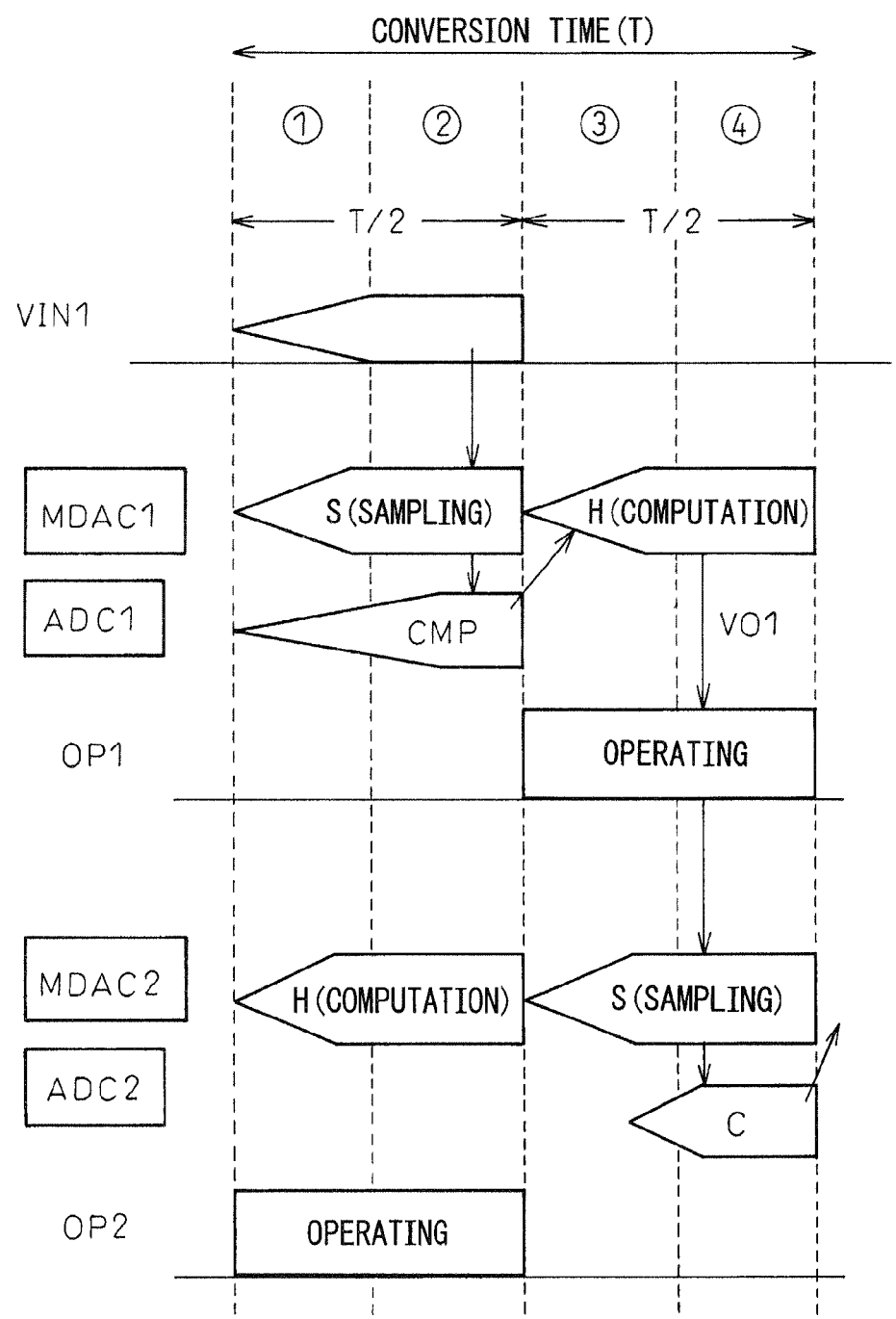

FIG.3D

| VIN($V_{CMP}$) | DO | DA=DA1 | VDA1 | VO=2*VIN−DA*VR |
|---|---|---|---|---|
| +VR≧VIN≧+(1/4)*VR | +01 | +1 | +VR | 2*VIN−VR |
| +(1/4)*VR>VIN≧−(1/4)*VR | 00 | 0 | 0 | 2*VIN |
| −(1/4)*VR>VIN≧−VR | −01 | −1 | −VR | 2*VIN+VR |

FIG.4C

| VIN($V_{CMP}$) | DO | DA=2DA2+DA1 | VDA2 | VDA1 | VO=4*VIN-DA*VR |
|---|---|---|---|---|---|
| +VR≧VIN≧+(5/8)*VR | +011 | +3 | +VR | +VR | 4*VIN-3*VR |
| +(5/8)*VR>VIN≧+(3/8)*VR | +010 | +2 | +VR | 0 | 4*VIN-2*VR |
| +(3/8)*VR>VIN≧+(1/8)*VR | +001 | +1 | 0 | +VR | 4*VIN-VR |
| +(1/8)*VR>VIN≧-(1/8)*VR | 000 | 0 | 0 | 0 | 4*VIN |
| -(1/8)*VR>VIN≧-(3/8)*VR | -001 | -1 | 0 | -VR | 4*VIN+VR |
| -(3/8)*VR>VIN≧-(5/8)*VR | -010 | -2 | -VR | 0 | 4*VIN+2*VR |
| -(5/8)*VR>VIN≧-VR | -011 | -3 | -VR | -VR | 4*VIN+3*VR |

FIG.6

| m VALUE | SCALING APPLIED/NOT APPLIED | T*I$_{AMP}$ BY FACTOR | T*I$_{AMP}$ (TOTAL) | 1/β | CL$_T$/C$_0$ | C2$_S$/C$_0$ | C$_{L1}$/C$_0$ | C1$_{MDAC}$/C$_0$ | C1$_H$/C$_0$ |
|---|---|---|---|---|---|---|---|---|---|
| m=2 | NO LOAD | REFERENCE (=1) | 1/2 | 2 | 1/4 | NONE | 1/4 | 1/2 | 1/2 |
| | SCALING APPLIED | ×3 | 3/2 | 2 | 3/4 | 1/2 | 1/4 | 1/2 | 1/2 |
| | SCALING NOT APPLIED | ×5 | 5/2 | 2 | 5/4 | 1 | 1/4 | 1/2 | 1/2 |
| m=4 | NO LOAD | REFERENCE (=1) | 3/4 | 4 | 3/16 | NONE | 3/16 | 3/4 | 1/4 |
| | SCALING APPLIED | ×(7/3) | 7/4 | 4 | 7/16 | 1/4 | 3/16 | 3/4 | 1/4 |
| | SCALING NOT APPLIED | ×(19/3) | 19/4 | 4 | 19/16 | 1 | 3/16 | 3/4 | 1/4 |

FIG.11

| SCALING APPLIED/NOT APPLIED | | $T*I_{AMP}$ BY FACTOR | $T*I_{AMP}$ | $TL_1*I_{AMP}$, $T2_S*I_{AMP}$ | $1/\beta$ | $CL_T/C_0$ | $C2_S/C_0$ | $C_{L1}/C_0$ | $C1_{MDAC}/C_0$ | $C1_H/C_0$ |
|---|---|---|---|---|---|---|---|---|---|---|
| APPLIED | MDAC OF FIG. 3A | REFERENCE (=1) | 3/2 | — | 2 | 3/4 | 1/2 | 1/4 | 1/2 | 1/2 |
| | MDAC OF 1ST EMBODIMENT | 2/3 (x0.67) | 1 (TOTAL) | 1/2 | 2 | 1/4 | NONE | 1/4 | 1/2 | 1/2 |
| | | | | 1/2 | 1 | 1/2 | 1/2 | 0 | NONE | 1/2 |
| NOT APPLIED | MDAC OF FIG. 3A | REFERENCE (=1) | 5/2 | — | 2 | 5/4 | 1 | 1/4 | 1/2 | 1/2 |
| | MDAC OF 1ST EMBODIMENT | 3/5 (x0.60) | 3/2 (TOTAL) | 1/2 | 2 | 1/4 | NONE | 1/4 | 1/2 | 1/2 |
| | | | | 1 | 1 | 1 | 1 | 0 | NONE | 1/2 |

FIG. 12

| SCALING APPLIED/NOT APPLIED | | $T*I_{AMP}$ BY FACTOR | $T*I_{AMP}$ | $TL_1*I_{AMP}$, $T2_S*I_{AMP}$ | $1/\beta$ | $CL_T/C_0$ | $C2_S/C_0$ | $C_{L1}/C_0$ | $C1_{MDAC}/C_0$ | $C1_H/C_0$ |
|---|---|---|---|---|---|---|---|---|---|---|
| APPLIED | MDAC OF FIG. 4A | REFERENCE (=1) | 7/4 | — | 4 | 7/16 | 1/4 | 3/16 | 3/4 | 1/4 |
| | MODIFIED MDAC OF 1ST EMBODIMENT | 4/7 (x0.57) | 1 (TOTAL) | 3/4 | 4 | 3/16 | NONE | 3/16 | 3/4 | 1/4 |
| | | | | 1/4 | 1 | 1/4 | 1/4 | 0 | NONE | 1/4 |
| NOT APPLIED | MDAC OF FIG. 4A | REFERENCE (=1) | 19/4 | — | 4 | 19/16 | 1 | 3/16 | 3/4 | 1/4 |
| | MODIFIED MDAC OF 1ST EMBODIMENT | 7/19 (x0.37) | 7/4 (TOTAL) | 3/4 | 4 | 3/16 | NONE | 3/16 | 3/4 | 1/4 |
| | | | | 1 | 1 | 1 | 1 | 0 | NONE | 1/4 |

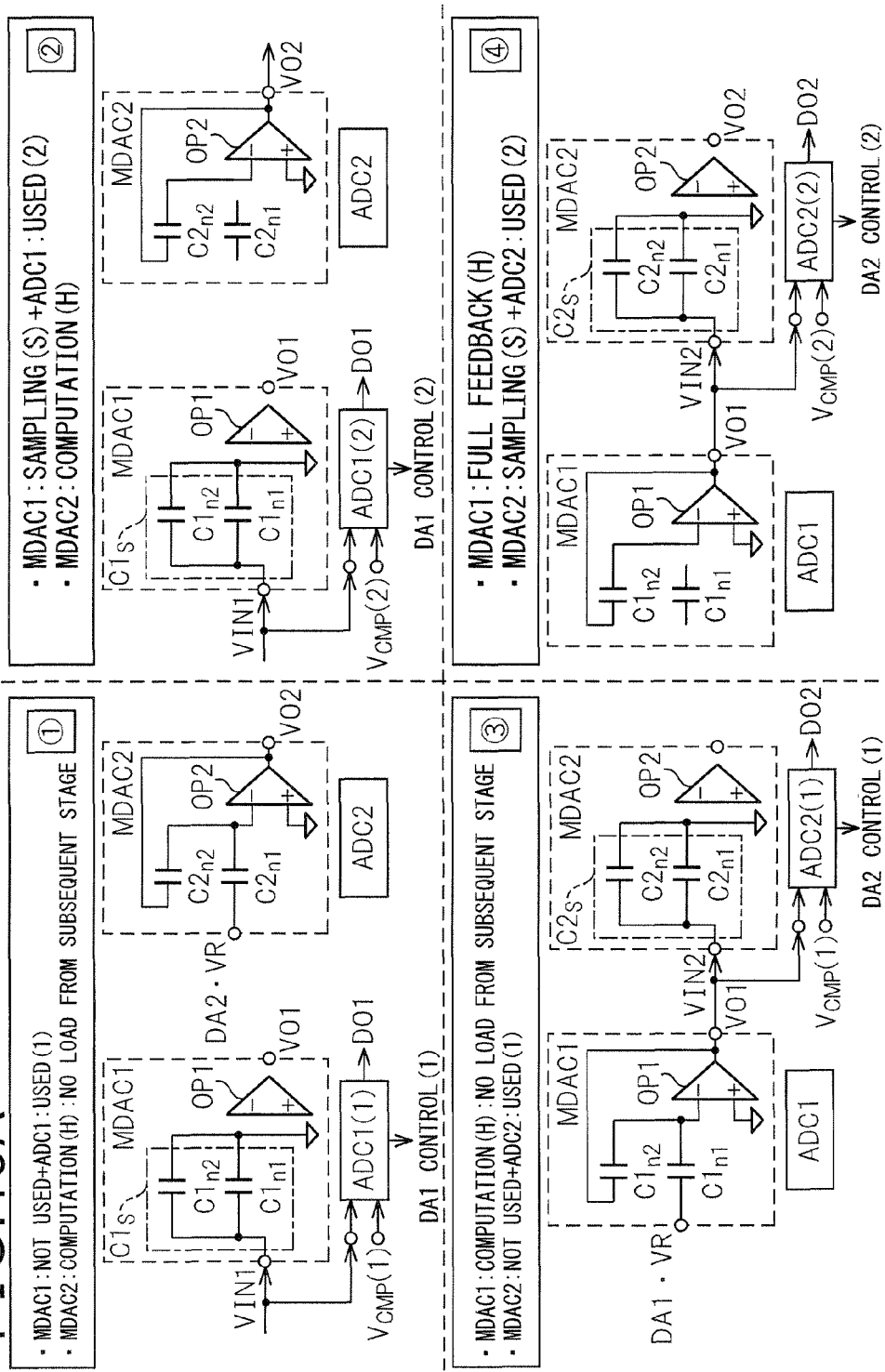

FIG.17

| ADC CIRCUIT | | FIRST-QUARTER OPERATION | SECOND-QUARTER OPERATION | NUMBER OF COMPARATORS | AMOUNT OF IMPROVEMENT |
|---|---|---|---|---|---|
| 1.5-b ADC | EXAMPLE OF FIG. 3A | ±$V_R$/4 | ±$V_R$/4 | 2 | REFERENCE (=1) |
| | 3RD EMBODIMENT (FIG. 16A) | ①+$V_R$/4 | ②−$V_R$/4 | 1 (HALVED) | ×(1/2) (HALVED) |
| 2.5-b ADC | EXAMPLE OF FIG. 4A | ±$V_R$·(k/8) (k=1, 3, 5) | ±$V_R$·(k/8) (k=1, 3, 5) | 6 | REFERENCE (=1) |
| | WHEN 3RD EMBODIMENT IS APPLIED | ①0 (±DECISION) | WHEN RESULT OF DECISION IS "+" +$V_R$·(k/8) (k=1, 3, 5) WHEN RESULT OF DECISION IS "−" −$V_R$·(k/8) (k=1, 3, 5) | 3 | ×(1/2) (HALVED) |

FIG.20D

| VIN(V$_{CMP}$) | DO | DA=DA1 | VDA1 | VO=2*VIN−DA*VR |
|---|---|---|---|---|
| +VR≧VIN≧+(1/4)*VR | +01 | +1 | +VR | 2*VIN−VR |
| +(1/4)*VR>VIN≧−(1/4)*VR | 00 | 0 | 0 | 2*VIN |
| −(1/4)*VR>VIN≧−VR | −01 | −1 | −VR | 2*VIN+VR |

FIG.21D

| VIN($V_{CMP}$) | DO | DA=DA1 | VDA1 | VO=2*VIN−DA*VR |
|---|---|---|---|---|
| +VR≧VIN≧+(1/4)*VR | +01 | +1 | +VR | 2*VIN−VR |
| +(1/4)*VR>VIN≧−(1/4)*VR | 00 | 0 | 0 | 2*VIN |
| −(1/4)*VR>VIN≧−VR | −01 | −1 | −VR | 2*VIN+VR |

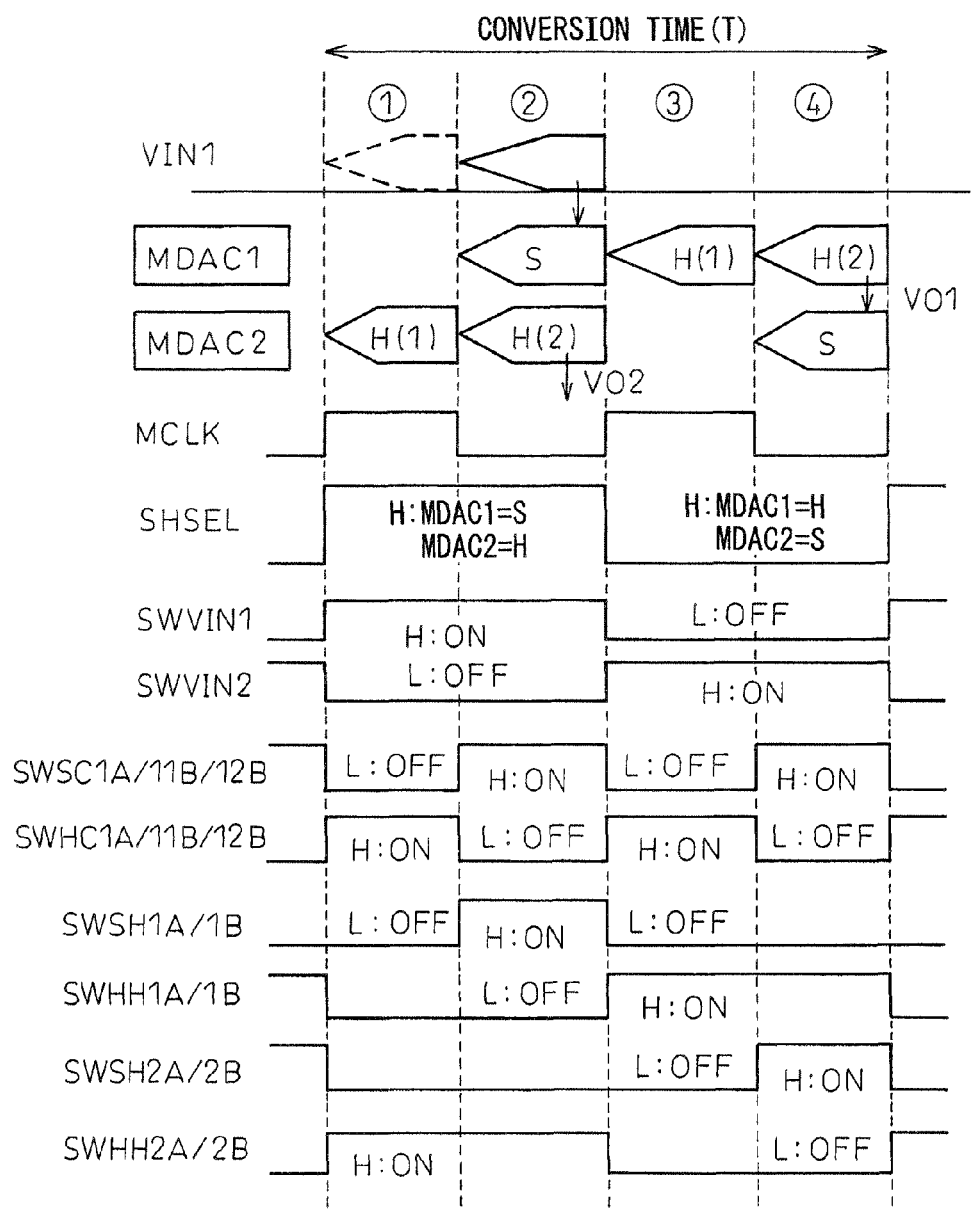

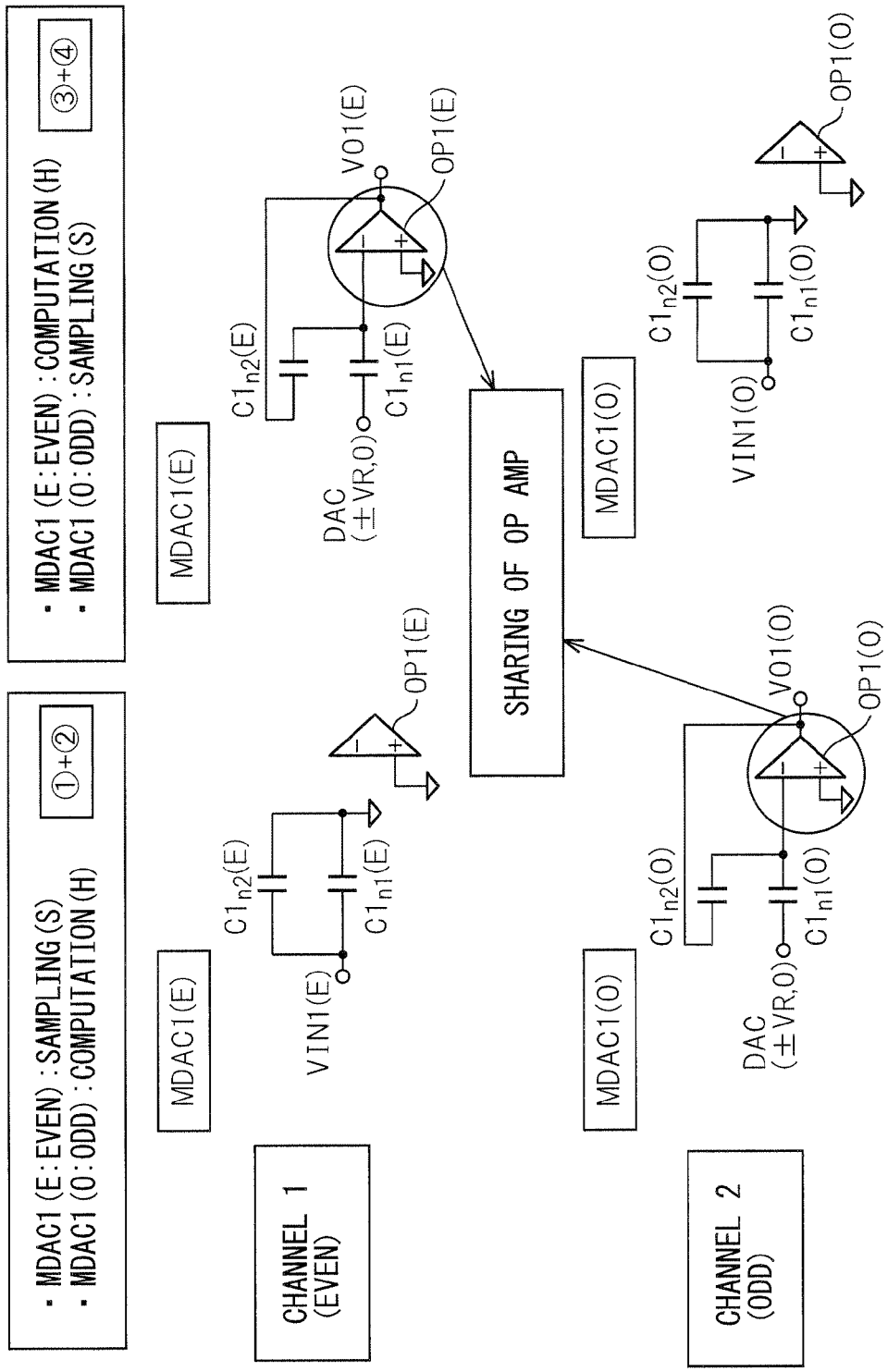

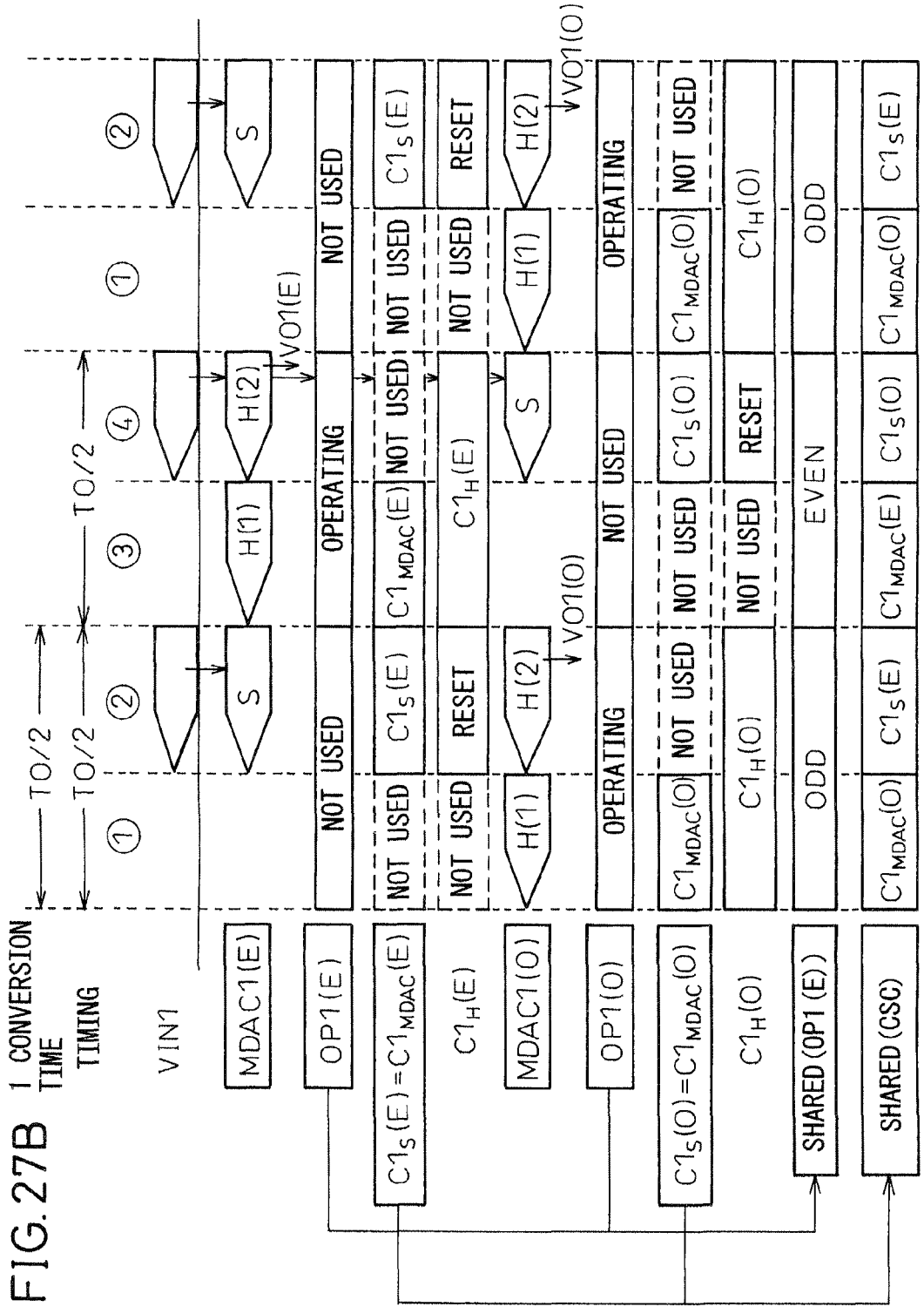

FIG. 29

| CIRCUIT TYPE | | SIGNAL AMPLIFICATION FACTOR (m VALUE) | | AMOUNT OF IMPROVEMENT ACHIEVED BY REDUCTION IN CAPACITANCE (PERCENTAGE) | TOTAL CAPACITANCE 2= COEFFICIENT 2× TOTAL CAPACITANCE 1- COMMON C (MIN.) | COEFFICIENT 2 (FOR TWO MDACs) | SCALING APPLIED/ NOT APPLIED | $(C1_S + C1_H)/C_0$ | $C1_S/C_0$ $=C1_{MDAC}/C_0$ | $C1_H/C_0$ |
|---|---|---|---|---|---|---|---|---|---|---|
| APPLIED TO PRECEDING/ SUBSEQUENT MDACs (WITH SCALING) | MDAC OF FIG. 22A | m=2 | | REFERENCE | 9/4 | ×3/2 | APPLIED (1/2) | 3/2 | 1 | 1/2 |
| | MDAC OF FIG. 26A | m=2 | | -1/2 (▲22%) | 7/4 =9/4-1/2 | ×3/2 | APPLIED (1/2) | 3/2 | 1 | 1/2 |
| | MDAC OF FIG. 22A | m=4 | | REFERENCE | 25/16 | ×5/4 | APPLIED (1/4) | 5/4 | 1 | 1/4 |
| | MDAC OF FIG. 26A | m=4 | | -1/4 (▲16%) | 21/16 =25/16-1/4 | ×5/4 | APPLIED (1/4) | 5/4 | 1 | 1/4 |
| APPLIED TO PRECEDING/ SUBSEQUENT MDACs (WITHOUT SCALING) | MDAC OF FIG. 22A | m=2 | | REFERENCE | 3 | ×2 | NOT APPLIED | 3/2 | 1 | 1/2 |
| | MDAC OF FIG. 26A | m=2 | | -1 (▲33%) | 2=3-1 | ×2 | NOT APPLIED | 3/2 | 1 | 1/2 |
| | MDAC OF FIG. 22A | m=4 | | REFERENCE | 5/2 | ×2 | NOT APPLIED | 5/4 | 1 | 1/4 |
| | MDAC OF FIG. 26A | m=4 | | -1 (▲40%) | 3/2=5/2-1 | ×2 | NOT APPLIED | 5/4 | 1 | 1/4 |
| DOUBLE- SAMPLING | MDAC OF FIG. 26A | m=2 | | REFERENCE | 3 | ×2 | — | 3/2 | 1 | 1/2 |
| | MDAC OF 5TH EMBODIMENT | m=2 | | -1 (▲33%) | 2=3-1 | ×2 | — | 3/2 | 1 | 1/2 |
| | MDAC OF FIG. 26A | m=4 | | REFERENCE | 5/2 | ×2 | — | 5/4 | 1 | 1/4 |
| | MDAC OF 5TH EMBODIMENT | m=4 | | -1 (▲40%) | 3/2=5/2-1 | ×2 | — | 5/4 | 1 | 1/4 |

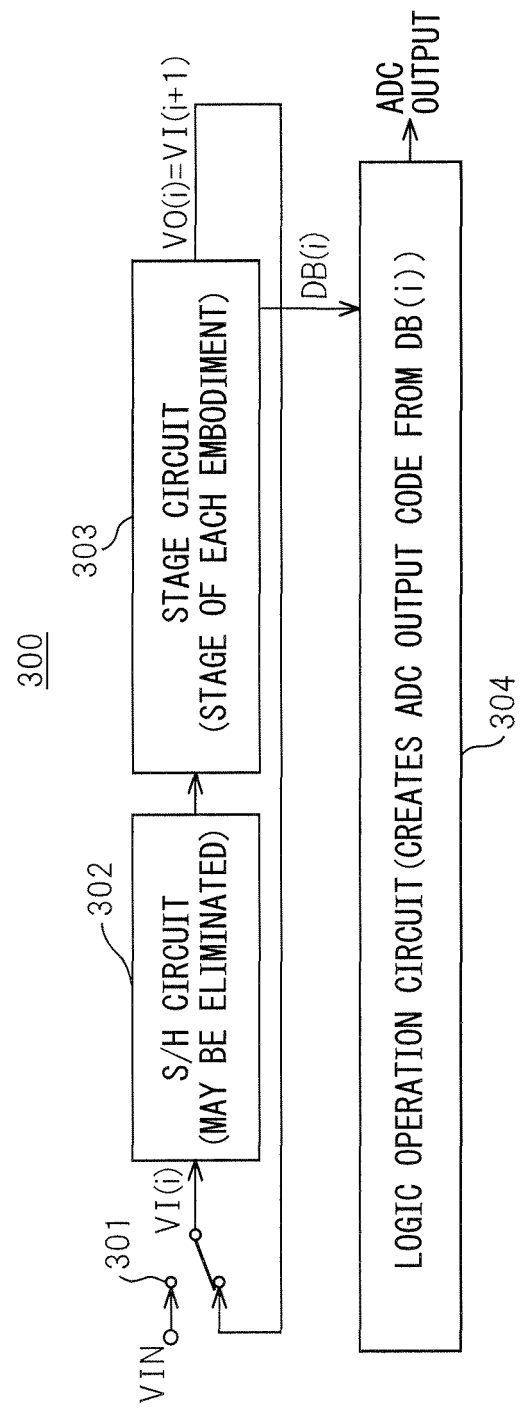

SWITCHED CAPACITOR CIRCUIT AND STAGE CIRCUIT FOR AD CONVERTER

CROSS-REFERENCE TO RELATED APPLICATION

This application is a continuation application and is based upon PCT/JP2009/065528, filed on Sep. 4, 2009, the entire contents of which are incorporated herein by reference.

FIELD

The embodiments discussed herein are related to a switched capacitor circuit and a stage circuit for AD converter.

BACKGROUND

Switched capacitor circuits are widely used in high-resolution, low-power AD (Analog-to-Digital) converters, DA (Digital-to-Analog) converters, filters, etc.

More specifically, a switched capacitor circuit includes a capacitor, a switch, and an amplifier, and this type of circuit is applied, for example, to an MDAC (Multiplying DAC) or the like used as a basic building block in a pipelined AD conversion circuit or a cyclic AD conversion circuit.

In this patent specification, an AD conversion circuit and a switched capacitor circuit (MDAC) to be used therein will be described as examples, but as stated above, the switched capacitor circuit is also applicable to a DA converter, a filter, etc.

Various forms of pipelined AD conversion circuits employing switched capacitor circuits have been proposed.

As described above, the switched capacitor circuit is applied, for example, to an MDAC or the like in a pipelined AD conversion circuit.

With the rapid growth in digital consumer applications (e.g., DTV and DSC) and wireless communications, it has become increasingly important to provide an AD conversion circuit capable of high-resolution with high-speed operation.

In the field of portable apparatus, for example, there has also developed a need to further reduce power consumption while also reducing the die size of the circuit.

Non-Patent Document 1: Shoji Kawahito, "Low-Power Design of Pipeline A/D converters," IEEE Custom Integrated Circuits Conference, pp. 505-512, September 2006

Non-Patent Document 2: Kunihiko Gotoh et al., "3 STATES LOGIC CONTROLLED CMOS CYCLIC A/D CONVERTER," IEEE Custom Integrated Circuits Conference, pp. 366-369, May 1986

Non-Patent Document 3: Chin-Chen Lee, "A NEW SWITCHED-CAPACITOR REALIZATION FOR CYCLIC ANALOG-TO-DIGITAL CONVERTER," IEEE International Symposium on Circuit and Systems, pp. 1261-1265, May 1983

SUMMARY

According to one embodiment, there is provided a switched capacitor circuit is configured to be operable in two or more kinds of operation modes including a first operation mode and a second operation mode.

The switched capacitor circuit includes an amplifier and two or more internal capacitors with switches for controlling connection/disconnection of the capacitor.

In the first operation mode that precedes the second operation mode, the switched capacitor circuit generates the first analog output voltage by using the first internal capacitor connected between an input terminal and output terminal of the amplifier by using its switches, the other internal capacitances connected between an input terminal of the amplifier and each analog input voltage supply by using its switches.

In the second operation mode that follows the first operation mode, the switched capacitor circuit generates the second analog output voltage with larger feedback factor of the amplifier than it in the first operation mode, by removing some of the internal capacitors, except the first internal capacitor, from the first operation mode.

The object and advantages of the embodiments will be realized and attained by the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIG. 2A is a simplified circuit schematic for explaining one example of a STAGE circuit and its operation;

FIG. 2B is a timing chart (part 1) for explaining the STAGE circuit in FIG. 2A;

FIG. 3D is an operation table for the 1.5b-ADC and the 1.5bMDAC of the STAGE circuit in FIG. 3A;

FIG. 6 is a comparison table of the performance for some kind of MDAC circuits with considering some kind of load conditions for the output of each MDAC;

FIG. 11 is a comparison table of the performance for the 1.5bMDAC of the first embodiment for comparison with the MDAC depicted in FIG. 3A;

FIG. 12 is a comparison table of the performance for the 2.5bMDAC of the first embodiment for comparison with the MDAC depicted in FIG. 4A;

FIG. 15A is a diagram (part 1) for explaining a STAGE circuit according to a third embodiment and its operation;

FIG. 17 is a diagram depicting the number of comparators of the sub-ADC needed in the stage of the third embodiment for comparison with the number of comparators needed in each of the MDACs depicted in FIG. 3A and FIG. 4A;

FIG. 20D is a diagram (part 3) for explaining the operation of the MDAC of FIG. 20A;

FIG. 21D is a diagram (part 3) for explaining the operation of the MDAC of FIG. 21A;

FIG. 24B is a diagram for explaining the operation of the MDAC of FIG. 24A;

FIG. 25 is a diagram for explaining the basic operation of the MDAC of the first configuration example as applied in a parallel MDAC system;

FIG. 27B is a diagram (part 2) for explaining the MDAC of the fifth embodiment and its operation;

FIG. 29 is a diagram illustrating the performance of the MDACs of the fourth and fifth embodiments for comparison with the performance of the MDACs depicted in FIGS. 22A and 26A;

FIG. 31 is a block diagram schematically illustrating one example of a cyclic AD conversion circuit to which the stage circuit that has the MDAC of each embodiment or the sub-ADC of each embodiment is applied.

DESCRIPTION OF EMBODIMENTS

Before describing the embodiments in detail, switched capacitor circuits and AD conversion circuits and their associated problems will be described below.

Figure 1A:
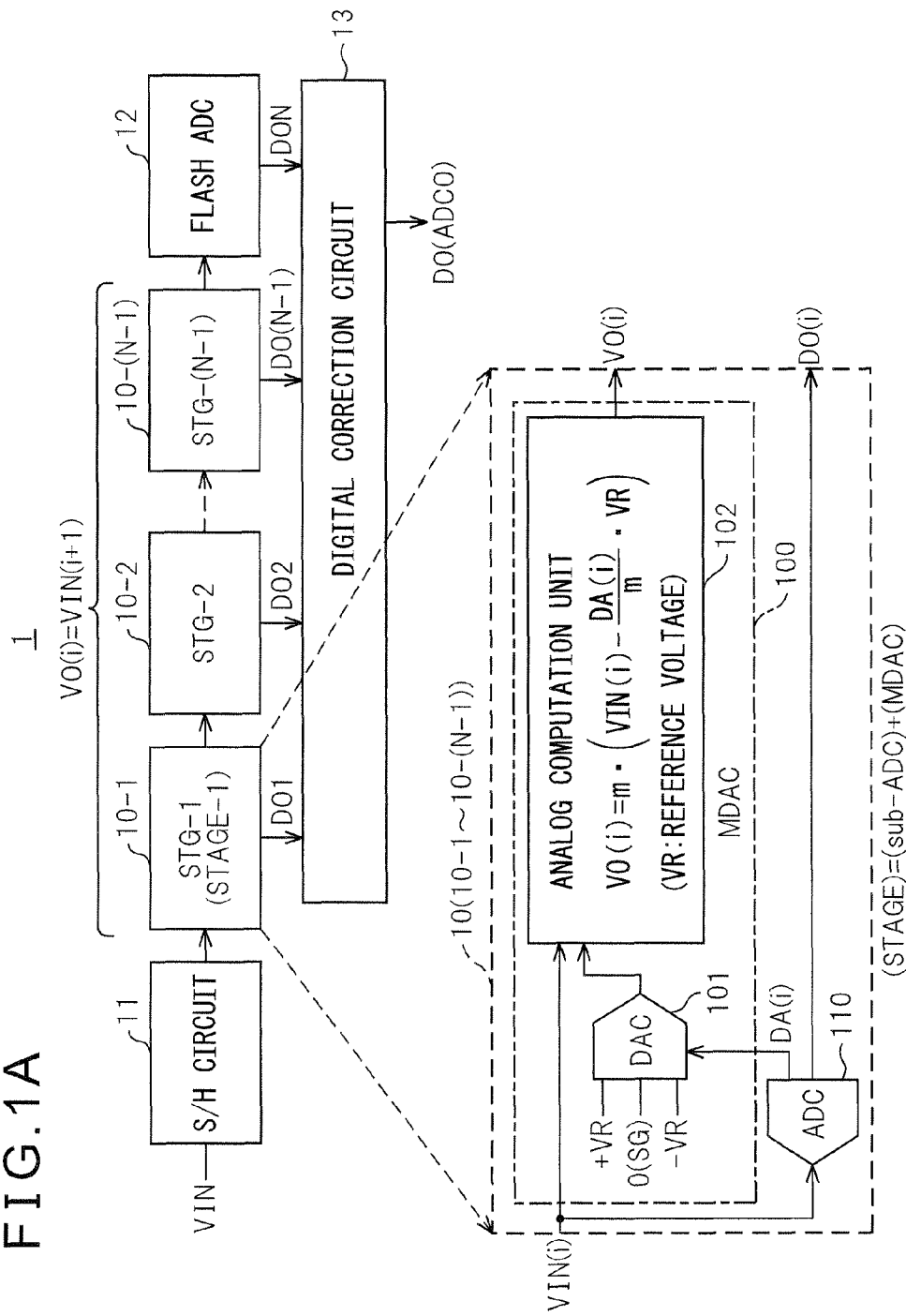
FIG. 1A is a block diagram illustrating one example of a pipelined AD converter and its pipeline stage circuit.
Figure 1B:
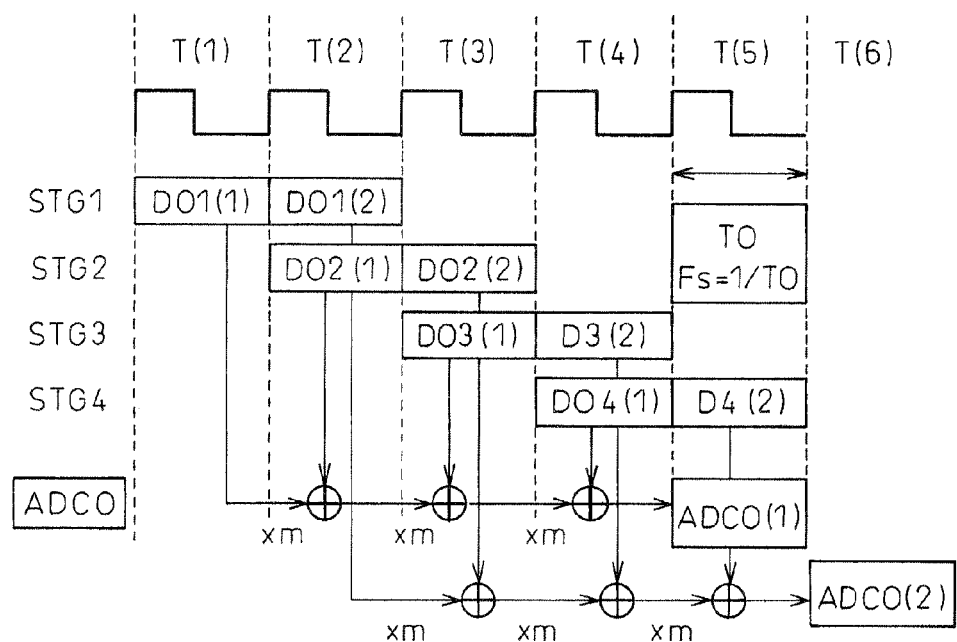
FIG. 1B is a timing chart for explaining the operation of the AD conversion circuit in FIG. 1A.
Figure 1C:
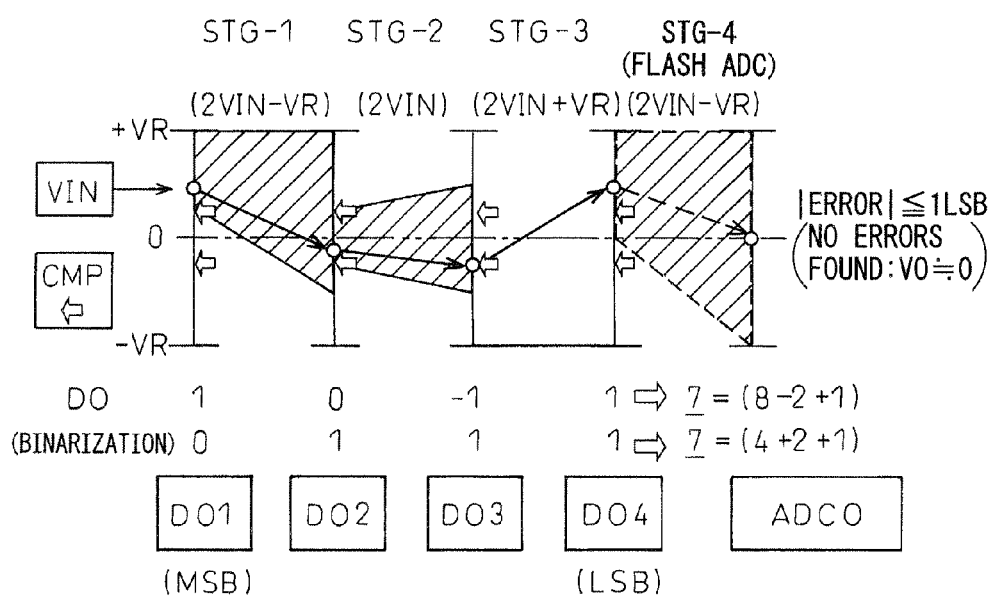
FIG. 1C is a proceeding for explaining the operation of the AD conversion circuit in FIG. 1A.

FIG. 1A is a block diagram illustrating one example of a pipelined AD converter and its pipeline stage circuit, FIG. 1B is a timing chart for explaining the operation of the AD conversion circuit in FIG. 1A, and FIG. 1C is a proceeding for explaining the operation of the AD conversion circuit in FIG. 1A. The AD conversion circuit hereinafter described with reference to FIG. 1A, FIG. 1B, and FIG. 1C is a pipelined AD conversion circuit.

In the pipelined AD conversion circuit, the circuit that becomes important in achieving higher speed, lower power consumption, and smaller die size is the MDAC (Multiplying DAC: switched capacitor circuit) that is used as the basic building block of the cell array.

As illustrated in FIG. 1A, the pipelined AD conversion circuit 1 includes a sample-and-hold (S/H) circuit 11, a number, N−1, of stage circuits (STG-1 to STG-(N−1)) 10-1 to 10-(N−1), a flash AD converter (flash ADC) 12 at the last stage, and a digital correction circuit (code conversion circuit) 13.

The sample-and-hold circuit 11 samples an input voltage VIN and holds it, and the flash ADC 12 outputs a signal DON, i.e., the AD-converted result, without further processing to the digital correction circuit 13.

The digital correction circuit 13 receives the output signals DO1 to DO(N−1) of the respective stage circuits 10-1 to 10-(N−1) as well as the output signal DON of the flash ADC 12, and outputs a digital signal DO as the result of the AD conversion of the input voltage VIN.

Each stage circuit 10 includes a MDAC 100 and a sub-AD converter (ADC) 110, and the MDAC 100 includes a sub-DA converter (DAC) 101 and an analog computation unit 102. The sub-DAC 101 outputs a voltage +VR, 0(SG), or −VR to the analog computation unit 102 in accordance with a signal DA(i) supplied from the sub-ADC 110.

As will be described later, the MDAC 100 is constructed from a switched capacitor circuit which includes two or more capacitors (internal capacitors), an amplifier, and a switch (internal switch), and performs an analog computation to add or subtract a constant multiple of the reference voltage VR by using the amplified result of the input signal VIN(i) and the AD-converted result DA(i) of the input signal.

The output (VO(i)) of each MDAC (one of the stage circuits 10-1 to 10-(N−1)) is supplied as an input signal to the subsequent stage circuit (one of the stage circuits 10-2 to 10-(N−1) or the flash ADC 12).

For example, consider the case where the analog input signal VIN is converted into a 4-bit digital signal (N=4) for output, as illustrated in FIG. 1B; first, for VIN(1), the signal DO1(1) representing the most significant bit (MSB) is output in period T(1), which is followed by the signal DO2(1) in period T(2).

Next, the signal DO3(1) is output in period T(3), and the signal DO4(1) representing the least significant bit (LSB) is output in period T(4). Then, in period T(5), the digital output ADCO(1) binarized by the digital correction circuit 13 is produced.

Similarly, for VIN(2), the signal DO1(2) representing the most significant bit is output in period T(2), which is followed by the signal DO2(2) in period T(3).

Next, the signal DO3(2) is output in period T(4), and the signal DO4(2) representing the least significant bit is output in period T(5). Then, in period T(6), the digital output ADCO (2) binarized by the digital correction circuit 13 is produced.

In the above process, each stage carries out the computation VO(i)=m*[VIN(i)−{DA(i)/m}*VR]. For example, when the signals DO1 to DO4 are "1, 0, −1, 1", respectively, as illustrated in FIG. 1C, the digital correction circuit 13 outputs the binarized digital output "0111". Here, m represents the signal amplification factor.

By thus performing a plurality of processes concurrently through the cascaded MDACs 100 on a per clock basis, the pipelined AD conversion circuit 1 achieves faster conversion speed, though the delay (latency) from input to output increases.

Furthermore, since higher resolution may be achieved by appropriately determining the number of stages according to the resolution needed, the pipelined AD conversion circuit may be designed flexibly according to its performance requirements.

Since the pipelined AD conversion circuit covers a wide range of resolution and conversion speed, as described above, this type of conversion circuit is widely used in various electronic apparatus such as digital AV equipment and radio communication circuits.

Figure 2C:
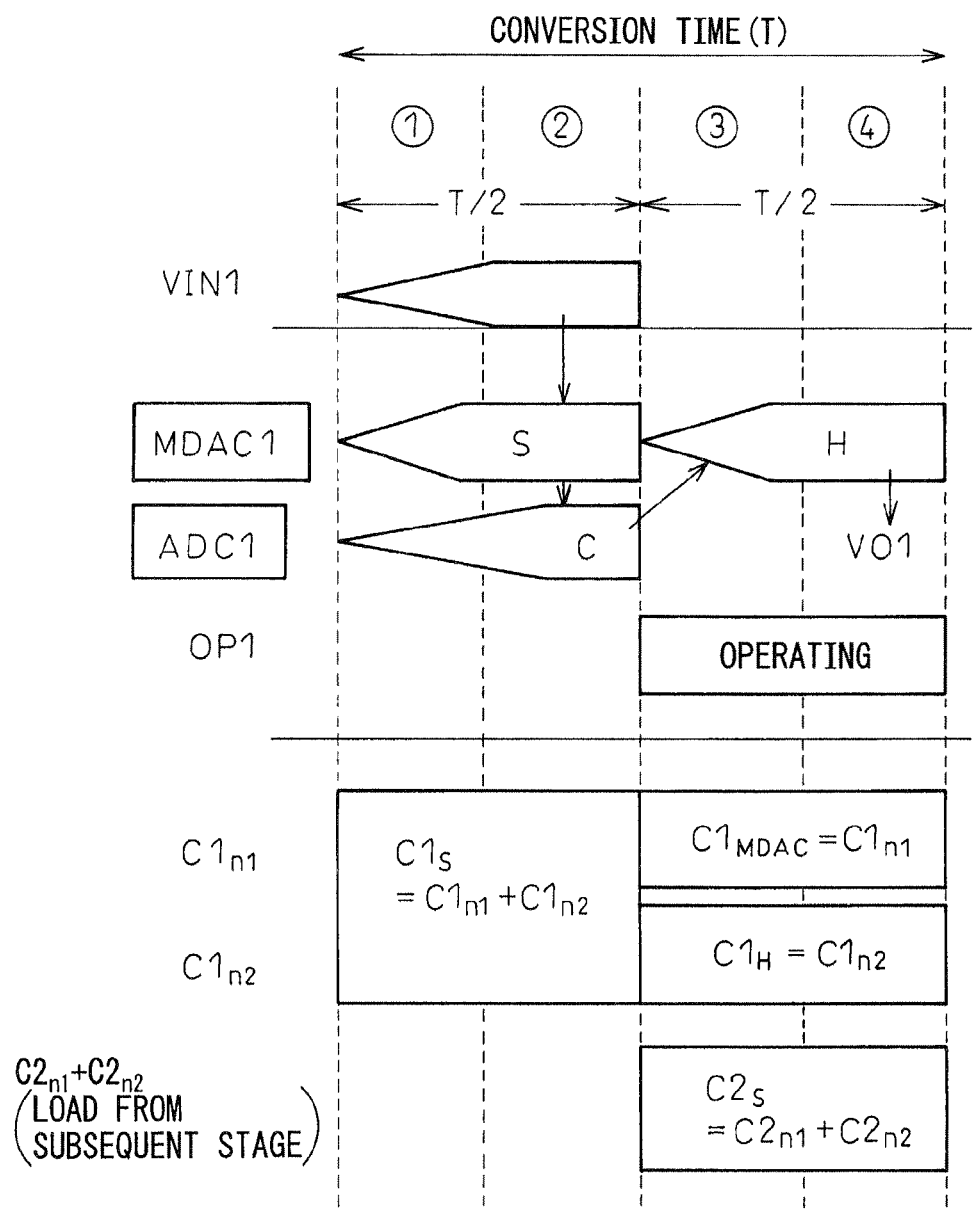
FIG. 2C is a timing chart (part 2) for explaining the STAGE circuit in FIG. 2A.

FIG. 2A is a simplified circuit schematic for explaining one example of a STAGE circuit and its operation, FIG. 2B is a timing chart (part 1) for explaining the STAGE circuit in FIG. 2A, and FIG. 2C is a timing chart (part 2) for explaining the STAGE circuit in FIG. 2A.

FIG. 2B illustrates the processing performed by MDAC1 and MDAC2, while FIG. 2C illustrates only the processing performed by MDAC1. Further, in FIG. 2A, reference characters OP1 and OP2 designate operational amplifiers (op amps).

In FIG. 2A, FIG. 2B, and FIG. 2C, the conversion time (T) is divided into four periods (1) to (4) to correspond with the description of each embodiment to be given later, but actually, the operation may be described by dividing it into two periods made up of the period (1)+(2) and the period (3)+(4).

That is, the time during which a series of operations is repeated (the conversion time T) is depicted as being divided into the four periods (1) to (4). Accordingly, the length of each period is defined by (1)+(2)=(3)+(4)=T/2.

In this patent specification and the accompanying drawings, the description is given by dealing with the case where the signal to be processed is a single-ended signal, but the configuration is basically the same for the case of a differential signal.

Further, while two MDACs, MDAC1 and MDAC2, are depicted in FIG. 2A, the basic operation is described for the first-stage MDAC1, and the second-stage MDAC2 is depicted for the purpose of facilitating an understanding of the load condition of the first-stage MDAC1.

As illustrated in FIG. 2A, the MDAC as a circuit for processing an analog signal is constructed using a switched capacitor (SC) circuit that includes a capacitor (C), a switch (SW), and an operational amplifier (OP: OP AMP).

To describe the basic operation of the MDAC, first in the period (1)+(2), the MDAC1 samples the analog input signal (VIN) by using the sampling capacitor $C1_s$ ($=C1_{n1}+C1_{n2}$). Further, in the same period (1)+(2), the digital output result DO (DO1) and the add/subtract coefficient DA (DA1) of the reference voltage VR are determined by using the sub-AD converter ADC1 (110) which includes a comparator.

Next, in the period (3)+(4), the analog computation result VO1 is output by applying a DAC output voltage using the op amp OP1, the capacitors $C1_{n1}$ and $C1_{n2}$, and the comparison result from the ADC1.

The output result is supplied as the input signal VIN2 to the second-stage MDAC (MDAC2) and sampled on the sampling capacitor $C2_s$ ($=C2_{n1}+C2_{n2}$); the output result is also supplied as an input signal to the second-stage sub-AD converter ADC2 (110).

In FIG. 2C, during the period (3)+(4) when the MDAC1 performs computation, the capacitor $C1_{n1}$ acts as a computation capacitor ($C1_{MDAC}$) and the capacitor $C1_{n2}$ as a hold capacitor ($C1_H$), and the sampling capacitor $C2_s$ ($=C2_{n1}+C2_{n2}$) in the second-stage MDAC2 acts as the load.

More specifically, in the period (3)+(4), the hold capacitor $C1_H$ ($C1_{n2}$) is connected between the output terminal and negative input terminal of the op amp OP1, and the computation capacitor $C1_{MDAC}$ ($C1_{n1}$) is connected between the output terminal of the sub-DA converter (101) and the negative input terminal of the op amp OP1. Then, the sampling capacitor $C2_s$ ($=C2_{n1}+C2_{n2}$) in the second-stage MDAC2 is coupled to the output terminal of the op amp OP1.

Figure 3A:
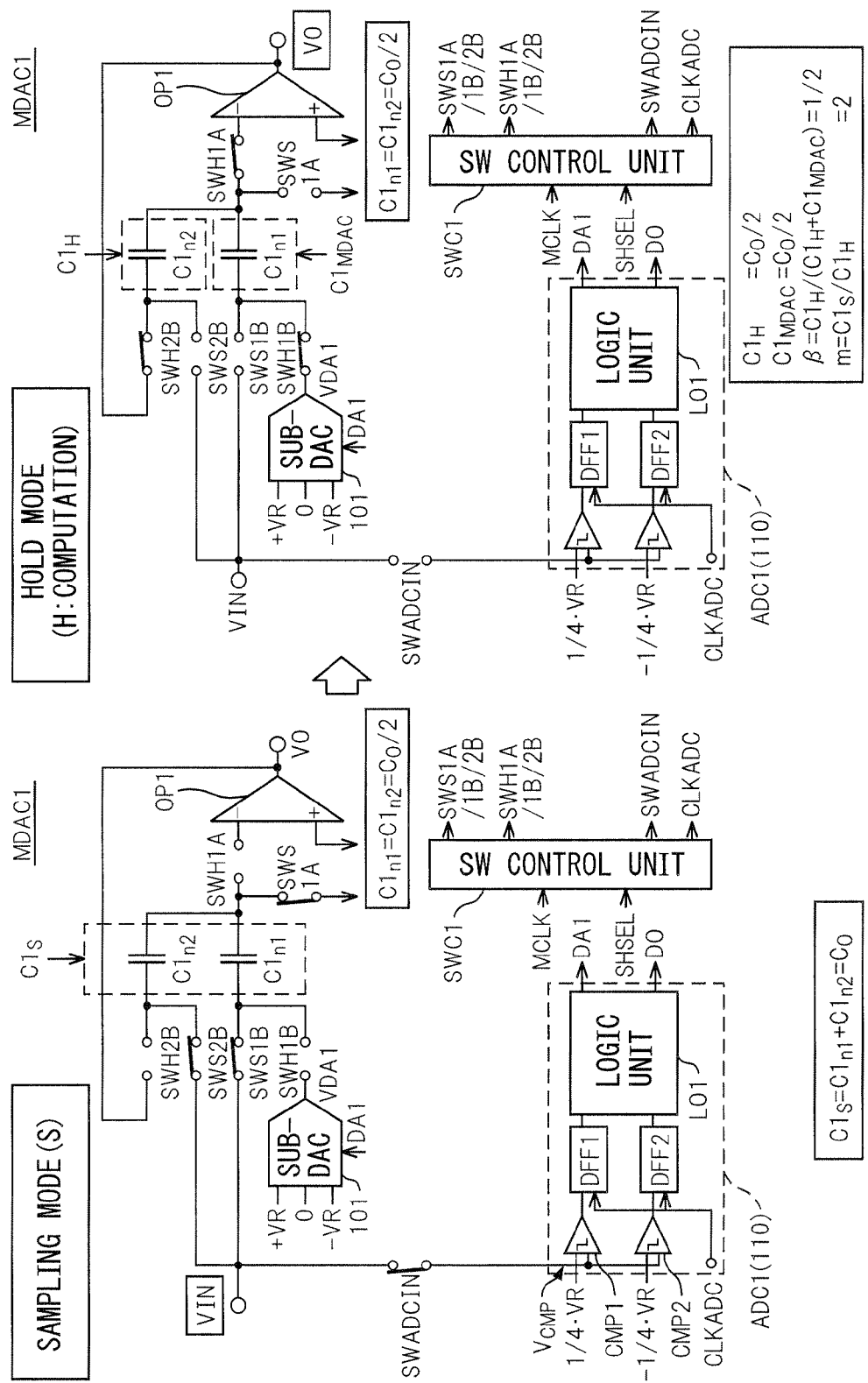
FIG. 3A is a simplified circuit schematic of a 1.5-b STAGE for sampling mode and in hold mode operation, respectively.
Figure 3B:
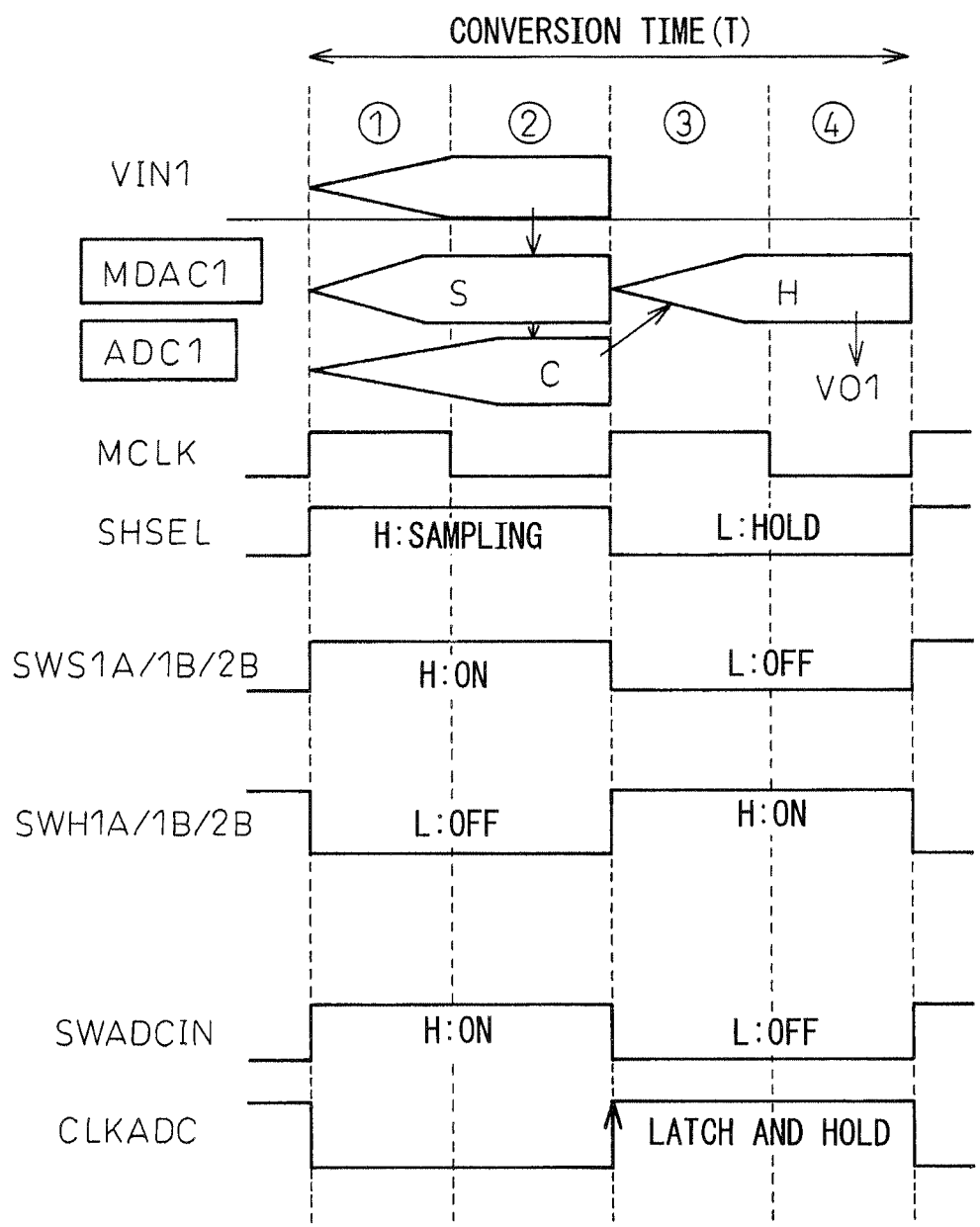
FIG. 3B is a timing chart for explaining the 1.5-b STAGE circuit in FIG. 3A.
Figure 3C:
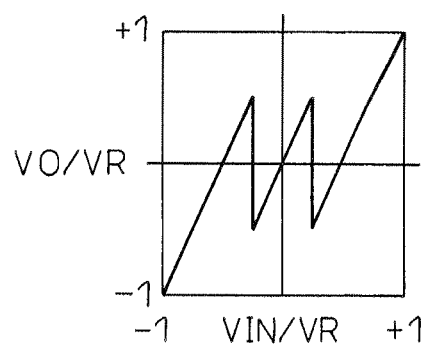
FIG. 3C is a transfer function for the 1.5bMDAC of the STAGE circuit in FIG. 3A.

FIG. 3A is a simplified circuit schematic of a 1.5-b STAGE for sampling mode and in hold mode operation, respectively, and FIG. 3B is a timing chart for explaining the 1.5-b STAGE circuit in FIG. 3A. Further, FIG. 3C is a transfer function for the 1.5bMDAC of the STAGE circuit in FIG. 3A, and FIG. 3D is an operation table for the 1.5b-ADC and the 1.5bMDAC of the STAGE circuit in FIG. 3A.

In FIG. 3A, reference character SWC1 designates a switch control unit which receives signals MCLK and SHSEL and outputs switch control signals; further, 101 is a sub-DAC, CMP1 and CMP2 are comparators, DFF1 and DFF2 are flip-flops, and LO1 is a logic unit.

First, as illustrated in the left half of FIG. 3A and in the periods (1) and (2) ((1)+(2)) of FIG. 3B, in the sampling (S) mode of the MDAC1 the switch control unit SWC1 sets the control signals for the switches SWS1A/1B/2A/2B and SWADCIN to a high level "H", causing these switches to turn on.

When the switch SWADCIN is turned on, the comparators CMP1 and CMP2 compare the input voltage V, applied as the compare voltage $V_{CMP}$, with the reference voltages (¼)*VR and −(¼)*VR, respectively, and supply the comparison results to the input terminals of the flip-flops DFF1 and DFF2, respectively.

Further, in the sampling mode of the MDAC1 in the period (1)+(2), the switch control unit SWC1 sets the control signals for the switches SWH1A/1B/2B and CLKADC to a low level "L". In this means, the switches SWH1A/1B/2B to turn off, and the flip-flops DFF1 and DFF2 are disabled.

As earlier described, in the sampling capacitor $C1_s$ on which the MDAC1 samples the input signal VIN, the capacitors $C1_{n1}$ and $C1_{n2}$ are connected in parallel with each other with the switches SWS1A, SWS1B, and SWS2B turning on; as a result, the sampling capacitor $C1_s$ is $C1_s = C1_{n1} + C1_{n2}$. Here, if $C_0 = C1_s$ and $C1_{n1} = C1_{n2}$, then $C1_{n1} = C1_{n2} = C_0/2$.

Next, as illustrated in the right half of FIG. 3A and in the periods (3) and (4) ((3)+(4)) of FIG. 3B, in the hold (H: computation) mode of the MDAC1 the switch control unit SWC1 sets the control signals for the switches SWS1A/1B/2A/2B and SWADCIN to "L", causing these switches to turn off.

Further, in the hold mode in the period (3)+(4), the switch control unit SWC1 sets the control signals for the switches SWH1A/1B/2B and CLKADC to "H". This causes the switches SWH1A/1B/2B to turn on, and the flip-flops DFF1 and DFF2 are enabled to latch and hold the input data.

Here, the output signals from the flip-flops DFF1 and DFF2 are supplied to the logic unit LO1, and the logic unit LO1 outputs the digital output DO and the add/subtract coefficient DA1. The add/subtract coefficient DA1 is supplied to the sub-DAC 101.

Further, the hold capacitor $C1_H$ and the computation capacitor $C1_{MDAC}$ are $C1_H = C_0/2$ and $C1_{MDAC} = C_0/2$, respectively, the feedback ratio β is $β = C1_H/(C1_H + C1_{MDAC}) = ½$, and the signal amplification factor, m, is $m = C1_s/C1_H = 2$.

That is, in the period (3)+(4), the hold capacitor $C1_H$ ($C1_{n2}$) is connected between the output terminal and negative input terminal of the op amp OP1, and the computation capacitor $C1_{MDAC}$ ($C1_{n1}$) is connected between the output terminal of the sub-DA converter (101) and the negative input terminal of the op amp OP1.

When the signal amplification is m=2, the relation depicted in FIG. 3C holds between VIN/VR and VO/VR. Further, the input voltage VIN (the compare voltage $V_{CMP}$), the digital output DO, the add/subtract coefficient DA1, the output voltage VDA1 of the sub-DAC 101, and the output voltage VO of the op amp OP1 are as depicted in FIG. 3D.

Here, since the output voltage VO is VO=m*{VIN−(DA/m)*VR}, and m=2, it follows that VO=2*VIN−DA*VR.

That is, when the input voltage VIN is in the range defined by +VR≥VIN≥+(¼)*VR, DO is +01, DA is +1, VDA1 is +VR, and VO is 2*VIN−VR; on the other hand, when the input voltage VIN is in the range defined by +(¼)*VR≥VIN≥−(¼)*VR, DO is 00, DA is 0, VDA1 is 0, and VO is 2*VIN.

Further, when the input voltage VIN is in the range defined by −(¼)*VR≥VIN≥−VR, DO is −01, DA is −1, VDA1 is −VR, and VO is 2*VIN+VR.

Figure 4A:
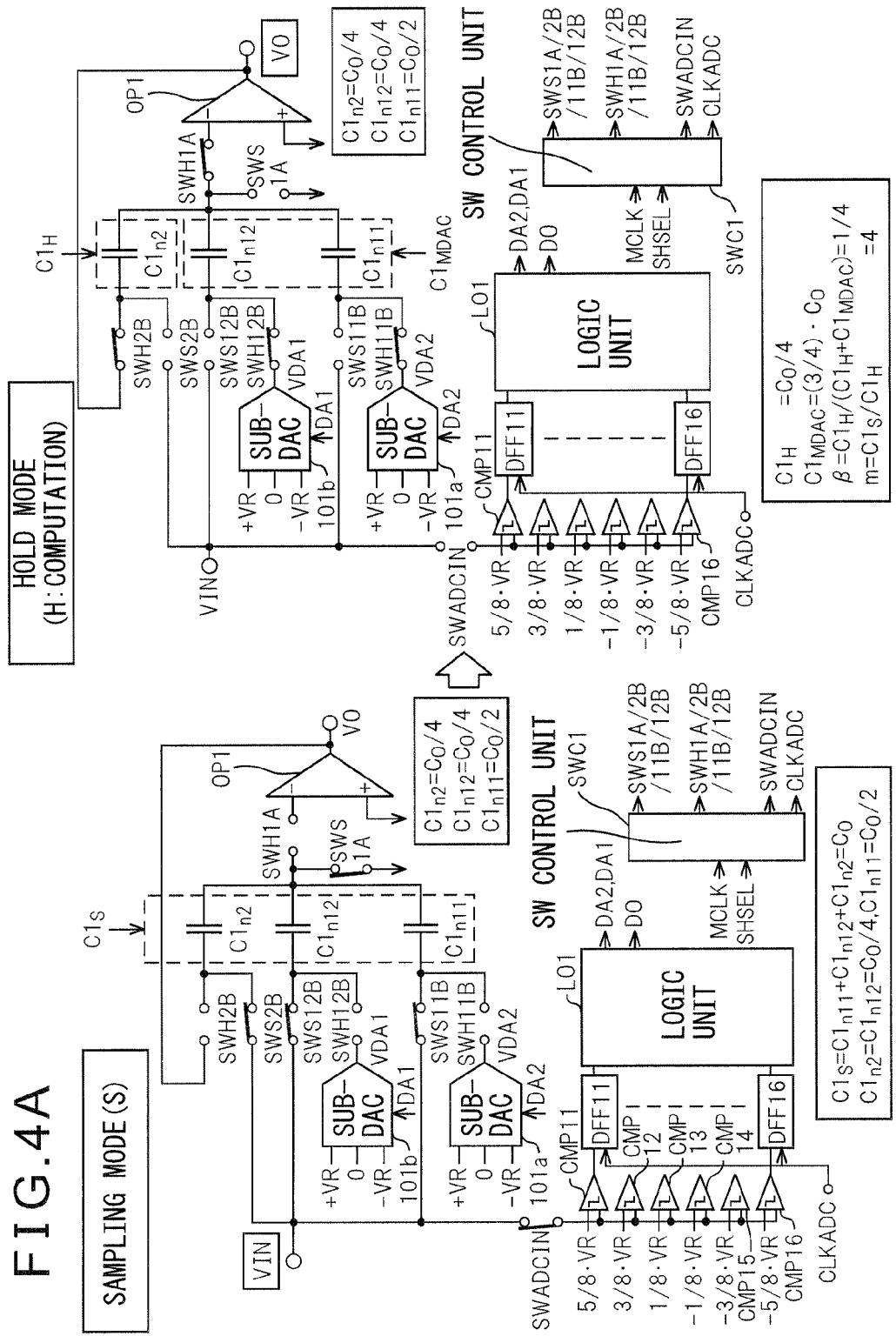
FIG. 4A is a simplified circuit schematic of a 2.5-b STAGE for sampling mode and in hold mode operation, respectively.
Figure 4:
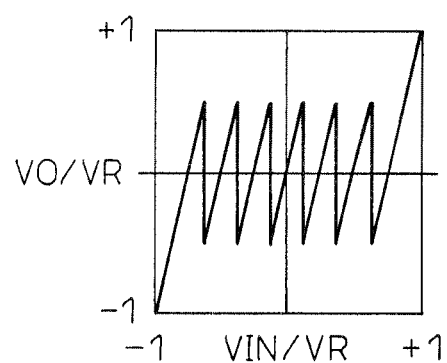
FIG. 4B is a transfer function for the 2.5bMDAC of the STAGE circuit in FIG. 4A.
FIG. 4C is an operation table for the 2.5b-ADC and the 2.5bMDAC of the STAGE circuit in FIG. 4A.

FIG. 4A is a simplified circuit schematic of a 2.5-b STAGE for sampling mode and in hold mode operation, respectively, FIG. 4B is a transfer function for the 2.5bMDAC of the STAGE circuit in FIG. 4A, and FIG. 4C is an operation table for the 2.5b-ADC and the 2.5bMDAC of the STAGE circuit in FIG. 4A.

As is apparent from a comparison between FIG. 4A and the previously described FIG. 3A, the capacitor $C1_{n1}$ in the 2.5bMDAC is divided into two capacitors $C1_{n11}$ and $C1_{n12}$ each of which is provided with a sub-DAC 101a or 101b and switches SWS11B and SWH11B or SWS12B and SWH12B.

Further, the two comparators CMP1 and CMP2 in FIG. 3A are replaced by six comparators CMP11 to CMP16, and six split voltages ⅝*VR, ⅜*VR, ⅛*VR, −⅛*VR, −⅜*VR, and −⅝*VR are applied to the respective comparators and compared with the input voltage VIN ($V_{CMP}$).

The output signals from the respective comparators CMP11 to CMP16 are supplied to the logic unit LO1 via the respective flip-flops DFF11 to DFF16, and the logic unit LO1 outputs the digital output DO along with two add/subtract coefficients DA1 and DA2 that are supplied to the sub-DACs 101a and 101b.

Then, as illustrated in the left half of FIG. 4A, in the sampling mode of the MDAC1 the switch control unit SWC1 sets the control signals for the switches SWS1A/2B/11B/12B and SWADCIN to "H", causing these switches to turn on.

Further, in the sampling mode of the MDAC1, the switch control unit SWC1 sets the control signals for the switches SWH1A/2B/11B/12B and CLKADC to "L", causing the switches SWH1A/2B/11B/12B to turn off and disabling the flip-flops DFF1 to DFF16.

At this time, since the capacitors $C1_{n11}$, $C1_{n12}$, and $C1_{n2}$ are connected in parallel with each other with the switches SWS11B, SWS12B, and SWS2B turning on, the sampling capacitor $C1_s$ is $C1_s = C1_{n11} + C1_{n12} + C1_{n2}$. Here, if $C_0 = C1_s$, $C1_{n2} = C1_s/4$ and $C1_{n11} = 2*C1_{n2}$, then $C1_{n2} = C_0/4$, $C1_{n12} = C_0/4$, $C1_{n11} = C_0/2$.

Next, as illustrated in the right half of FIG. 4A, in the hold mode of the MDAC1 the switch control unit SWC1 sets the control signals for the switches SWS1A/2B/11B/12B and SWADCIN to "L", causing these switches to turn off.

Further, in the hold mode of the MDAC1, the switch control unit SWC1 sets the control signals for the switches SWH1A/2B/11B/12B and CLKADC to "H". This causes the switches SWH1A/2B/11B/12B to turn on, and the flip-flops DFF1 to DFF6 are enabled to latch and hold the input data.

That is, the flip-flops DFF1 to DFF6 latch and hold the output signals of the corresponding comparators CMP11 to CMP16. Here, the output signals from the flip-flops DFF1 to DFF6 are supplied to the logic unit LO1, and the logic unit LO1 outputs the digital output DO and the add/subtract coefficients DA1 and DA2. The add/subtract coefficients DA1 and DA2 are supplied to the sub-DACs 101b and 101a, respectively.

Further, the hold capacitor $C1_H$ and the computation capacitor $C1_{MDAC}$ are $C1_H = C_0/4$ and $C1_{MDAC} = (¾)*C_o$, respectively, the feedback ratio β is $β = C1_H/(C1_H + C1_{MDAC}) = ¼$, and the signal amplification, m, is $m = C1_s/C1_H = 4$.

When the signal amplification is m=4, the relation depicted in FIG. 4B holds between VIN/VR and VO/VR.

Further, the input voltage VIN (the compare voltage $V_{CMP}$), the digital output DO, the add/subtract coefficients DA1 and DA2, the output voltages VDA1 and VDA2 of the sub-DACs 101b and 101a, and the output voltage VO of the op amp OP1 are as depicted in FIG. 4C.

Here, since the output voltage VO is VO=m*{VIN−(DA/m)*VR}, and m=4, it follows that VO=4*VIN−DA*VR.

That is, when the input voltage VIN is in the range defined by +VR≥VIN≥+(⅝)*VR, DO is +011, DA is +3, VDA2 is +VR, VDA1 is +VR, and VO is 4*VIN−3*VR; on the other hand, when the input voltage VIN is in the range defined by +(⅝)*VR≥VIN≥+(⅜)*VR, DO is +010, DA is +2, VDA2 is +VR, VDA1 is 0, and VO is 4*VIN−2*VR.

Further, when the input voltage VIN is in the range defined by +(⅜)*VR≥VIN≥+(⅛)*VR, DO is +001, DA is +1, VDA2 is 0, VDA1 is +VR, and VO is 4*VIN−VR; on the other hand, when the input voltage VIN is in the range defined by +(⅛)*VR≥VIN≥−(⅛)*VR, DO is 000, DA is 0, VDA2 is 0, VDA1 is 0, and VO is 4*VIN.

Further, when the input voltage VIN is in the range defined by −(⅛)*VR≥VIN≥−(⅜)*VR, DO is −001, DA is −1, VDA2 is 0, VDA1 is −VR, and VO is 4*VIN+VR; on the other hand, when the input voltage VIN is in the range defined by −(⅜)*VR≥VIN≥−(⅝)*VR, DO is −010, DA is −2, VDA2 is −VR, VDA1 is 0, and VO is 4*VIN+2*VR.

Finally, when the input voltage VIN is in the range defined by −(⅝)*VR≥VIN≥−VR, DO is −011, DA is −3, VDA2 is −VR, VDA1 is −VR, and VO is 4*VIN+3*VR.

It will be recognized that each of the embodiments to be described later is also applicable to MDACs of other configurations such as 3.5-b and 4.5-b, though such applications will not be described herein.

Figure 5:
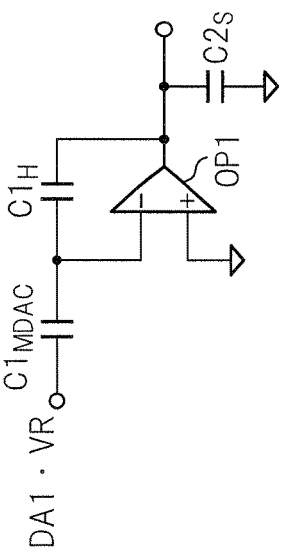
FIG. 5 is a simplified circuit model of a switched capacitor circuit (ex. MDAC) for explaining the relationship between its operating speed and the current consumption of an op amp for an MDAC circuit in the hold mode operation.

FIG. 5 is a simplified circuit model of a switched capacitor circuit (ex. MDAC) for explaining the relationship between its operating speed and the current consumption of an op amp for an MDAC circuit in the hold mode operation, and more specifically, the relationship between the speed of computation in the operation mode of the MDAC1 and the current consumption of the amplifier.

Here, denoting the load as $CL_T$, the feedback ratio as $\beta_1$, and the current of the op amp OP1 as $I_{AMP}$, the time $T_1$ taken to accomplish the conversion is defined by the following relation (see equation (5)).

[MATHEMATICAL 1]

$$CL_T = CL_1 + C2_S \quad (1)$$

$$CL_1 = \frac{C1_H \cdot C1_{MDAC}}{(C1_H + C1_{MDAC})} \quad (2)$$

$$\beta_1 = \frac{C1_H}{(C1_H + C1_{MDAC})} \quad (3)$$

$$\frac{1}{\beta_1} = \frac{(C1_H + C1_{MDAC})}{C1_H} = 1 + \frac{C1_{MDAC}}{C1_H} \quad (4)$$

$$T_1 = \frac{k}{I_{AMP}} \cdot \frac{CL_T}{\beta_1} \quad (5)$$

where k is a proportionality constant independent of $\beta_1$ and $I_{AMP}$. That is, $$T_1 \cdot I_{AMP} = k \cdot \frac{CL_1 + C2_S}{\beta_1} = TL_1 \cdot I_{AMP} + T2_S \cdot I_{AMP} \quad (6)$$

Here, $TL_1*I_{AMP}$ and $T2_S*I_{AMP}$ are related as illustrated below (see equations (7) and (8)). While FIG. 3A, FIG. 3B, FIG. 3C, FIG. 3D, FIG. 4A, FIG. 4B, and FIG. 4C have been described by assuming that $C1_{MDAC}+C1_H=C1_S$ for ease of explanation, it makes no difference if this assumption is eliminated.

$$TL_1 \cdot I_{AMP} = k \cdot \frac{CL_1}{\beta_1} \quad (7)$$
$$= k \cdot \frac{C1_H \cdot C1_{MDAC}}{(C1_H + C1_{MDAC})} \cdot \frac{(C1_H + C1_{MDAC})}{C1_H}$$
$$= k \cdot C1_{MDAC}$$

$$T2_S \cdot I_{AMP} = k \cdot \frac{C2_S}{\beta_1} = k \cdot C2_S \cdot \frac{C1_H + C1_{MDAC}}{C1_H} = k \cdot C2_S \cdot \left(\frac{C1_S}{C1_H}\right) \quad (8)$$

Since the sampling capacitor $C1_s$ in the MDAC (MDAC1) is determined by thermal noise (kT/C), a constant value $C_0$ is used as the reference value in FIG. 3A, FIG. 3B, FIG. 3C, FIG. 3D, FIG. 4A, FIG. 4B, and FIG. 4C. The signal amplification factor (m) is expressed by $C1_S/C1_H$.

More specifically, in the case of FIG. 3A, FIG. 3B, FIG. 3C, and FIG. 3D (1.5bMDAC), m=2, and in the case of FIG. 4A, FIG. 4B, and FIG. 4C (2.5bMDAC), m=4. Accordingly, the MDAC in FIG. 3A, FIG. 3B, FIG. 3C, and FIG. 3D and the MDAC in FIG. 4A, FIG. 4B, and FIG. 4C are defined as illustrated below if $C1_H$ and $C1_{MDAC}$ are expressed using the signal amplification factor, m (see equations (10) and (11)).

$$C1_S = C0 \quad (9)$$

$$C1_H = \frac{C1_S}{m} = \frac{C0}{m} \quad (10)$$

$$C1_{MDAC} = \left(\frac{m-1}{m}\right) \cdot C1_S = \left(\frac{m-1}{m}\right) \cdot C0 \quad (11)$$

The sampling capacitor C2, in the next-stage MDAC (MDAC2) may generally be multiplied by (1/m) relative to the signal amplification factor (m), but the limitation by the minimum capacitance value needs to be considered. That is, the following two points (A) and (B) need to be considered.

(A) Primarily in the first half stage: The sampling capacitor $C2_s$ in the MDAC2 is scaled relative to $C1_s$ by a factor of (1/m).

$$C2_S = \frac{C1_S}{m} = \frac{C0}{m} \quad (12)$$

(B) Primarily in the second half stage: NO scaling is applied to $C2_s$ relative to $C1_s$ (the size is the same) because the former is limited by the minimum capacitance value.

$$C2_S = \frac{C1_S}{m} = \frac{C0}{m} \quad (13)$$

Arranging equations (7) and (8) by using equations (9) to (13)

$$TL_1 \cdot I_{AMP} = k \cdot C1_{MDAC} = k \cdot \left(\frac{m-1}{m}\right) \cdot C0 \quad (14)$$

$$T2_S \cdot I_{AMP} = k \cdot C2_S \cdot \left(\frac{C1_S}{C1_H}\right) = \begin{cases} k \cdot C0 & (C2_s, \text{ with scaling}) \\ k \cdot m \cdot C0 & (C2_s, \text{ without scaling}) \end{cases} \quad (15)$$

FIG. 6 is a comparison table of the performance for some kind of MDAC circuits with considering some kind of load conditions for the output of each MDAC; that is, the performance under no load conditions and the performance under load conditions with and without scaling are compared for each of the signal amplification factors m=2 and m=4.

Here, the term "with scaling" indicates that the capacitance of the MDAC is reduced, for example, in increments of ½ for each subsequent stage relative to the preceding one in the case of m=2 (1.5bMDAC), and in increments of ¼ for each subsequent stage relative to the preceding one in the case of m=4 (2.5bMDAC). On the other hand, the term "without scaling" indicates that the capacitance of the MDAC remains the same at each stage.

As illustrated in FIG. 6, under load conditions, the conversion time (see $T^*I_{AMP}$) increases by a factor of two or more compared with no load conditions; in particular, it is seen that when no scaling is applied to the capacitor $C2_s$ in FIG. 5, the decrease in conversion speed becomes more pronounced.

Further, in the multi-bit case (m=4), it is seen that when no scaling is applied to the capacitor C2, the conversion speed (operation speed) decreases by a factor of six or more compared with no load conditions. This indicates that when the supply current to the amplifier (op amp) is held constant, the time taken to accomplish the conversion increases by a factor of two or more compared with no load conditions (the conversion speed decreases by a factor of two or more).

In this way, in the MDAC (switched capacitor circuit), when there is a load associated with the sampling capacitor at the subsequent stage, for example, the time taken to accomplish the conversion (computation) increases by a factor of two or more compared with the time taken when there is no such load. Furthermore, if no scaling is applied, the decrease in the conversion speed of the MDAC becomes more pronounced; further, as the number of bits increases, the decrease in speed becomes greater.

Figure 7:
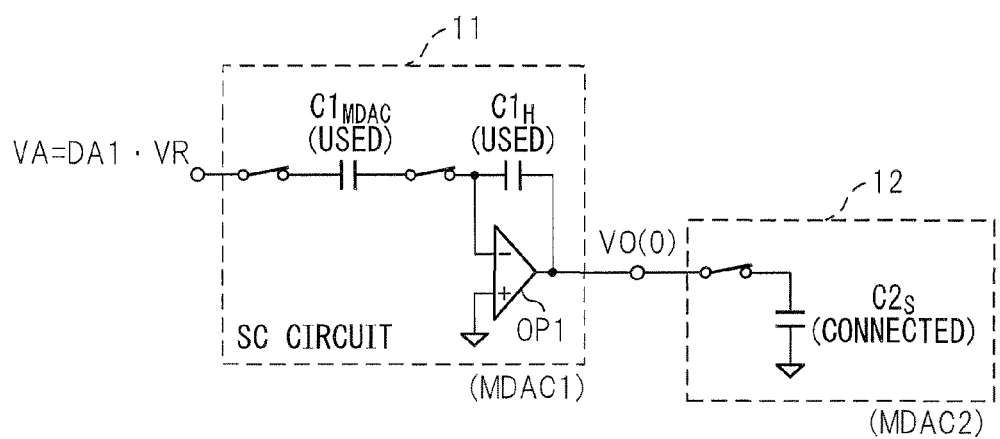
FIG. 7 is a simplified circuit model of a switched capacitor circuit (ex. MDAC) in the hold operation mode that is used for both analog computation of MDAC and sampling the output voltage of MDAC to a loading capacitance.

FIG. 7 is a simplified circuit model of a switched capacitor circuit (ex. MDAC) in the hold operation mode that is used for both analog computation of MDAC and sampling the output voltage of MDAC to a loading capacitance; more specifically, the operation in the earlier described analog computation mode (hold mode) is illustrated in simplified form.

As illustrated in FIG. 7, in the SC circuit 11 (MDAC1) that performs analog computation, the capacitors $C1_{MDAC}$ and $C1_H$ are connected (used). Further, the sampling capacitor $C2_s$ in the SC circuit 12 (MDAC2) at the subsequent stage is coupled to the output of the operational amplifier (op amp) OP1 in order to sample its output voltage VO(0).

More specifically, in the SC circuit 11, the hold capacitor $C1_H$ is connected between the output terminal and negative input terminal of the op amp OP1, and the computation capacitor $C1_{MDAC}$ is connected between the output terminal of the sub-DA converter (101) and the negative input terminal of the op amp OP1. Then, the sampling capacitor $C2_s$ in the SC circuit 12 at the subsequent stage is coupled to the output terminal of the op amp OP1.

Accordingly, when the SC circuit 11 is performing analog computation, since the sampling capacitor $C2_s$ in the SC circuit 12 at the subsequent stage is connected as the load for the op amp OP1, the supply current to the amplifier needs to be increased.

This not only increases power consumption but also increases the size of the amplifier, thus increasing the die size it occupies and hence leading to an increase in cost.

Next, embodiments of a switched capacitor circuit and an AD conversion circuit will be described in detail with reference to the accompanying drawings.

Figure 8A:
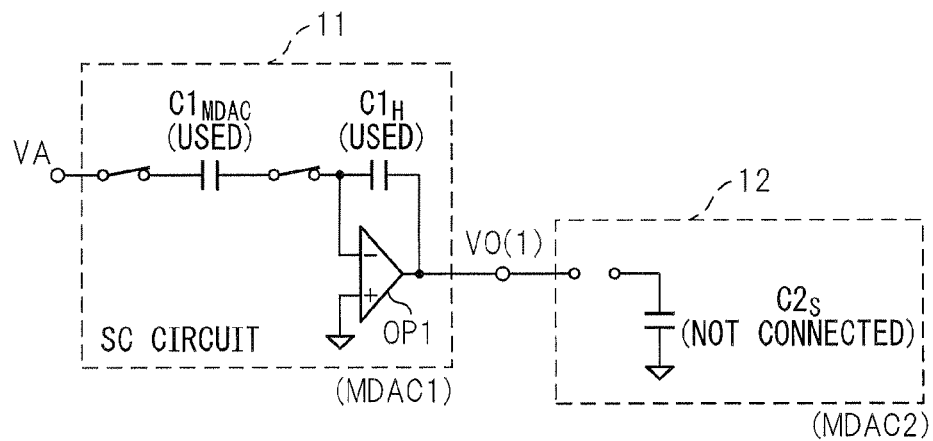
FIG. 8A is a simplified circuit model of a first embodiment switched capacitor circuit (ex. MDAC) in the first hold operation mode that is used for only analog computation of MDAC without loading capacitance.
Figure 8B:
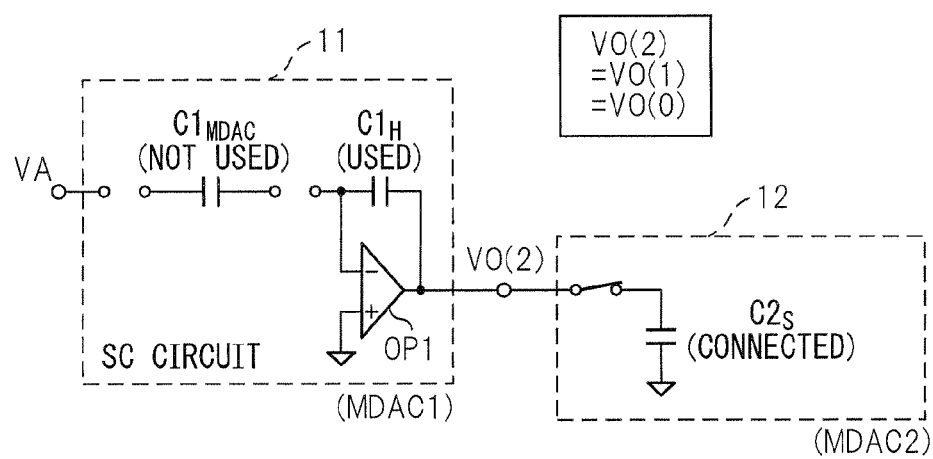
FIG. 8B is a simplified circuit model of a first embodiment switched capacitor circuit (ex. MDAC) in the second hold operation mode that is used for sampling the output voltage of MDAC in the first operation mode to a loading capacitance by using a sampling switch, the amplifier and the capacitance ($C1_H$)

FIG. 8A is a simplified circuit model of a first embodiment switched capacitor circuit (ex. MDAC) in the first hold operation mode that is used for only analog computation of MDAC without loading capacitance, and FIG. 8B is a simplified circuit model of a first embodiment switched capacitor circuit (ex. MDAC) in the second hold operation mode that is used for sampling the output voltage of MDAC in the first operation mode to a loading capacitance by using a sampling switch, the amplifier and the capacitance $C1_H$.

As is apparent by comparing the above-described FIG. 7 with FIG. 8A and FIG. 8B, in the first embodiment the analog computation (hold operation) is performed by dividing it into two modes, the first-half operation mode and the second-half operation mode.

More specifically, in the first-half operation mode depicted in FIG. 8A, the analog computation is performed in the SC circuit 11 (MDAC1) by disconnecting the sampling capacitor $C2_s$ in the subsequent-stage SC circuit 12 (MDAC2).

On the other hand, in the second-half operation mode depicted in FIG. 8B, the feedback coefficient β is set to "1", i.e., full feedback, by disconnecting the computation capacitor $C1_{MDAC}$ in the SC circuit 11, and the output voltage is stored on the sampling capacitor $C2_s$ in the subsequent-stage SC circuit 12.

By thus performing the analog computation in two separate modes, it becomes possible to enhance the speed of computation, reduce the power consumption of the amplifier, or reduce the footprint of the circuit, and so on.

While the present specification deals primarily with examples in which the SC circuit is employed as the MDAC, the embodiments described herein are basically intended to enhance the speed of computation of the SC circuit itself and are therefore extensively applicable not only to SC circuits but also to various circuits employing SC circuits.

Figure 9A:
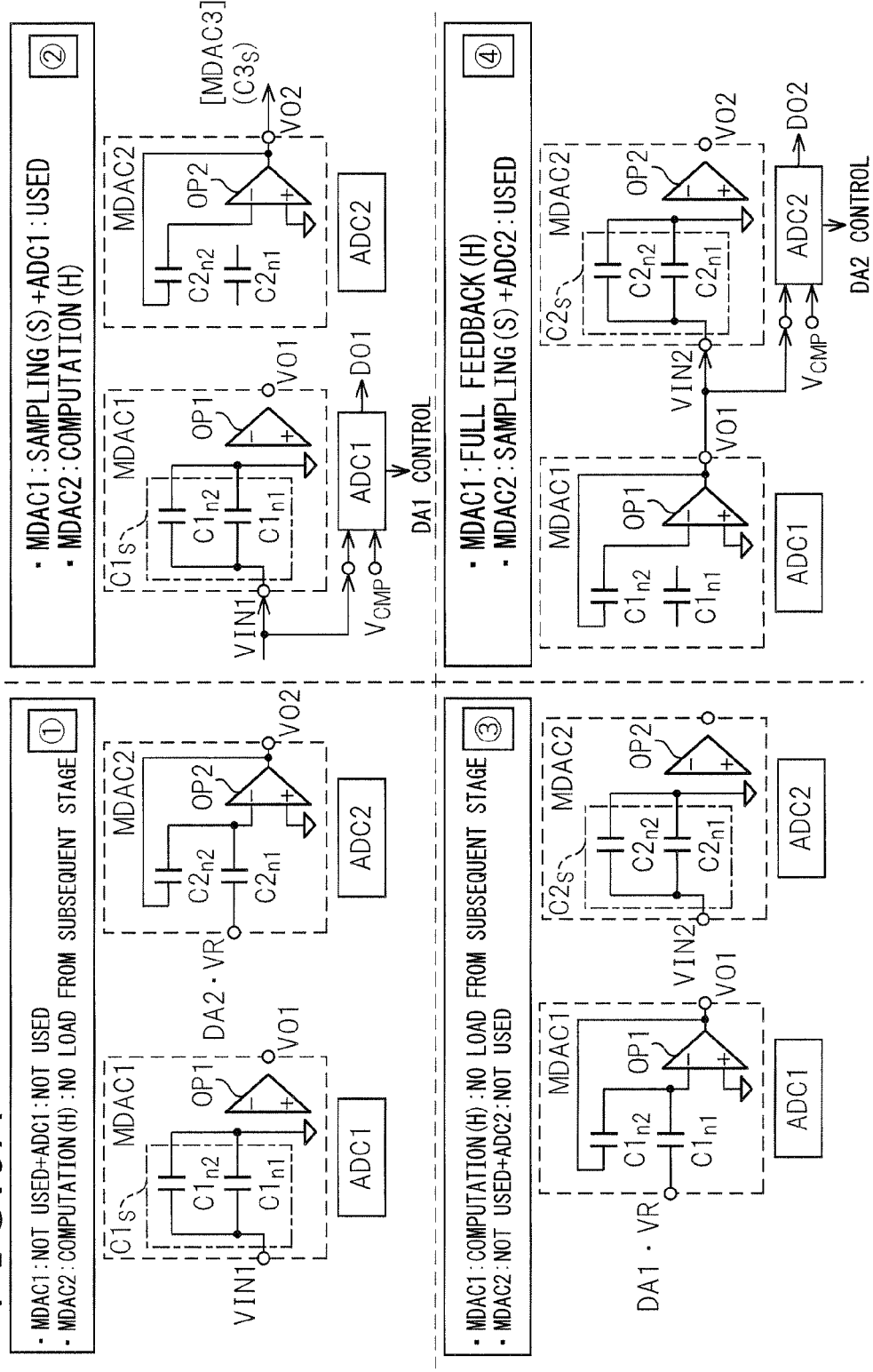
FIG. 9A is a diagram (part 1) for explaining the STAGE circuit of the first embodiment and its operation.
Figure 9B:
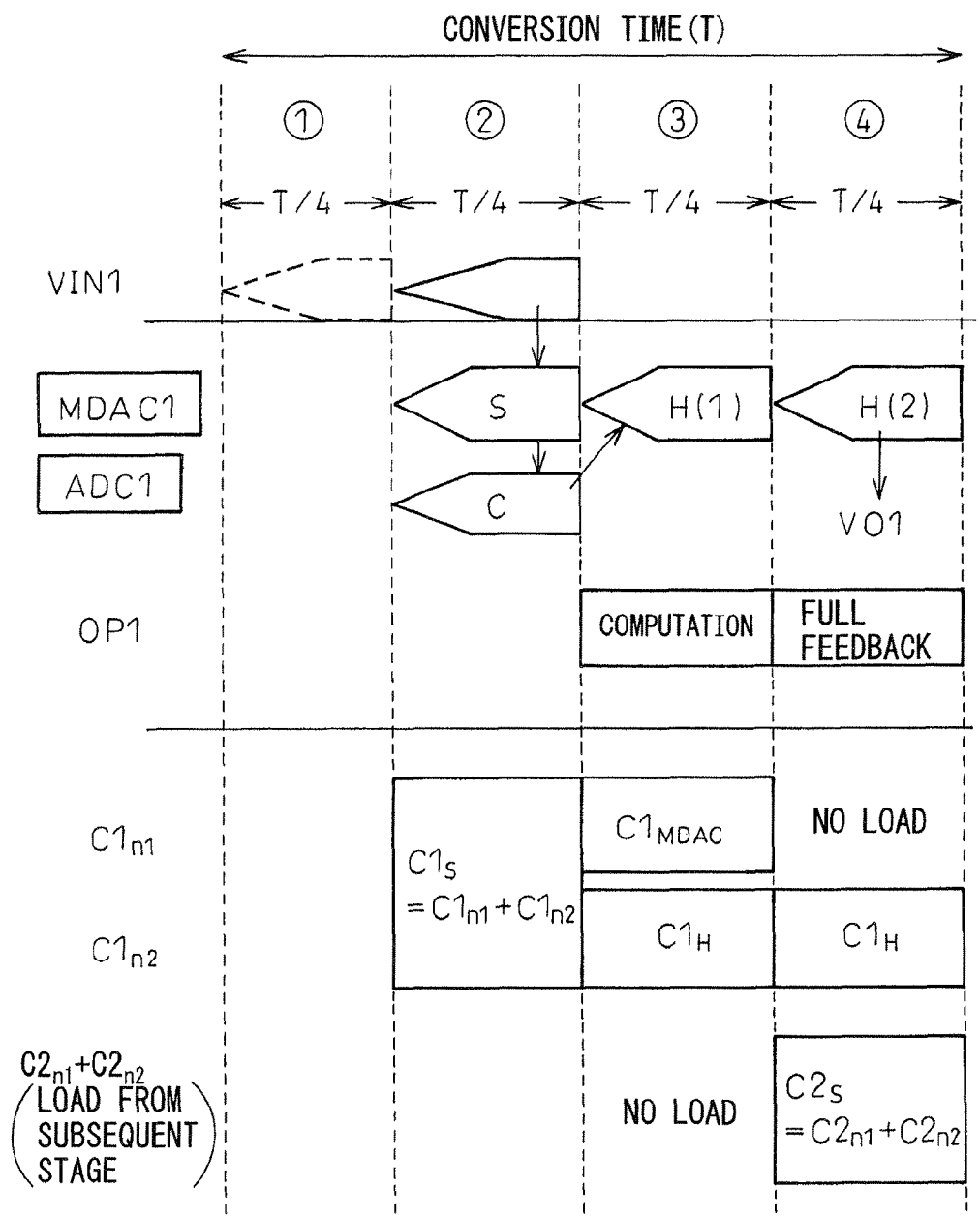
FIG. 9B is a timing chart (part 2) for explaining the STAGE circuit of the first embodiment and its operation.

FIG. 9A and FIG. 9B are diagrams for explaining the STAGE circuit of the first embodiment and its operation with the conversion time (T) divided into four periods (1) to (4).

As is apparent by comparing FIG. 9A and FIG. 9B with previously described FIG. 2A and FIG. 2C, the operation of the MDAC according to the first embodiment is characterized in that, in the period (1), the MDAC1 and the ADC1 (sub-AD converter) are not used, and the MDAC2 performs computation (hold: H).

Here, just like the op amp OP1 in the MDAC1 in the period (3) to be described later, the output of the op amp OP2 in the MDAC2 is decoupled from the load ($C3_s$) in the subsequent-stage MDAC (MDAC3) and the op amp OP2 is thus at no load.

Next, in the period (2), the ADC1 is used and the MDAC1 performs sampling (S), while the MDAC2 performs computation (full feedback operation).

In the period (3), the MDAC2 and the ADC2 (sub-AD converter) are not used, and the MDAC1 performs computation. Here, the output of the op amp OP1 in the MDAC1 is decoupled from the load ($C2_s$ (=$C2_{n1}$+$C2_{n2}$)) in the subsequent-stage MDAC2 and the op amp OP1 is thus at no load.

The operation of the MDAC1 in the period (3) corresponds to the operation of the SC11 (MDAC1) described with reference to FIG. 8A. Here, the capacitor $C1_{n1}$ acts as the computation capacitor $C1_{MDAC}$ and the capacitor $C1_{n2}$ as the hold capacitor $C1_H$.

Then, in the period (4), the MDAC1 performs computation (full feedback operation), while on the other hand, the ADC2 is used and the MDAC2 performs sampling. The operation of the MDAC1 in the period (4) corresponds to the operation of the SC11 (MDAC1) described with reference to FIG. 83.

In this way, according to the MDAC of the first embodiment, it becomes possible to enhance the speed of computation, reduce the power consumption of the amplifier, or reduce the footprint of the circuit, and so on.

Here, the ratio between the periods (1) and (2) (or the periods (3) and (4)) may be varied as needed according to such factors as the operating speed of the circuit and the size of the capacitors used. Further, between the periods (1) and (2) (or the periods (3) and (4)), the supply current to the op amp OP1 may be set to different values.

The control of the ratio between the periods (1) and (2) (or the periods (3) and (4)) and the control of the supply current to the op amp in the periods (1) and (2) (or the periods (3) and (4)) may be performed not only in the first embodiment but also in the second to fifth embodiments to be described later.

Figure 10A:
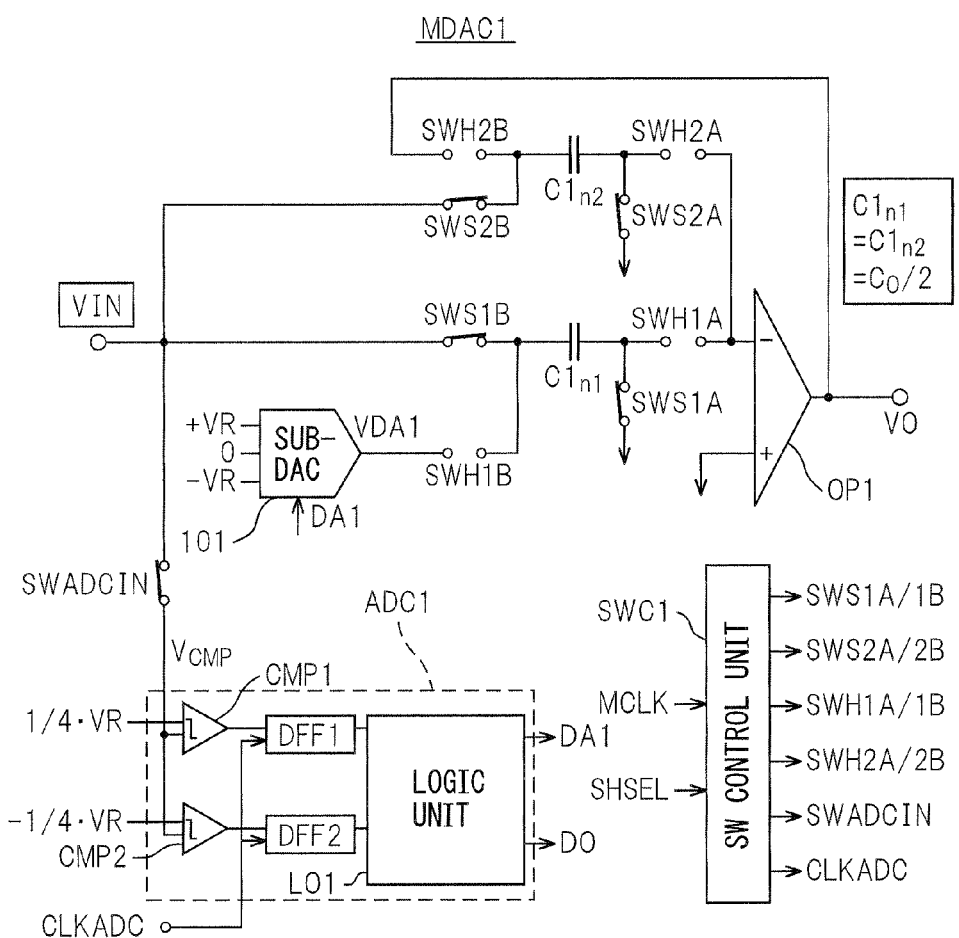
FIG. 10A is a circuit diagram illustrating one example of the STAGE circuit of the first embodiment.
Figure 10B:
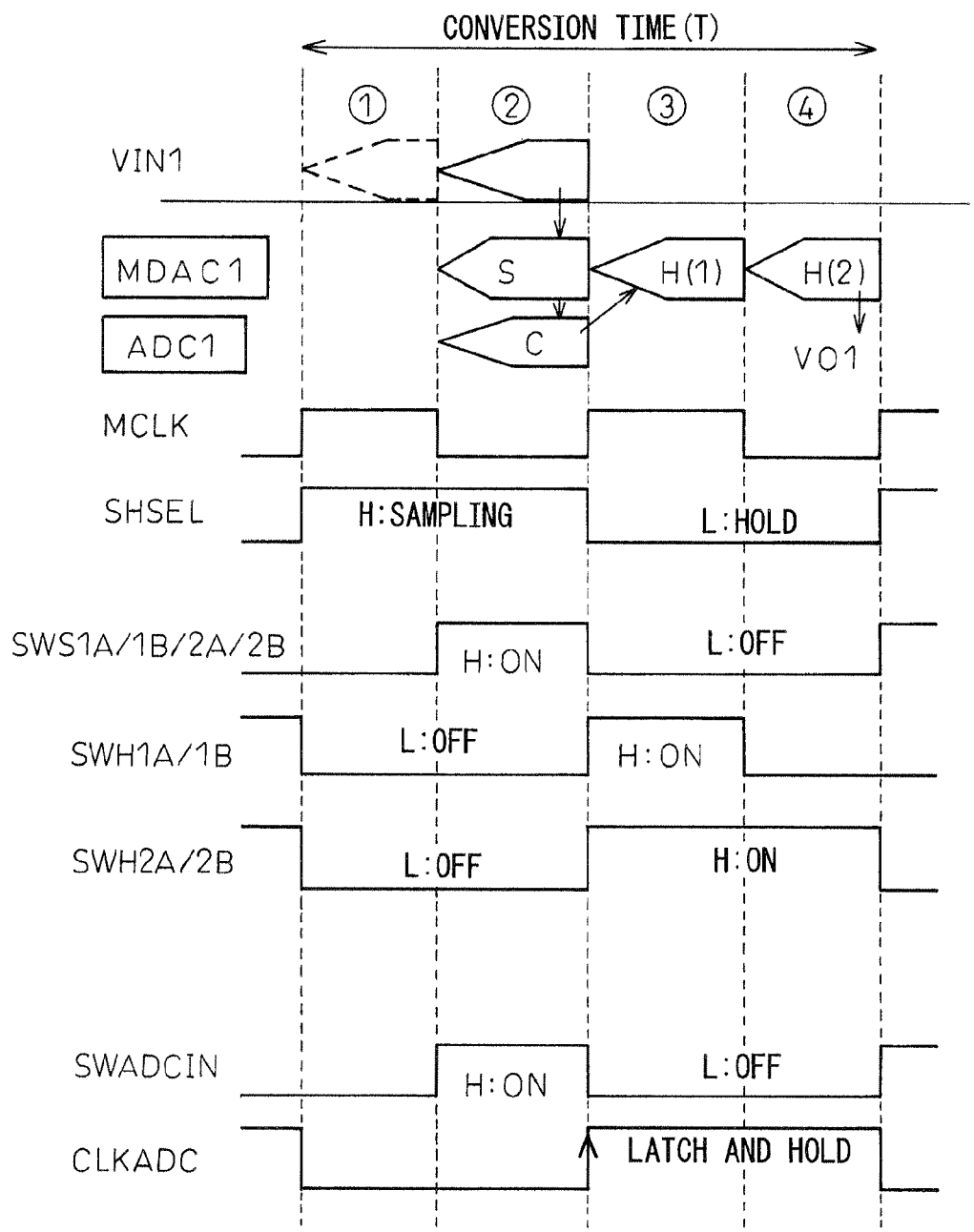
FIG. 10B is a timing chart for explaining the operation of the STAGE circuit in FIG. 10A.

FIG. 10A is a circuit diagram illustrating one example of the STAGE circuit of the first embodiment, and FIG. 10B is a timing chart for explaining the operation of the STAGE circuit in FIG. 10A. The MDAC illustrated in FIG. 10A and FIG. 103 is a 1.5bMDAC (MDAC1).

The circuit of the MDAC1 in the periods (1) to (4) in FIG. 102 corresponds to that of the MDAC1 in (1) to (4) depicted in FIG. 9A.

In FIG. 10A, reference character SWC1 designates a switch control unit which receives signals MCLK and SHSEL and outputs switch control signals; further, 101 is a sub-DAC, CMP1 and CMP2 are comparators, DFF1 and DFF2 are flip-flops, and LO1 is a logic unit.

As illustrated in FIG. 10A, the MDAC1 (switched capacitor circuit) includes capacitors $C1_{n1}$ and $C1_{n2}$ (two or more internal capacitors), an op amp OP1 (one or more amplifiers), and switches SWS1A/1B/2A/2B, SWH1A/1B, SWH2A/2B, and SWADCIN (two or more internal switches).

As is apparent by comparing FIG. 10A and FIG. 10B with the previously described FIG. 3A and FIG. 3B, the MDAC1 is similar between the two, but differs in the way the switch control unit SWC1 controls the respective switches.

First, in the period (1) of FIG. 10B, the switch control unit SWC1 sets the control signals for the switches SWS1A/1B/2B, SWH1A/1B, SWH2A/2B, and SWADCIN to a low level "L", causing these switches to turn off. The signal CLKADC is at "L", so that the flip-flops DFF1 and DFF2 are disabled.

Next, in the period (2) of FIG. 103, the switch control unit SWC1 sets the control signals for the switches SWS1A/1B/2A/2B and SWADCIN to a high level "H", causing these switches to turn on. Here, the control signals for the switches SWH1A/1B and SWH2A/2B and the signal CLKADC remain at "L".

As a result, in the period (2), the switches SWS1A/1B/2A/2B and SWADCIN turn on, and the MDAC1 performs sampling (S). That is, the input voltage VIN (the compare voltage $V_{CMP}$) is coupled to the comparators CMP1 and CMP2 where it is compared with the reference voltages (¼)*VR and –(¼)*VR, respectively, and the comparison results are supplied to the input terminals of the respective flip-flops DFF1 and DFF2.

Further, in the period (2), the input voltage VIN is sampled by the sampling capacitor $C1_s$ ($C1_{n1}+C1_{n2}$).

Next, in the period (3) of FIG. 10B, the switch control unit SWC1 sets the control signals for the switches SWS1A/1B/2A/2B and SWADCIN to "L", causing these switches to turn off, and sets the control signals for the switches SWH1A/1B and SWH2A/2B to "H". The signal CLKADC is also set to "H".

As a result, in the period (3), the comparison results from the comparators CMP1 and CMP2 are latched into the flip-flops DFF1 and DFF2 and held therein. Since similar control is performed on the subsequent-stage MDAC2, the op amp OP1 is disconnected from the load ($C2_s$) in the subsequent-stage MDAC2 and is thus held at no load.

More specifically, the hold capacitor $C1_H$ ($C1_{n2}$) is connected between the output terminal and negative input terminal of the op amp OP1, and the computation capacitor $C1_{MDAC}$ ($C1_{n1}$) is connected between the output terminal of the sub-DA converter 101 and the negative input terminal of the op amp OP1. Then, the op amp OP1 operates at no load with its output terminal decoupled from the sampling capacitor $C2_s$ ($C2_{n1}+C2_{n2}$) in the subsequent-stage MDAC2.

The operation of the MDAC1 in the period (3) is the same as that described with reference to FIG. 8A, FIG. 9A, and FIG. 9B.

Next, in the period (4) of FIG. 10B, the switch control unit SWC1 sets the control signal for the switches SWH1A/1B from "H" to "L" to turn off the switches SWH1A/1B thereby disconnecting the capacitor $C1_{n1}$. The other switches SWS1A/1B/2A/2B, SWADCIN, and SWH2A/2B are each held in the same state as in the period (3).

Thus, in the period (4), the MDAC1 performs full feedback operation. The operation of the MDAC1 in the period (4) is the same as that described with reference to FIG. 8A, FIG. 9A, and FIG. 9B.

FIG. 11 is a comparison table of the performance for the 1.5bMDAC of the first embodiment for comparison with the MDAC depicted in FIG. 3A, that is, the amount of performance improvement achieved by the 1.5bMDAC, i.e., the MDAC with m=2.

As seen from the "$T*I_{AMP}$" section in FIG. 11 that relates to the operating speed or power consumption of the MDAC, the MDAC of the first embodiment is capable of improving the speed or the power consumption by about 33% when scaling is applied and by about 40% when no scaling is applied, as compared with the MDAC of FIG. 3A.

More specifically, when the MDAC operating speed (T) is the same, the power consumption (the op amp current $I_{AMP}$) may be reduced, while on the other hand, when the op amp current ($I_{AMP}$: power consumption) is the same, the MDAC operating speed (T) may be enhanced.

Regarding the operating speed and power consumption described above, their magnitude may be designed appropriately as needed by giving priority to one or the other of the two factors. In this case, an alteration may be made, for example, by adjusting the duration of each of the periods (1) to (4) (duty ratio).

Further, when applying the MDAC to a cyclic AD conversion circuit, the circuit may be designed by adjusting the switch timing (clock period) so as to increase the processing time in the starting or first-half period and reduce the processing time in the last or second-half period.

FIG. 12 is a comparison table of the performance for the 2.5bMDAC of the first embodiment for comparison with the MDAC depicted in FIG. 4A, that is, the amount of performance improvement achieved by the 2.5bMDAC, i.e., the MDAC with m=4.

As seen from the "$T*I_{AMP}$" section in FIG. 12, the 2.5bMDAC as a modified example of the first embodiment is capable of improving the speed or the power consumption by about 43% when scaling is applied and by about 63% when no scaling is applied, as compared with the MDAC of FIG. 4A.

Regarding "T*$I_{AMP}$", by giving priority to the operating speed (T) or the power consumption ($I_{AMP}$), whichever is desired, their magnitude may be designed appropriately as needed, as just described with reference to FIG. 11; further, the duration of each of the periods (1) to (4) may also be adjusted as needed.

Here, the duration of the first-half operation mode (period (3)) during analog computation of the MDAC (MDAC1) and the duration of the second-half operation mode (period (4)) are denoted by $TL_1$ and $TL_2$, respectively, and the feedback ratio β in the first-half operation mode and that in the second-half operation mode are denoted by $β_1$ and $β_2$, respectively.

The first-half operation mode (period (3)) during analog computation of the MDAC of the first embodiment is the same as the operation under no load conditions for the case of m=2 described in the previously given FIG. 6.

On the other hand, in the second-half operation mode (period (4)) during analog computation of the MDAC of the first embodiment, since the capacitor $C1_{MDAC}$ is disconnected, the feedback ratio β becomes equal to unity, and the capacitor $CL_1$ may be regarded as almost zero.

That is, the following equations (16) to (18) hold. That is, $$T_2 \cdot I_{AMP} = T_{21} \cdot I_{AMP} + T_{2S} \cdot I_{AMP} \quad (16)$$

$$TL_1 \cdot I_{AMP} = k \cdot C1_{MDAC} = k \cdot \left(\frac{m-1}{m}\right) \cdot C0 \quad (17)$$

$$T_{2S} \cdot I_{AMP} = k \cdot C2_S \cdot \frac{1}{β_2(=1)} = \begin{cases} k \cdot C0/m & (C2_s, \text{with scaling}) \\ k \cdot C0 & (C2_s, \text{without scaling}) \end{cases} \quad (18)$$

When the value of $T2_s*I_{AMP}$ is compared between the equation (15) for the MDAC of FIG. 3A and the equation (18) for the MDAC of the first embodiment, it is seen that the MDAC of the first embodiment is faster by a factor of m.

The above description has dealt with the case where only the switch timing of each switch is controlled by the switch control unit SWC1, but if, for example, the duty ratio between the periods (1) and (2) (or the periods (3) and (4)) or the supply current to the op amp is also controlled, performance close to the ideal may be achieved.

Figure 13A:
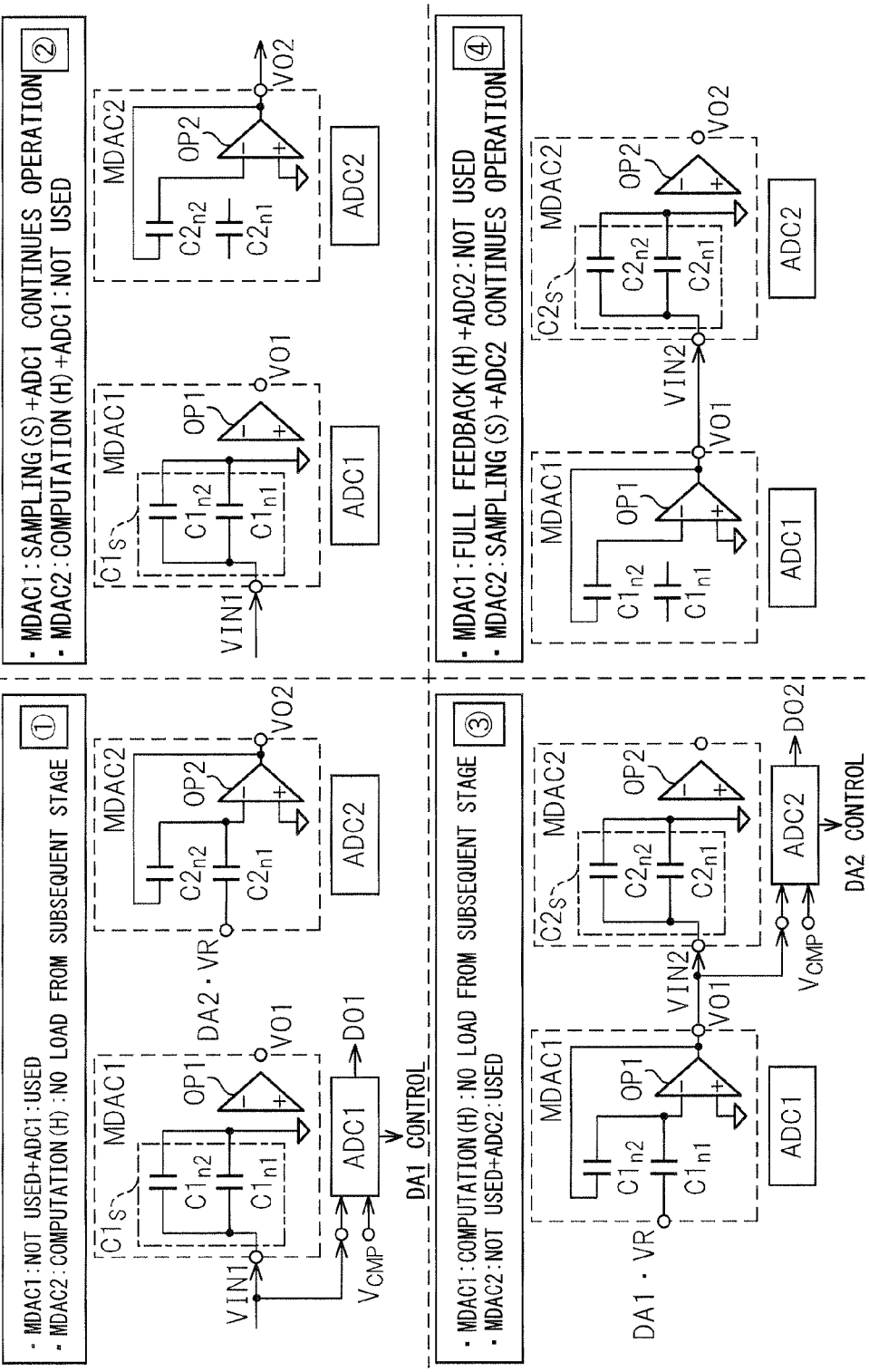
FIG. 13A is a diagram (part 1) for explaining a STAGE circuit according to a second embodiment and its operation.
Figure 13B:
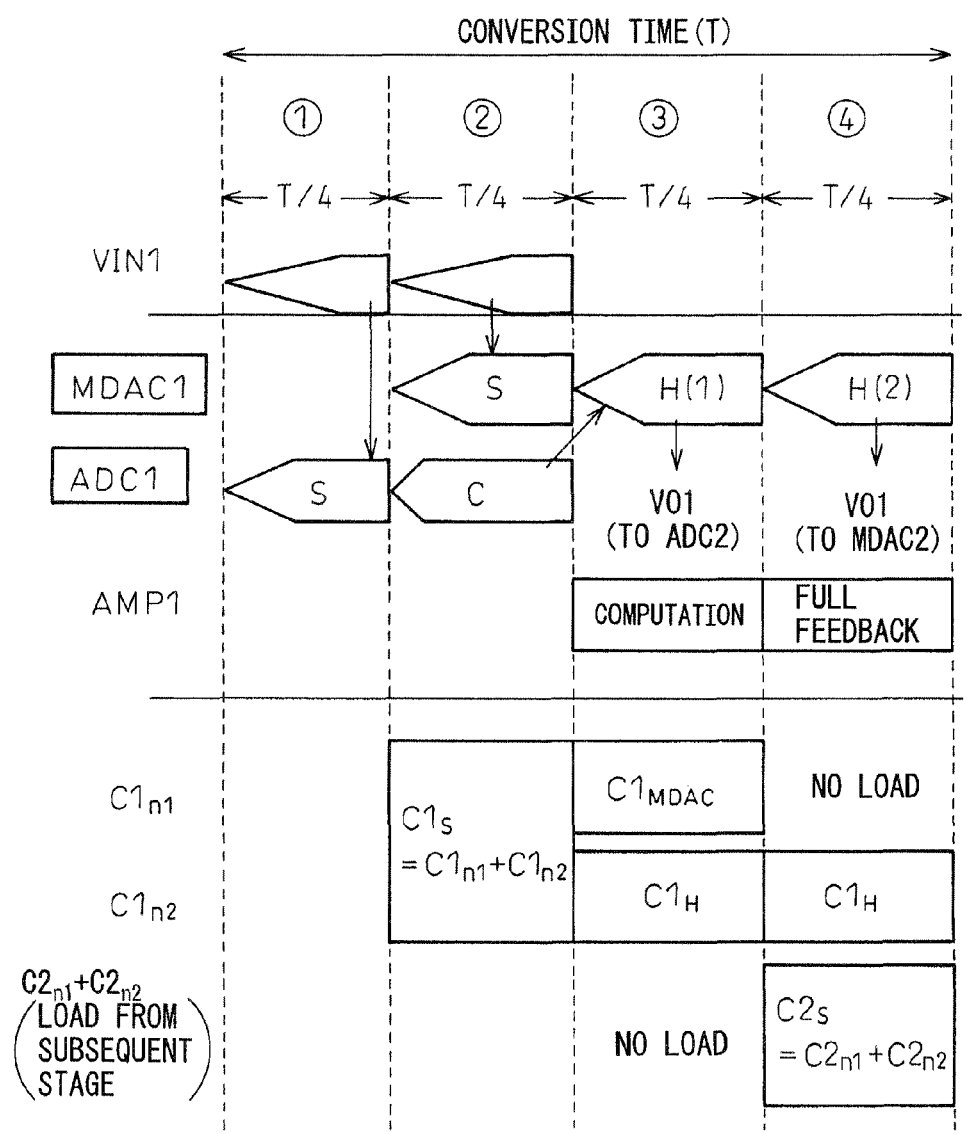
FIG. 13B is a timing chart (part 2) for explaining the STAGE circuit of the second embodiment and its operation.

FIG. 13A and FIG. 13B are diagrams for explaining a STAGE circuit according to a second embodiment and its operation with the conversion time (T) divided into four periods (1) to (4).

As is apparent by comparing FIG. 13A and FIG. 13B with the previously described FIG. 9A and FIG. 9B, the operation of the MDAC according to the second embodiment is characterized in that, in the period (1), the MDAC1 is not used but the ADC1 is used. On the other hand, the MDAC2 performs computation (hold: H).

That is, in the case of the MDAC of the second embodiment, the ADC1 is used in the period (1) so that in the period (1) the add/subtract coefficient DA1 is supplied to the sub-DAC not depicted (refer, for example, to the sub-DAC 101 in FIG. 3) in the MDAC1. On the other hand, in the case of the MDAC of the first embodiment, the ADC1 supplies the add/subtract coefficient DA1 to the sub-DAC in the period (2).

Next, in the period (2), the MDAC1 performs sampling (S), while the MDAC2 performs computation (full feedback operation). The ADC1 continues to perform the same operation as that in the period (1).

In the period (3), the MDAC2 is not used but the ADC2 is used, and the MDAC1 performs computation. Here, the output of the op amp OP1 in the MDAC1 is decoupled from the load ($C2_s$ ($=C2_{n1}+C2_{n2}$)) in the subsequent-stage MDAC2 and the op amp OP1 is thus at no load, as in the first embodiment.

That is, in the second embodiment, the ADC2 is used in the period (3) so that in the period (3) the add/subtract coefficient DA2 is supplied to the sub-DAC (not depicted) in the MDAC2.

Then, in the period (4), the MDAC1 performs computation (full feedback operation), while on the other hand, the MDAC2 performs sampling. The ADC2 continues to perform the same operation as that in the period (3).

In this way, the MDAC of the second embodiment aims to relax the constraints on the conversion speed of the comparators in the ADC1 (for example, the comparators CMP1 and CMP2 in FIG. 10A) by utilizing, for example, the fact that the analog computation result of the MDAC1 is output in the two periods (1) and (2).

That is, according to the second embodiment, the comparators CMP1 and CMP2 in the ADC1 need only perform the comparisons over the entire duration of the period (2) by using the final data obtained from the period (1); this serves to alleviate the need for higher operating speeds demanded of the comparators CMP1 and CMP2.

Figure 14A:
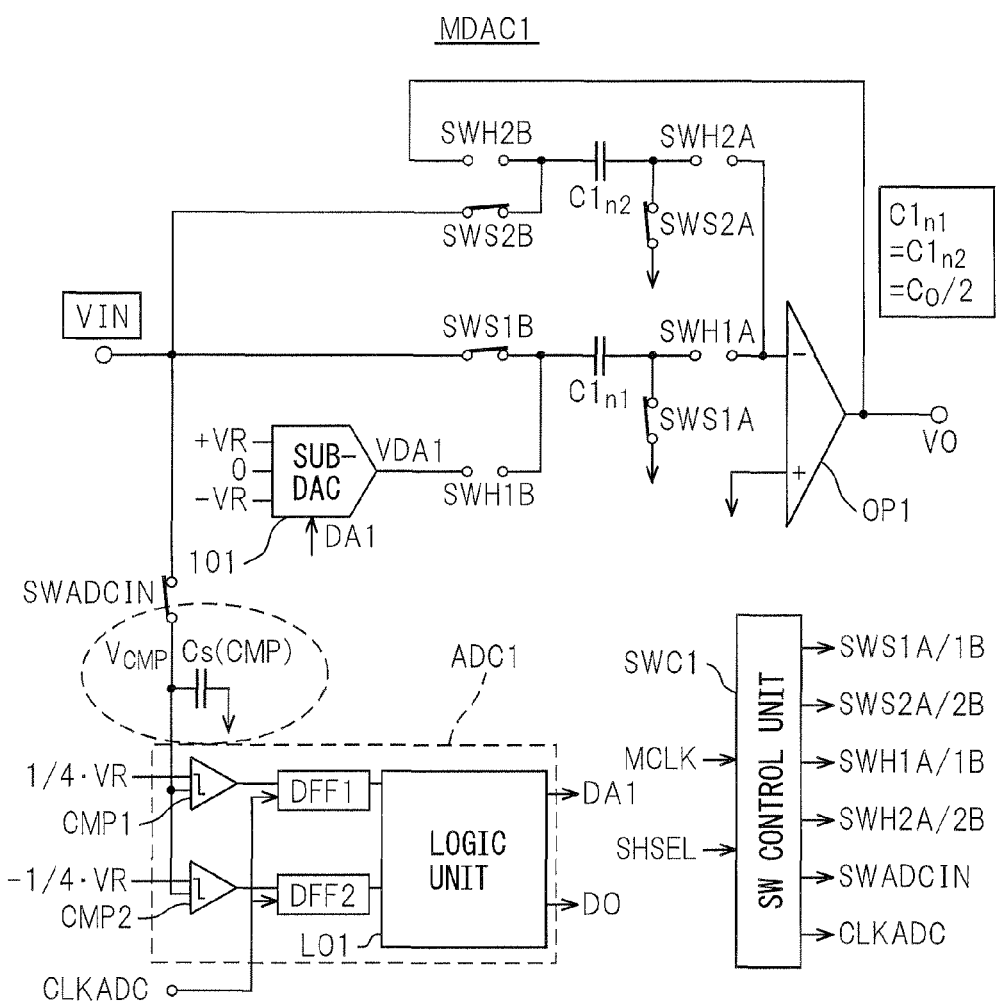
FIG. 14A is a circuit diagram illustrating one example of the STAGE circuit of the second embodiment.
Figure 14B:
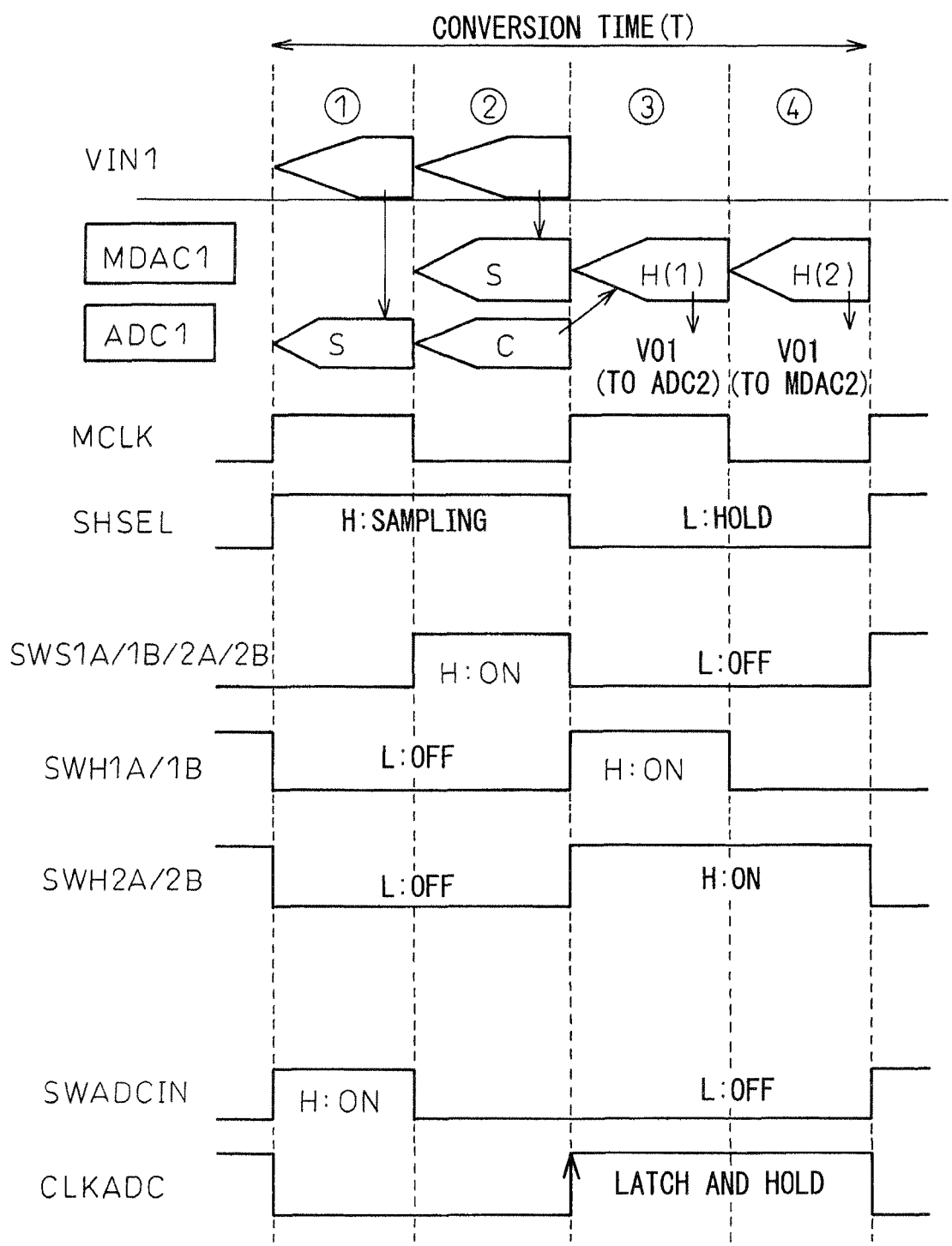
FIG. 14B is a timing chart for explaining the operation of the STAGE circuit of FIG. 14A.

FIG. 14A is a circuit diagram illustrating one example of the STAGE circuit of the second embodiment, and FIG. 14B is a timing chart for explaining the operation of the STAGE circuit of FIG. 14A. The STAGE circuit (MDAC) illustrated in FIG. 14A and FIG. 14B is a 1.5bMDAC (MDAC1).

The circuit of the MDAC1 in the periods (1) to (4) in FIG. 14B corresponds to that of the MDAC1 in (1) to (4) in the above-described FIG. 13A.

As is apparent from a comparison between FIG. 10A and the previously described FIG. 10A, the MDAC (MDAC1) of the second embodiment differs from the MDAC1 of the first embodiment by the inclusion of a capacitor $C_s$(CMP) which is provided between the switch SWASCIN and the ADC1 and which acts as a sampling capacitor $C_s$ in the period (1).

As illustrated in FIG. 14A, the MDAC1 (switched capacitor circuit) includes capacitors $C_{n1}$, $C_{n2}$, and $C_s$(CMP) (two or more internal capacitors), the op amp OP1 (one or more amplifiers), and switches SWS1A/1B/2A/2B, SWH1A/1B, SWH2A/2B, and SWADCIN (two or more internal switches).

In the period (1) of FIG. 14B, the switch control unit SWC1 sets the control signals for the switches SWS1A/1B/2A/2B, SWH1A/1B, and SWH2A/2B to a low level "L", causing these switches to turn off, and sets the control signal for the switch SWADCIN to a high level "H", causing the switch SWADCIN to turn on. The signal CLKADC is at "L", so that the flip-flops DFF1 and DFF2 are disabled.

That is, the difference from the embodiment earlier described with reference to FIG. 10A and FIG. 105 is that, in the period (1), the switch SWADCIN is turned on so that the compare voltage $V_{CMP}$ (the input voltage VIN) is sampled onto the sampling capacitor $C_s$(CMP).

Next, in the period (2) of FIG. 14B, the switch control unit SWC1 sets the control signal for the switches SWS1A/1B/2A/2B to "H", causing these switches to turn on, and sets the control signal for the switch SWADCIN to "L", causing the switch SWADCIN to turn off. Here, the control signals for the switches SWH1A/1B and SWH2A/2B and the signal CLKADC remain at "L".

That is, upon entering the period (2), the compare voltage $V_{CMP}$ sampled by the sampling capacitor $C_s$(CMP) in the period (1) is coupled to the comparators CMP1 and CMP2 in the ADC1 where it is compared with the reference voltages (¼)*VR and −(¼)*VR, respectively, and the comparison results are supplied to the input terminals of the respective flip-flops DFF1 and DFF2.

Next, in the period (3) of FIG. 14B, the switch control unit SWC1 sets the control signals for the switches SWS1A/1B/2A/2B and SWADCIN to "L", causing these switches to turn off, and sets the control signals for the switches SWH1A/1B and SWH2A/2B to "H", causing these switches to turn on. The signal CLKADC is also set to "H".

As a result, in the period (3), the comparison results from the comparators CMP1 and CMP2 are latched into the flip-flops DFF1 and DFF2 and held therein. Here, the op amp OP1 is disconnected from the load (C2) in the subsequent-stage MDAC2, but its output voltage VO1 is sampled onto the sampling capacitor $C_S$(CMP) in the ADC2 at the subsequent stage.

Next, in the period (4) of FIG. 14B, the switch control unit SWC1 sets the control signal for the switches SWH1A/1B from "H" to "L" to turn off the switches SWH1A/1B thereby disconnecting the capacitor $C1_{n1}$.

The other switches SWS1A/1B/2A/2B, SWADCIN, and SWH2A/2B are each held in the same state as in the period (3). Thus, in the period (4), the MDAC1 performs full feedback operation.

FIG. 15A and FIG. 152 are diagrams for explaining a STAGE circuit according to a third embodiment and its operation with the conversion time (T) divided into four periods (1) to (4). Further, FIG. 16A is a circuit diagram illustrating one example of the STAGE circuit of the third embodiment, and FIG. 162 is a timing chart for explaining the operation of the STAGE circuit of FIG. 16A.

As is apparent by comparing FIG. 15A, FIG. 15B, FIG. 16A, and FIG. 162 with the previously described FIG. 9A, FIG. 92, FIG. 10A, and FIG. 10B, the third embodiment differs from the first embodiment in that the two comparators CMP1 and CMP2 in the first embodiment are replaced by one common comparator CMP0.

Figure 16A:
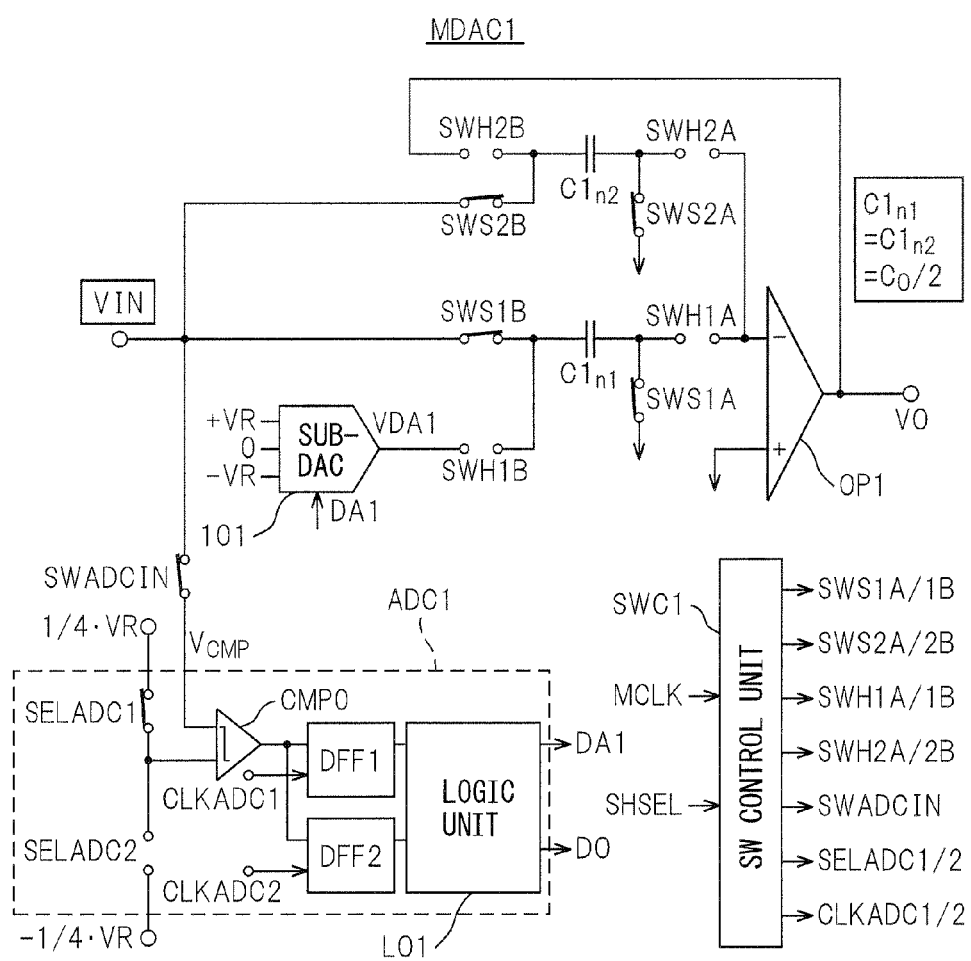
FIG. 16A is a circuit diagram illustrating one example of the STAGE circuit of the third embodiment.

That is, in the third embodiment, as is apparent from a comparison between FIG. 16A and the previously described FIG. 10A, the ADC1 is provided with two switches SELADC1 and SELADC2, and the one comparator CMP0 is made to perform the same functions as the comparators CMP1 and CMP2 of the first embodiment in the periods (1) and (2), respectively.

Further, the common signal CLKADC supplied to the clock terminals of the flip-flops DFF1 and DFF2 in the first embodiment is replaced by two separate signals CLKADC1 and CLKADC2 so that the activation of each of the flip-flops DFF1 and DFF2 is controlled independently of each other.

Figure 15B:
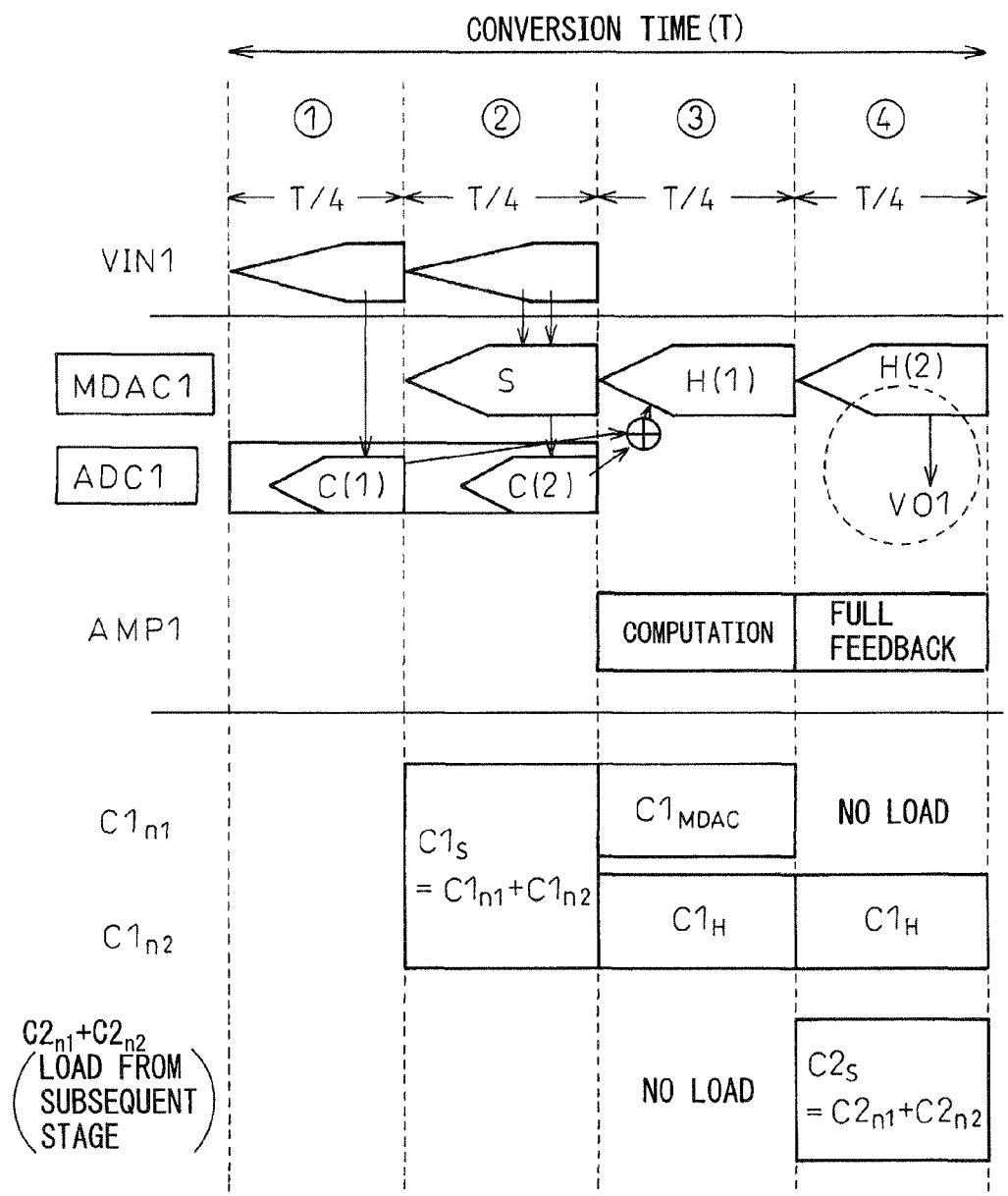
FIG. 15B is a timing chart (part 2) for explaining the STAGE circuit of the third embodiment and its operation.

As illustrated in FIG. 15A and FIG. 15B, the MDAC according to the third embodiment is characterized in that, in the period (1), the MDAC1 is not used but the ADC1 is used, while on the other hand, the MDAC2 performs computation (H). The purpose of using the ADC1 in the period (1) is, for example, to compare the input voltage VIN (the compare voltage $C_{CMP}$) with the reference voltage (¼)*VR and output the result to the flip-flop DFF1.

Next, in the period (2), the ADC1 is used and the MDAC1 performs sampling (S), while the MDAC2 performs computation. The purpose of using the ADC1 in the period (2) is, for example, to compare the compare voltage $C_{CMP}$ with the reference voltage −(¼)*VR and output the result to the flip-flop DFF2.

That is, in the third embodiment, in the period (1) the ADC1 is used to compare the compare voltage $C_{CMP}$ with the reference voltage (¼)*VR, and in the period (2) the ADC1 is used to compare the compare voltage $C_{CMP}$ with the reference voltage −(¼)*VR. In this way, in the periods (1) and (2), the same comparator is used to compare the compare voltage with the respective reference voltages.

In the period (3), the MDAC2 is not used but the ADC2 is used, while on the other hand, the MDAC1 performs computation. Then, in the period (4), the ADC2 is used, the MDAC1 performs computation, and the MDAC2 performs sampling.

The purpose of using the ADC2 in the periods (3) and (4) is to compare the compare voltage at the subsequent stage with difference reference voltages, and the same comparator is used for this purpose.

As illustrated in FIG. 16A, in the third embodiment, the compare voltage $C_{CMP}$ is applied to one input of the comparator CMP0 in the ADC1, and the reference voltage (¼)*VR or −(¼)*VR, whichever is selected, is applied to the other input via the switch SELADC1 or SELADC2, respectively. Here, the switches SELADC1 and SELADC2 are controlled by signals from the switch control unit SWC1.

As illustrated in FIG. 16A, the MDAC1 (switched capacitor circuit) includes capacitors $C1_{n1}$ and $C1_{n2}$ (two or more internal capacitors), an op amp OP1 (one or more amplifiers), and switches SWS1A/1B/2A/2B, SWH1A/1B, SWH2A/2B, and SWADCIN (two or more internal switches).

Figure 16B:
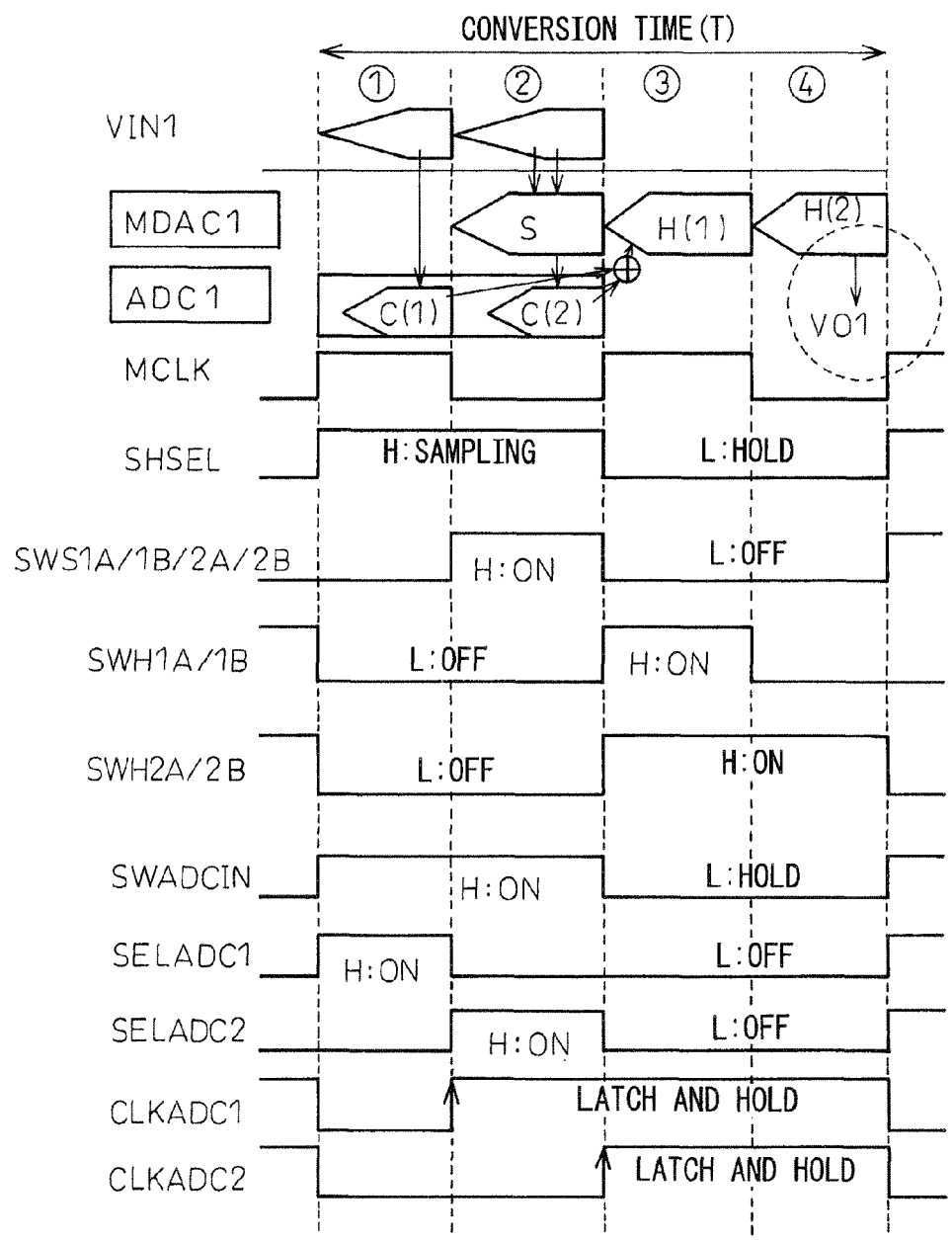
FIG. 16B is a timing chart for explaining the operation of the STAGE circuit of FIG. 16A.

In the period (1) of FIG. 16B, the switch control unit SWC1 sets the control signals for the switches SWS1A/1B/2A/2B, SWH1A/1B, SWH2A/2B, and SELADC2 to "L", causing these switches to turn off, and sets the control signals for the switches SWADCIN and SELADC1 to "H", causing these switches to turn on.

As a result, the compare voltage $C_{CMP}$ (the input voltage VIN) and the reference voltage (¼)*VR selected via the switch SELADC1 are applied to the comparator CMP0 which then compare these voltages and outputs the result of the comparison. Here, the signals CLKADC1 and CLKADC2 are both "L", so that the flip-flops DFF1 and DFF2 are disabled.

Next, in the period (2) of FIG. 16B, the switch control unit SWC1 sets the control signals for the switches SWS1A/1B/2A/2B and SELADC2 to "H", causing these switches to turn on, and sets the control signal for the switch SELADC1 to "L", causing the switch SELADC1 to turn off. The other switches are each held in the same state as in the period (1).

In the period (2), the signal CLKADC1 changes from "L" to "H", so that the flip-flop DFF1 is enabled to latch and hold the result of the comparison made between the compare voltage $C_{CMP}$ and the reference voltage (¼)*VR by the comparator CMP0.

Further, in the period (2), since the switch SELADC1 turns off and the switch SELADC2 turns on, as described above, the comparator CMP0 compares the compare voltage $C_{CMP}$ with the reference voltage −(¼)*VR applied via the switch SELADC2.

Next, in the period (3) of FIG. 16B, the switch control unit SWC1 sets the control signals for the switches SWS1A/1B/2A/2B, SWADCIN, and SELADC2 to "L", causing these switches to turn off, and sets the control signals for the switches SWH1A/1B and SWH2A/2B to "H", causing these switches to turn on.

In the period (3), the signal CLKADC2 changes from "L" to "H", so that the flip-flop DFF2 is enabled to latch and hold the result of the comparison made between the compare voltage $C_{CMP}$ and the reference voltage −(¼)*VR by the comparator CMP0.

As a result, the result of the comparison between the compare voltage $C_{CMP}$ and the reference voltage (¼)*VR, held in the flip-flop DFF1, and the result of the comparison between the compare voltage $C_{CMP}$ and the reference voltage −(¼)

*VR, held in the flip-flop DFF2, are supplied to the logic unit LO1 which performs a prescribed logic operation between them.

Then, in the period (4) of FIG. 16B, the switch control unit SWC1 sets the control signal for the switches SWH1A/1B from "H" to "L" to turn off the switches SWH1A/1B. In other respects, the operation in each of the periods (1) to (4) is apparent from the description given in the first and second embodiments, and therefore will not be further described herein.

Thus, according to the third embodiment, it becomes possible to reduce the amount of hardware by making provisions to share the same comparator for the operation of the ADC1.

FIG. 17 is a diagram depicting the number of comparators of the sub-ADC needed in the stage of the third embodiment for comparison with the number of comparators needed in each of the MDACs depicted in FIG. 3A and FIG. 4A.

As illustrated in FIG. 17, in the case of the signal amplification factor m=2 (1.5bMDAC), the comparators CMP1 and CMP2 in the ADC (ADC1) may be replaced by one common comparator CMP0, thus halving the number of comparators.

Further, in the case of the signal amplification factor m=4 (2.5bMDAC), the number of comparators CMP11 to CMP16 (six comparators) in FIG. 14, for example, may be reduced by one half, i.e., to three, when the third embodiment is applied.

The examples given in FIG. 17 are only illustrative and not restrictive, and it is to be understood that the effect of reducing the number of comparators becomes greater as the signal amplification factor, m, (the number of bits) becomes larger.

Figure 18A:
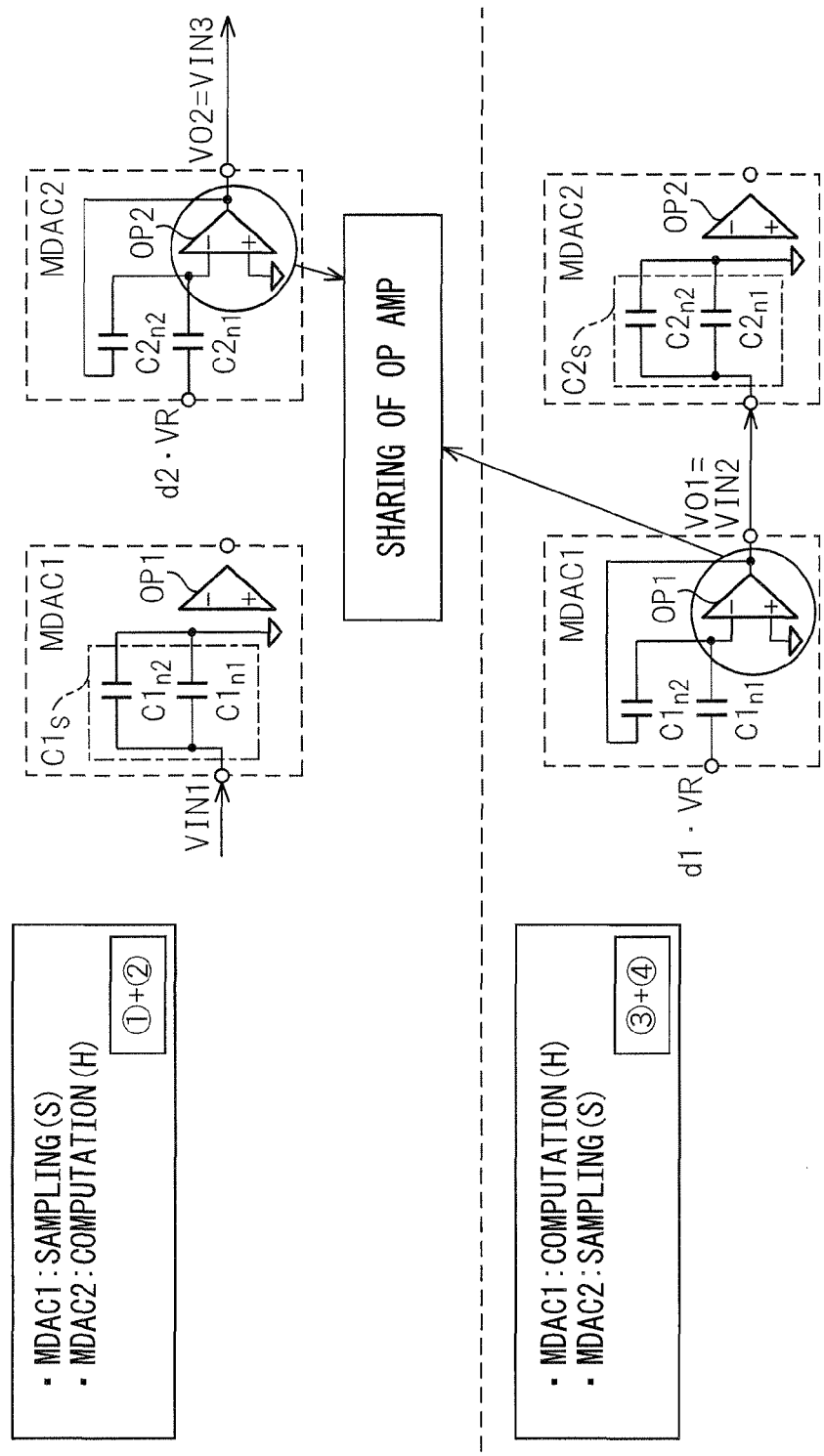
FIG. 18A is a diagram (part 1) for explaining another example of the MDAC and its operation.
Figure 18B:
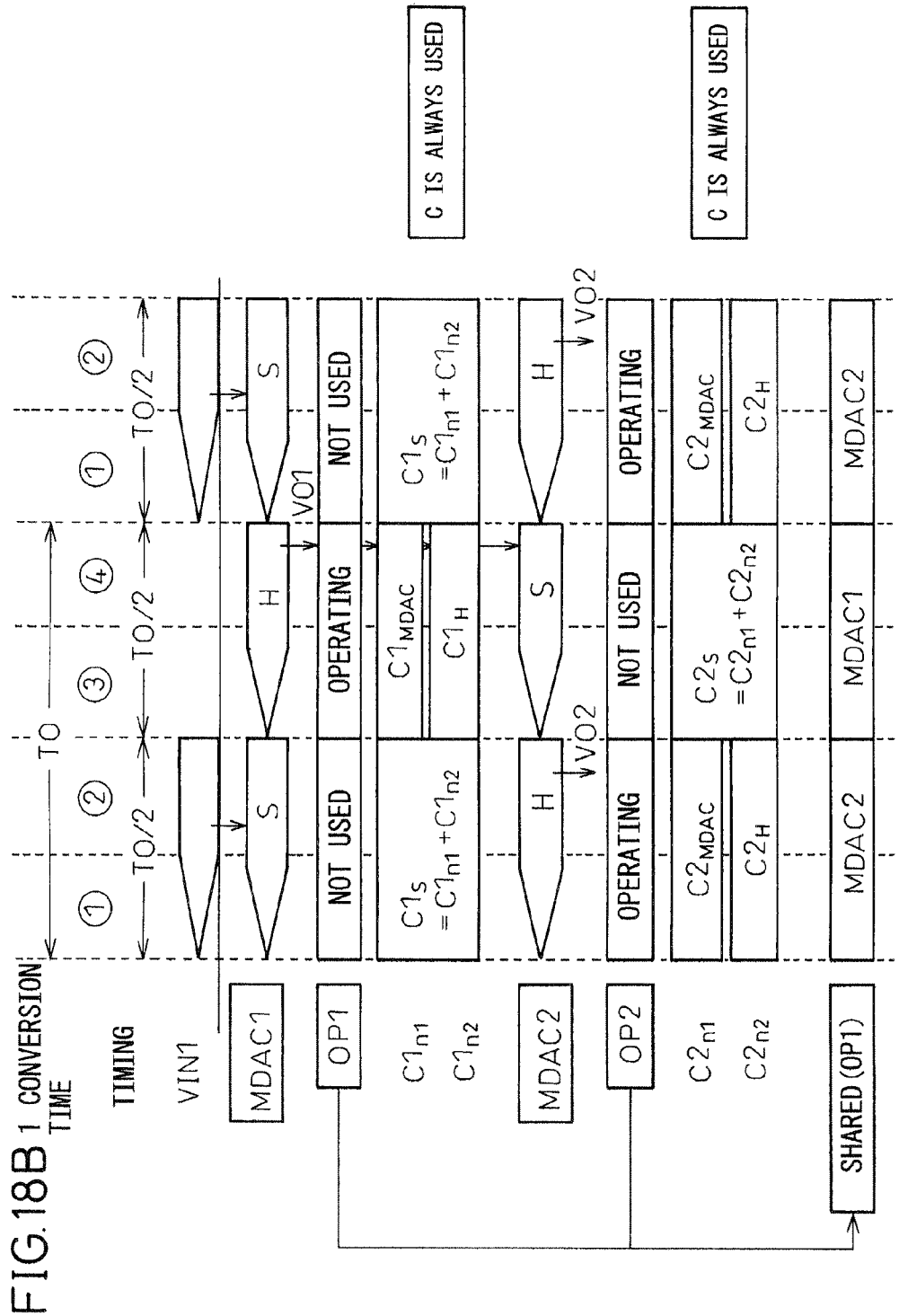
FIG. 18B is a diagram (part 2) for explaining that other example of the MDAC and its operation.

FIG. 18A and FIG. 18B are diagrams for explaining another example of the MDAC and its operation; in the illustrated MDAC configuration, provisions are made to share one common op amp in order to reduce the footprint and power consumption of a pipelined AD conversion circuit.

In the drawings hereinafter described, the earlier described sub-AD converts ADC1 and ADC2 are not depicted since they are not directly relevant to the fourth and fifth embodiments.

As is apparent by comparing FIG. 18A and FIG. 18B with FIG. 2A and FIG. 2B, the MDAC configuration depicted in FIG. 18A and FIG. 18B is characterized in that the op amps OP1 and OP2 in the MDACs depicted in FIG. 2A and FIG. 2B are substituted by one common op amp (OP1).

That is, in the MDAC1, the op amp is not needed in the sampling mode (the period (1)+(2): S) that samples the input voltage VIN, but is needed only in the hold mode (the period (3)+(4): H) that performs computation.

On the other hand, the MDAC2 which operates 180 degrees out of phase with the MDAC1, the op amp is not needed in the sampling mode (the period (3)+(4): S) that samples the input voltage (the output voltage VO1=VIN2 of the MDAC1 at the preceding stage). The op amp is used only in the hold mode (the period (1)+(2): H) that performs computation.

In view of the fact that the period in which the op amp is needed differs between the MDAC1 and the MDAC2, the op amp (OP1) is used as the op amp 2 for the MDAC2 during the period (1)+(2), and the op amp OP1 is used as the op amp 1 for the MDAC1 during the period (3)+(4). In like manner, the comparators in the sub-AD converts ADC1 and ADC2 not depicted may also be substituted by one common comparator.

However, the capacitors in the respective MDACs (the computation capacitor $C1_{n1}$, $C1_{n2}$ in the MDAC1 and the computation capacitor $C2_{n1}$, $C2_{n2}$ in the MDAC2) need to be provided separately, and it is therefore not possible to share the same capacitor between them.

Figure 19A:
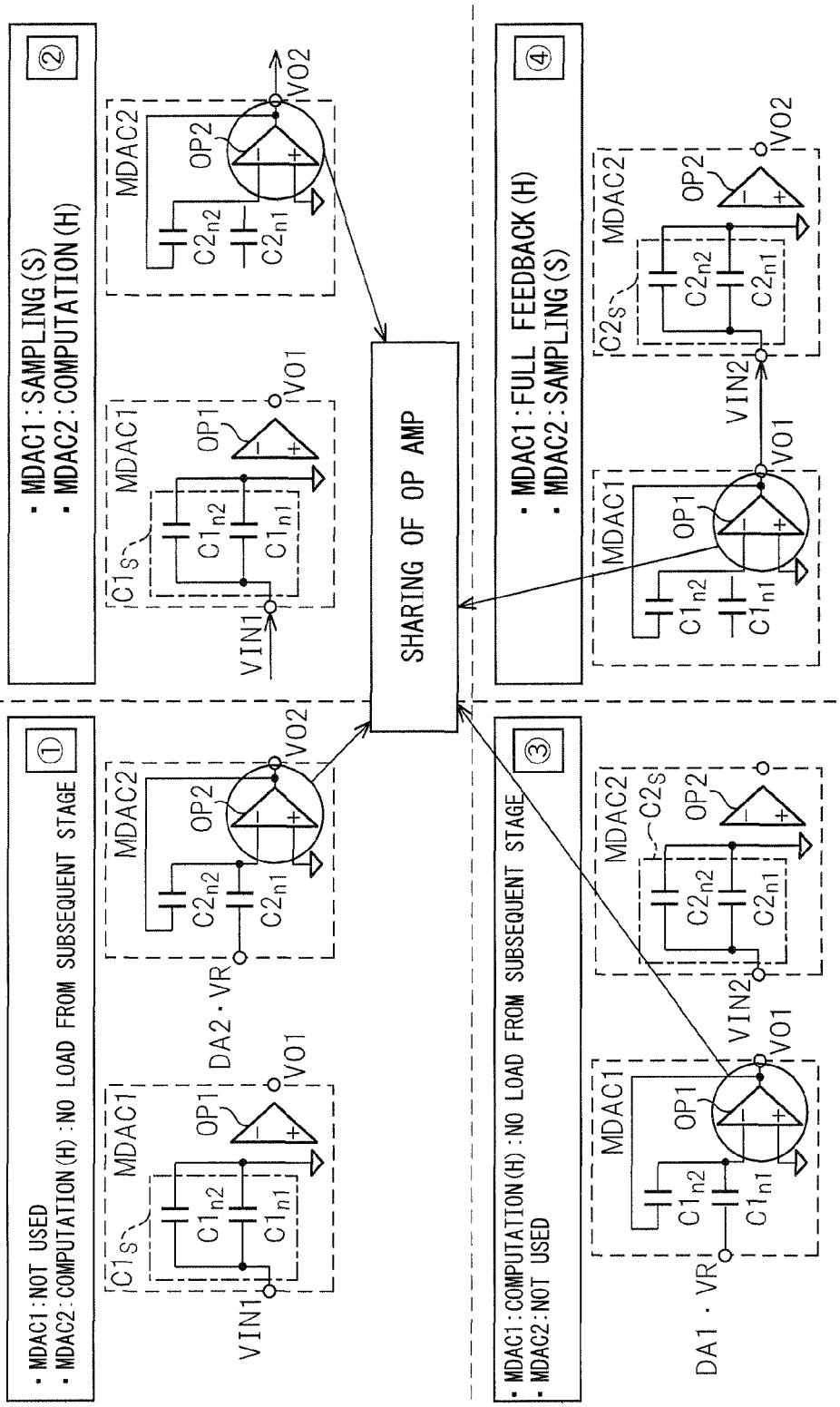
FIG. 19A is a diagram (part 1) for explaining the MDAC of the earlier described first embodiment and its operation.
Figure 19B:
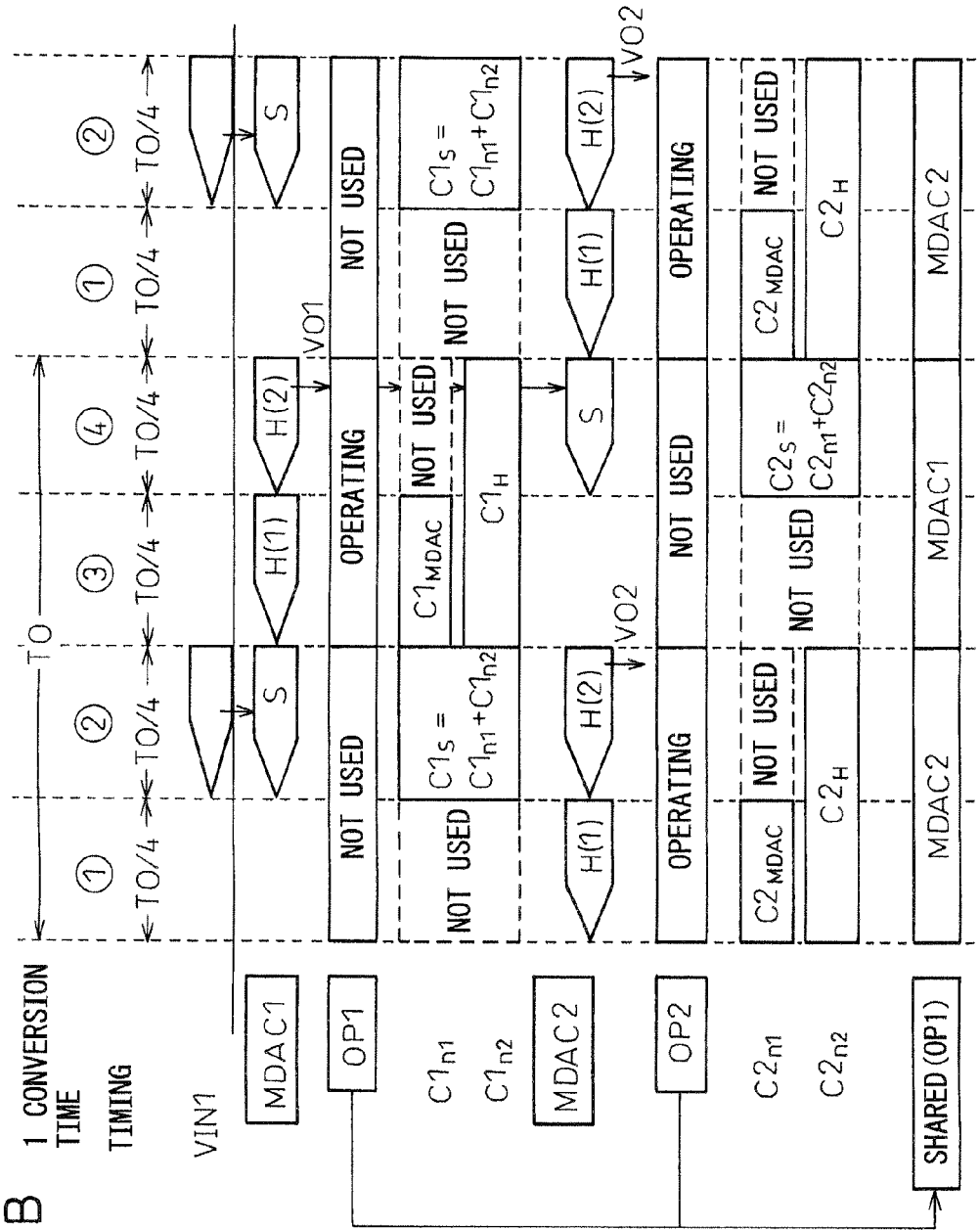
FIG. 19B is a diagram (part 2) for explaining the MDAC of the earlier described first embodiment and its operation.

FIG. 19A and FIG. 19B are diagrams for explaining the MDAC of the earlier described first embodiment and its operation.

As illustrated in FIG. 19A and FIG. 19B, it is possible to share one op amp (OP1) between adjacent MDACs (for example, between the MDAC1 and the MDAC2) even in the case of the MDAC of the first embodiment such as depicted, for example, in FIG. 9A.

Further, as earlier described with reference to FIG. 15A, FIG. 15B, FIG. 16A, FIG. 16B, and FIG. 17, in the MDAC of the third embodiment, it has been possible to reduce the number of comparators by taking advantage of the fact that the computation result of the MDAC is output twice (H(1) and H(2)).

Here, as illustrated in FIG. 19A and FIG. 193, $C1_{n1}$ is not used in the periods (1) and (4), $C1_{n2}$ is not used in the period (1), $C2_{n1}$ is not used in the periods (2) and (3), and $C2_{n2}$ is not used in the period (3).

In the MDACs of the fourth and fifth embodiments to be described later, the capacitors are also shared by utilizing the periods in which the respective capacitors in the MDACs ($C1_{n1}$ and $C1_{n2}$ in the MDAC1 and $C2_{n1}$ and $C2_{n2}$ in the MDAC2) are not used.

For the MDAC circuit configuration, more specifically, in the case of the 1.5bMDAC, for example, two types of circuit configuration are possible, that is, the first configuration example (type I) and the second configuration example (type II).

Figure 20A:
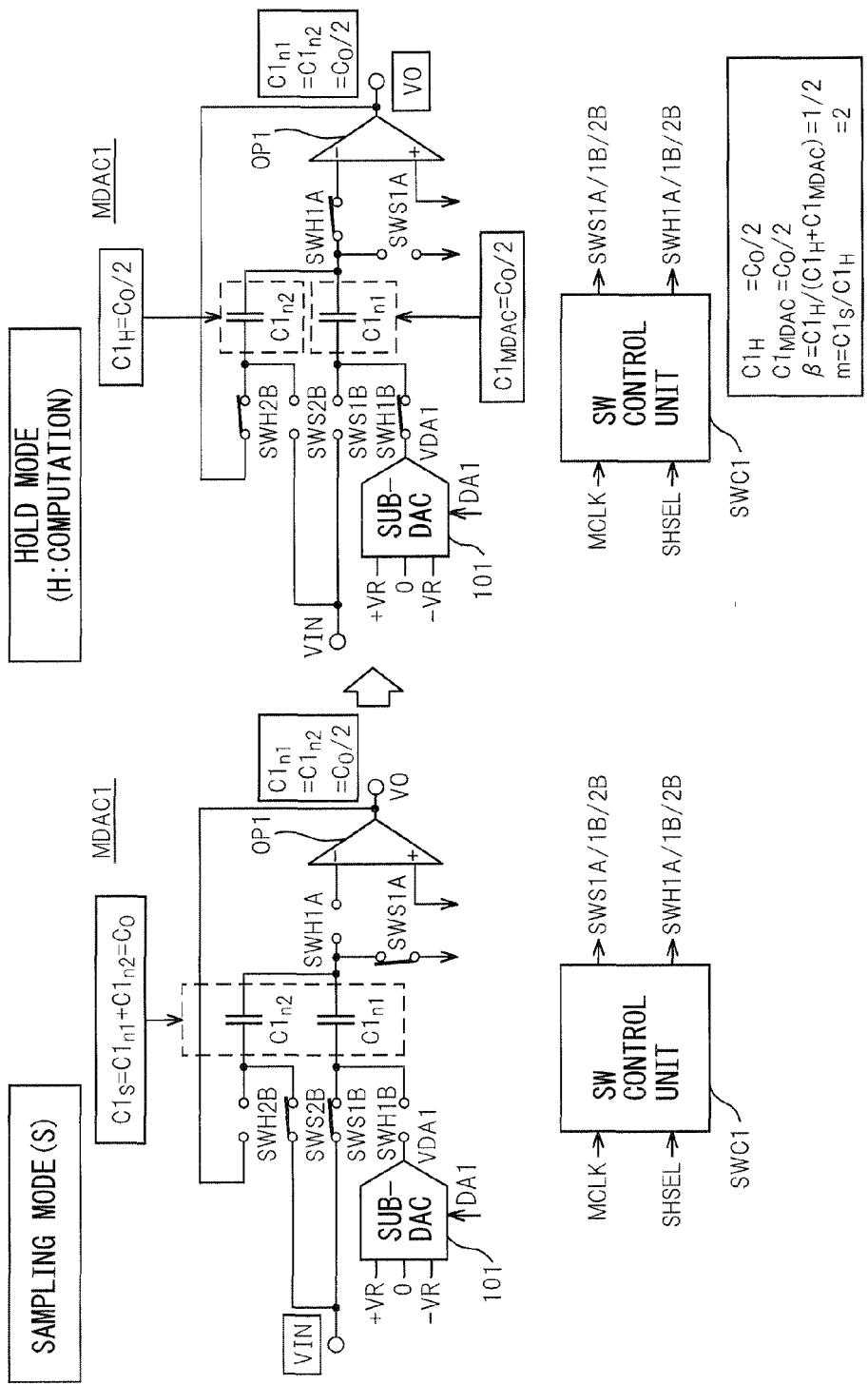
FIG. 20A is a circuit diagram illustrating a first configuration example of the 1.5bMDAC in sampling mode and in hold mode, respectively.
Figure 20B:
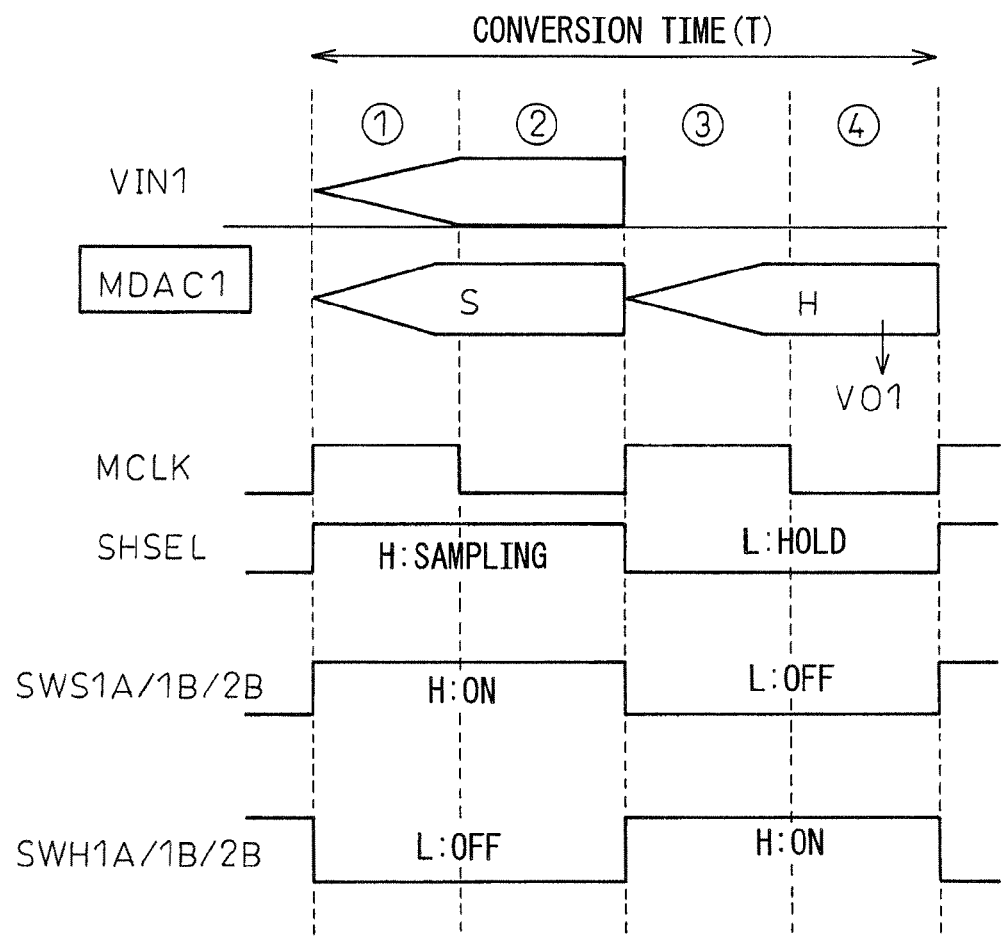
FIG. 20B is a diagram (part 1) for explaining the operation of the MDAC of FIG. 20A.
Figure 20C:
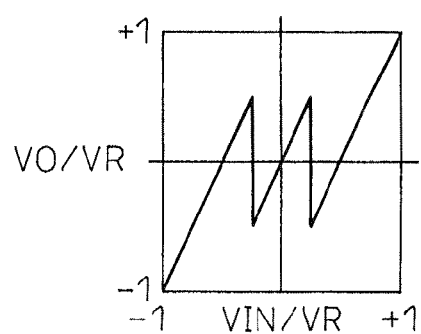
FIG. 20C is a diagram (part 2) for explaining the operation of the MDAC of FIG. 20A.

FIG. 20A is a circuit diagram illustrating the first configuration example (type I) of the 1.5bMDAC in sampling mode and in hold mode, respectively, and FIG. 20B, FIG. 20O, and FIG. 20D are diagrams for explaining the operation of the MDAC of FIG. 20A.

Figure 21A:
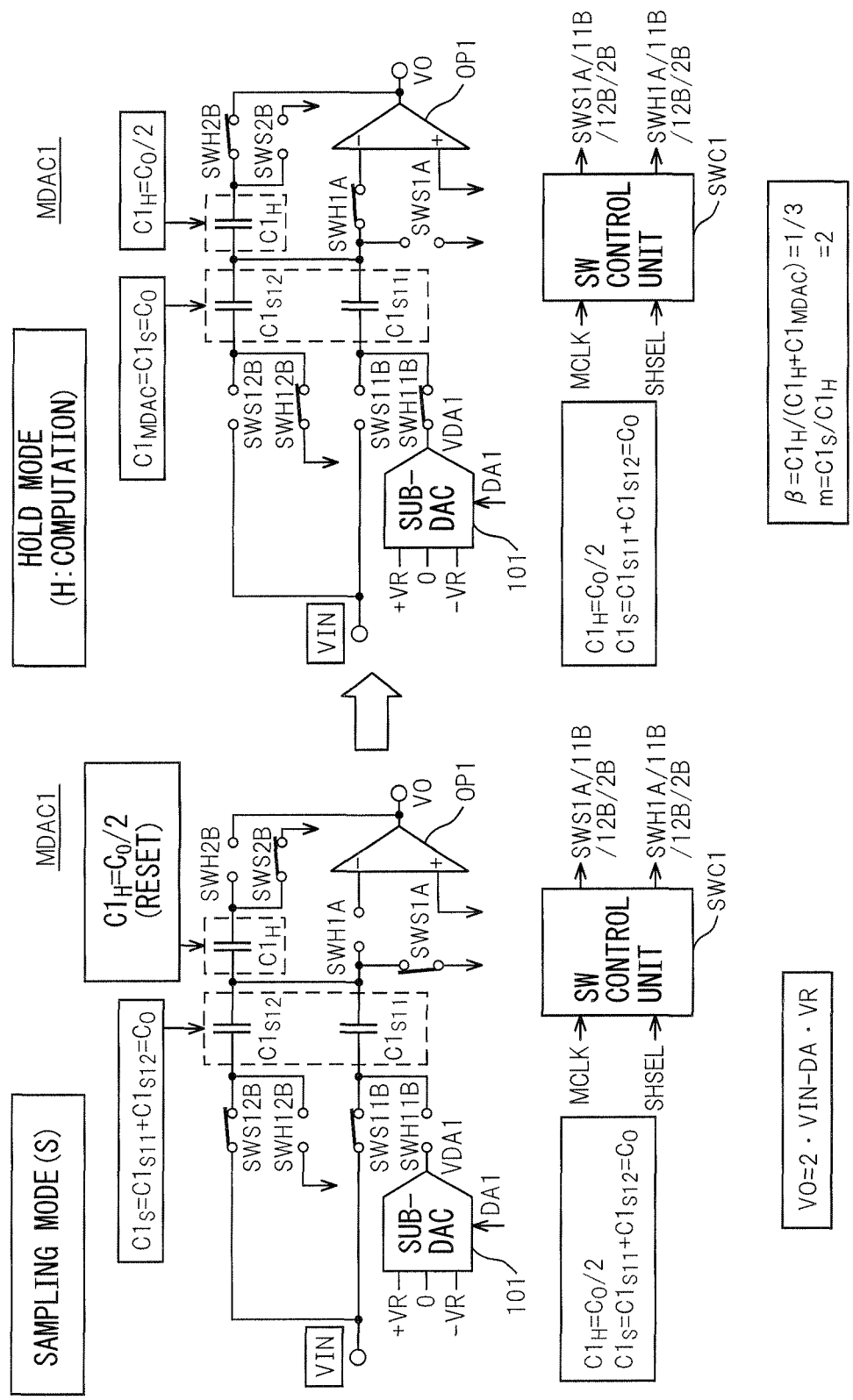
FIG. 21A is a circuit diagram illustrating a second configuration example of the 1.5bMDAC in sampling mode and in hold mode, respectively.
Figure 21B:
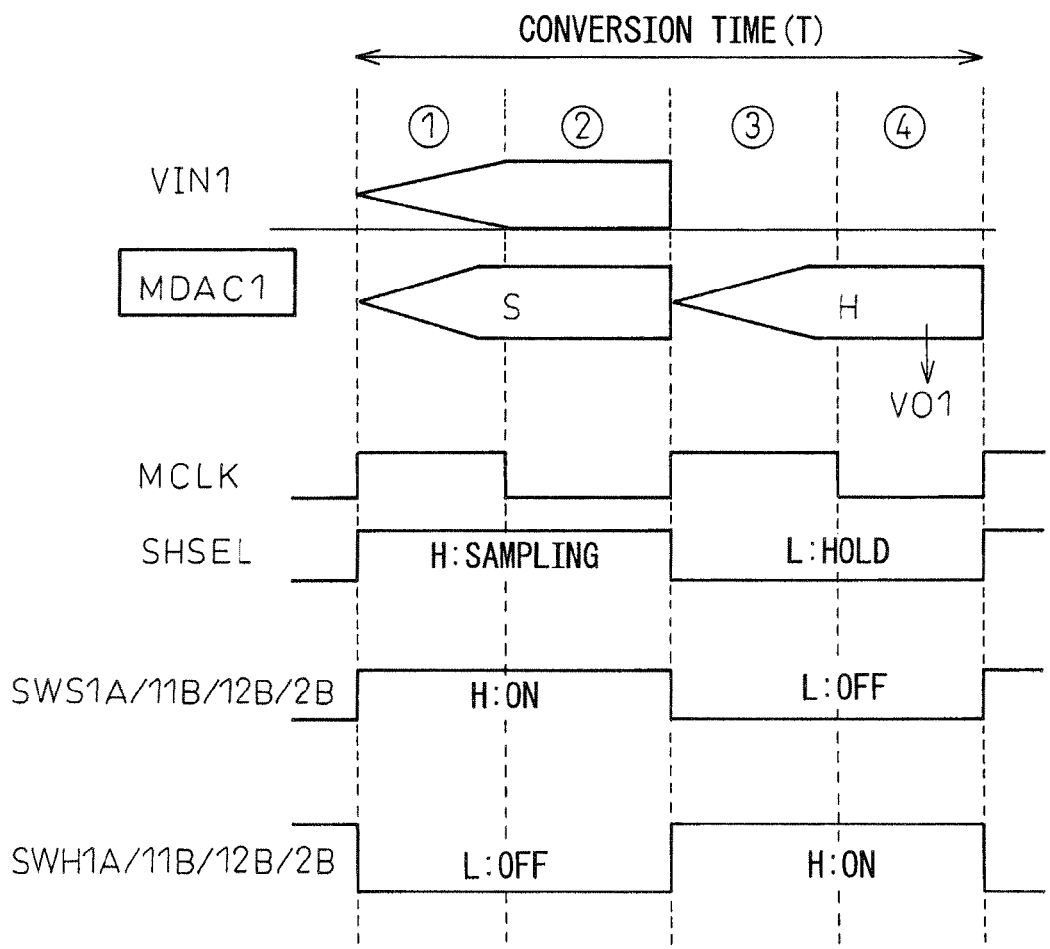
FIG. 21B is a diagram (part 1) for explaining the operation of the MDAC of FIG. 21A.
Figure 21C:
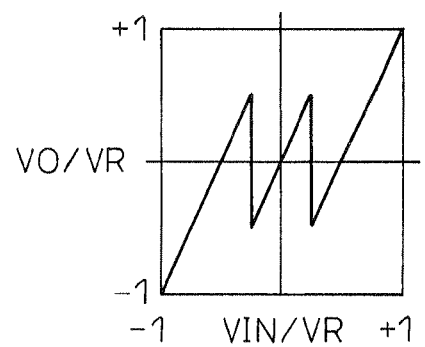
FIG. 21C is a diagram (part 2) for explaining the operation of the MDAC of FIG. 21A.

On the other hand, FIG. 21A is a circuit diagram illustrating the second configuration example (type II) of the 1.5bMDAC in sampling mode and in hold mode, respectively, and FIG. 21B, FIG. 21C, and FIG. 21D are diagrams for explaining the operation of the MDAC of FIG. 21A.

Here, FIG. 20A, FIG. 203, FIG. 20C, and FIG. 20D correspond to the previously described FIG. 3A, FIG. 3B, FIG. 3C, and FIG. 3D, except that the signals associated with the ADC1 (sub-AD converter) in the MDAC1 in FIG. 3A, FIG. 3B, FIG. 3C, and FIG. 3D are omitted.

The MDACs of the first to third embodiments illustrated in FIG. 8A, FIG. 8B, FIG. 9A, FIG. 9B, FIG. 10A, FIG. 10B, FIG. 12, FIG. 13A, FIG. 13B, FIG. 14A, FIG. 143, FIG. 15A, FIG. 153, FIG. 16A, FIG. 16B, and FIG. 17 are each based on the type I circuit, but it is also possible to apply the MDACs of the first to third embodiments to the type II circuit.

First, as illustrated in FIG. 20A, FIG. 203, FIG. 20C, and FIG. 20D, that is, as previously described with reference to FIG. 3A, FIG. 3B, FIG. 3C, and FIG. 3D, the relations $C1_s=C1_{n1}+C1_{n2}=C_0$, $C1_H=C_0/2$, and $C1_{MDAC}=C_0/2$ hold in the 1.5bMDAC1 of the type I illustrated in FIG. 20A. Here, the feedback ratio β is $β=C1_H/(C1_H+C1_{MDAC})=\frac{1}{2}$, and the signal amplification factor, m, is $m=C1_s/C1_H=2$.

On the other hand, the relations $C1_s=C1_{s11}+C1_{s12}=C_0$, $C1_H=C_0/2$, and $C1_{MDAC}=C1_s=C_0$ hold in the 1.5bMDAC1 of the type II illustrated in FIG. 21A. Here, the feedback ratio β is $β=C1_H/C1_H+C1_{MDAC})=\frac{1}{3}$, and the signal amplification factor, m, is $m=C1_s/C1_H=2$.

More specifically, as illustrated in the left half of FIG. 21A and in the periods (1) and (2) ((1)+(2)) of FIG. 21B, in the sampling (S) mode of the MDAC1 the switch control unit SWC1 sets the control signal for the switches SWS1A/11B/2A/12B to a high level "H", causing these switches to turn on.

Further, in the sampling mode of the MDAC1 in the period (1)+(2), the switch control unit SWC1 sets the control signal for the switches SWH1A/11B/12B/2B to a low level "L". This causes the switches SWH1A/11B/12B/2B to turn off.

Here, in the sampling capacitor $C1_s$ on which the MDAC1 samples the input signal VIN, the capacitors $C1_{s11}$ and $C1_{s12}$ are connected in parallel with each other with the switches SWH1A/11B/12B turning on; as a result, the sampling capacitor $C1_s$ is $C1_s=C1_{s11}+C1_{s12}$. Here, if $C1_{s11}=C1_{s12}=C_0/2$, then $C1_s=C1_{s11}+C1_{s12}=C_0$, as earlier described.

Next, as illustrated in the right half of FIG. 21A and in the periods (3) and (4) ((3)+(4)) of FIG. 21B, in the hold (H: computation) mode of the MDAC1 the switch control unit SWC1 sets the control signal for the switches SWS1A/11B/12B/2B to "L", causing these switches to turn off.

Further, in the hold mode in the period (3)+(4), the switch control unit SWC1 sets the control signal for the switches SWH1A/11B/12B/2B to "H". This causes the switches SWH1A/113/123/23 to turn on.

As a result, as earlier described, the hold capacitor $C1_H$ and the computation capacitor $C1_{MDAC}$ are $C1_H=C_0/2$ and $C1_{MDAC}=C1_s=C_0$, respectively, the feedback ratio β is $β=C1_H/(C1_H+C1_{MDAC})=1/3$, and the signal amplification factor, m, is $m=C1_s/C1_H=2$.

When the signal amplification is m=2, the relation depicted in FIG. 21C holds between VIN/VR and VO/VR; on the other hand, the input voltage VIN (the compare voltage $V_{CMP}$), the digital output DO, the add/subtract coefficient DA1, the output voltage VDA1 of the sub-DAC 101, and the output voltage VO of the op amp OP1 are as depicted in FIG. 21D. Here, FIG. 21C and FIG. 21D are the same as the earlier given FIG. 20C and FIG. 20D, respectively.

Figure 22A:
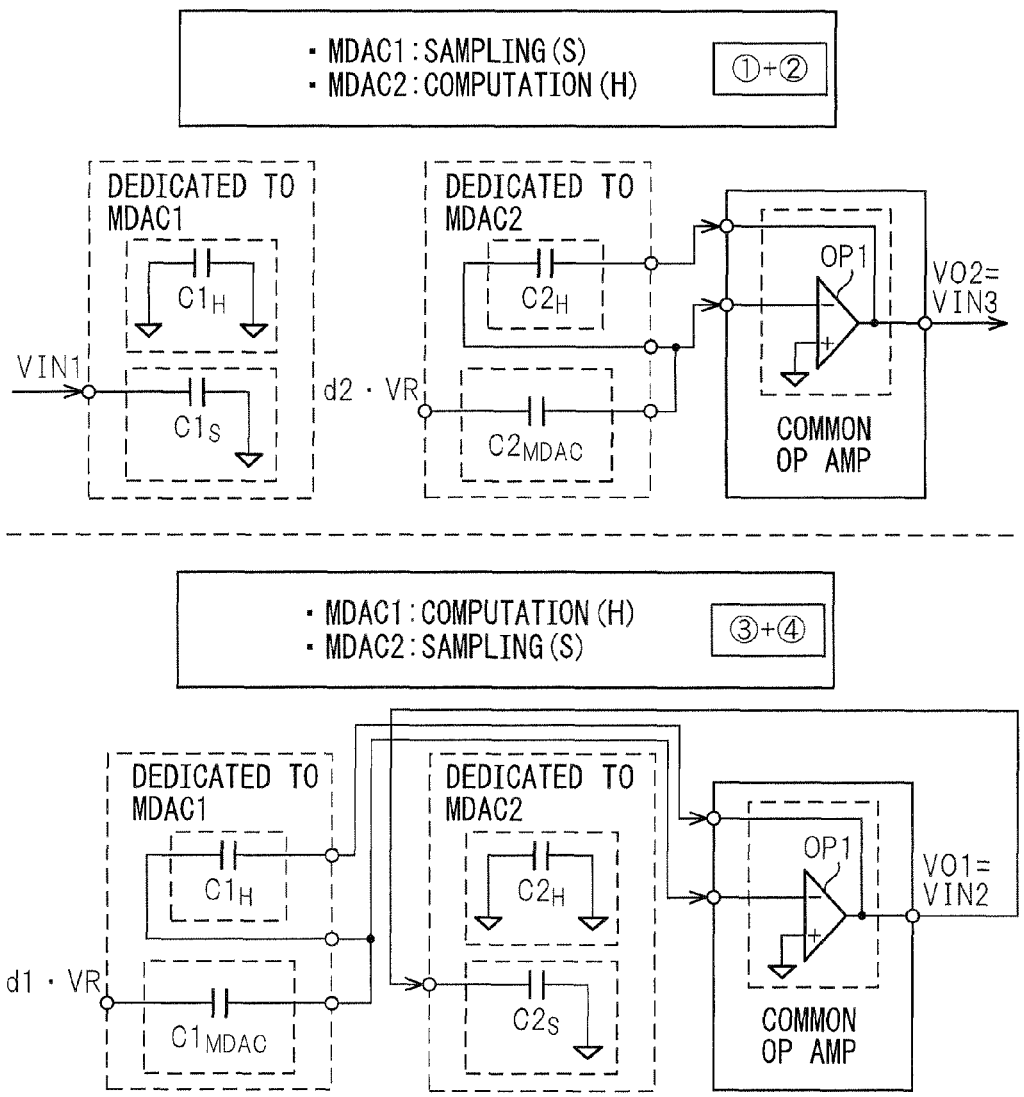
FIG. 22A is a diagram (part 1) for explaining the basic operation of the MDAC of the second configuration example.
Figure 22B:
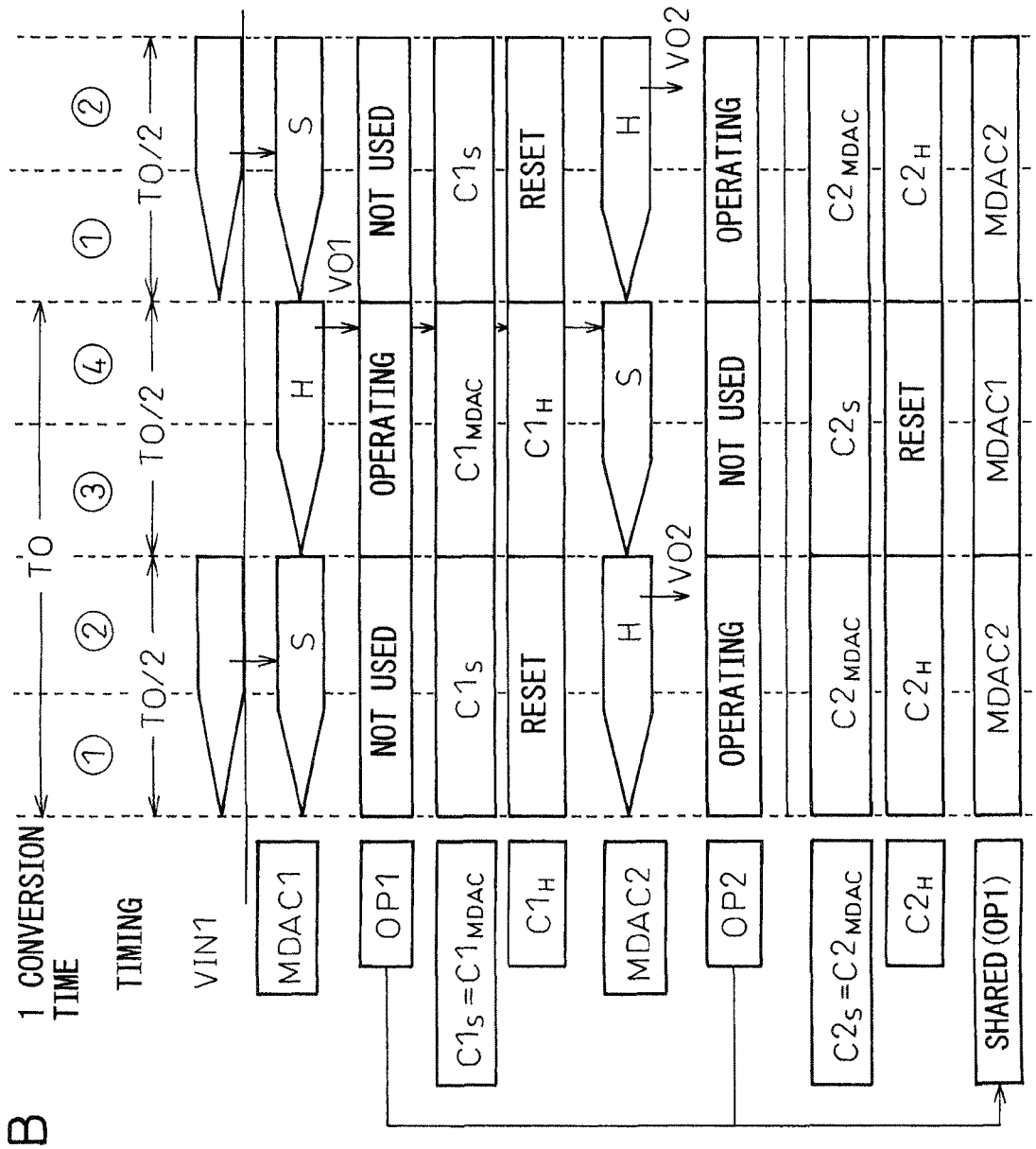
FIG. 22B is a diagram (part 2) for explaining the basic operation of the MDAC of the second configuration example.

FIG. 22A and FIG. 22B are diagrams for explaining the basic operation of the MDAC of the second configuration example (type II); the above-described FIG. 21A and FIG. 21B are redrawn here in an easier to understand manner. In the MDAC configuration depicted in FIG. 22A, one common op amp (OP1) is shared between two MDACs (MDAC1 and MDAC2).

To simplify the explanation, $C1_s=C1_{MDAC}=C_0$, $C1_H=C_0/m$, $C2_s=C2_{MDAC}=C_0/m$, and $C2_H=C_0/m$. Here, m represents the signal amplification factor.

First, as illustrated in the top half of FIG. 22A and in the period (1)+(2) of FIG. 22B, when the MDAC1 is in the sampling (S) mode and the MDAC2 in the computation (H) mode, the op amp (OP1) in the MDAC1 is not used, but the op amp (OP2) in the MDAC2 is used (operating).

Further, in the period (1)+(2), the capacitor $C1_s$ in the MDAC1 and the capacitors $C2_{MDAC}$ and $C2_H$ in the MDAC2 are used, while the capacitor $C1_H$ in the MDAC1 is reset.

On the other hand, as illustrated in the bottom half of FIG. 22A and in the period (3)+(4) of FIG. 22B, when the MDAC1 is in the computation mode and the MDAC2 in the sampling mode, the op amp (OP1) in the MDAC1 is used, but the op amp (OP2) in the MDAC2 is not used.

Further, in the period (3)+(4), the capacitors $C1_{MDAC}$ and $C1_H$ in the MDAC1 and the capacitor C2, in the MDAC2 are used, while the capacitor $C2_H$ in the MDAC2 is reset.

In view of the above, the op amp (OP1: common op amp) is shared between the two MDACs (MDAC1 and MDAC2). However, in the MDAC configuration of FIG. 22A and FIG. 22B, it is not possible to share the capacitors between the MDAC1 and the MDAC2.

In the fourth and fifth embodiments hereinafter described, the same capacitor is shared between the MDAC1 and the MDAC2 in order to further reduce the footprint of the switched capacitor circuit or AD conversion circuit.

Figure 23A:
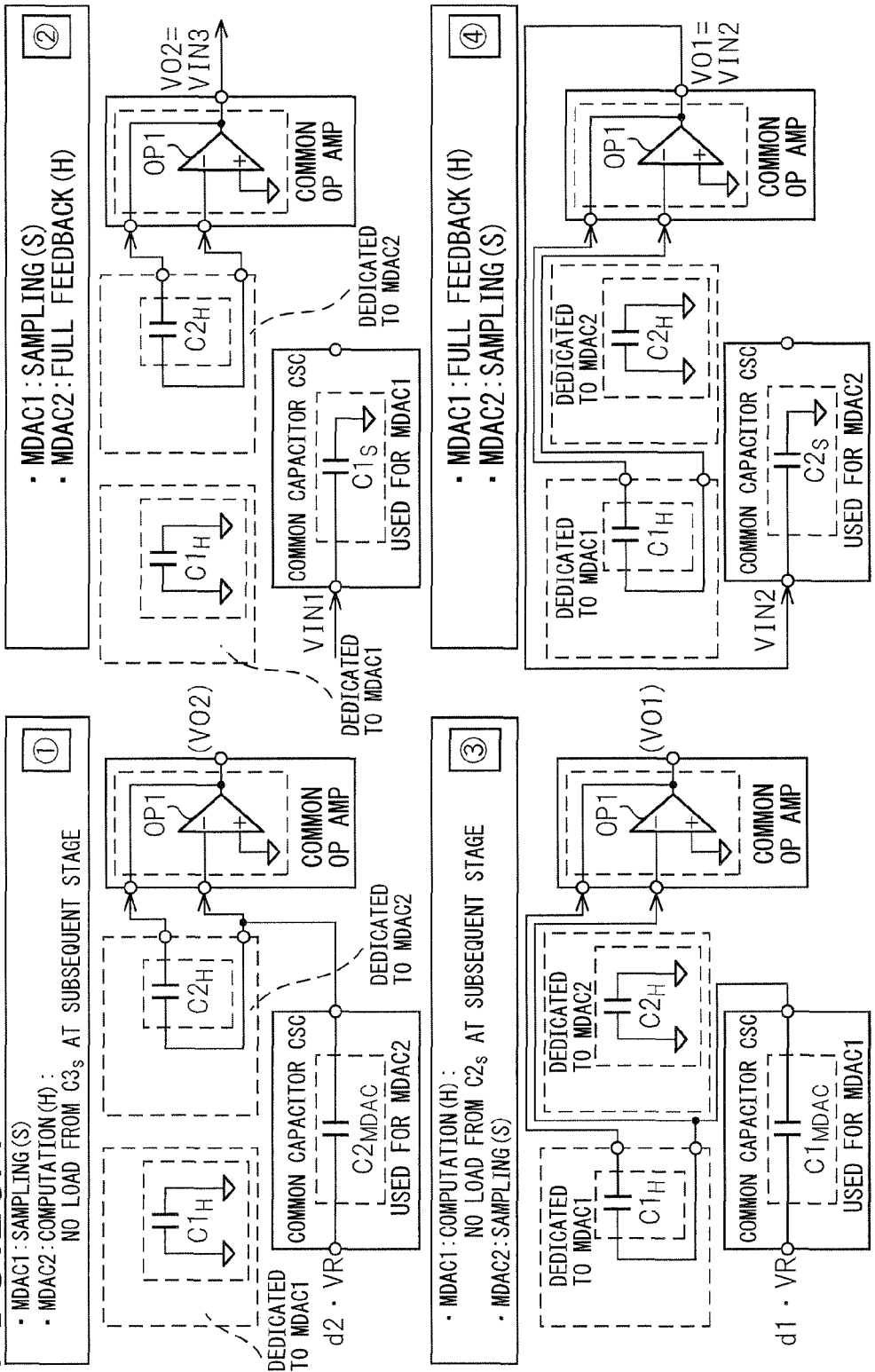
FIG. 23A is a diagram (part 1) for explaining an MDAC according to a fourth embodiment and its operation.

FIG. 23A and FIG. 238 are diagrams for explaining the MDAC of the fourth embodiment and its operation. The MDAC of the fourth embodiment is a MDAC of the second configuration example (type II), and is controlled by dividing the conversion time T into four periods (1) to (4), as in the case of the MDACs of the earlier described first to third embodiments.

First, as is apparent from a comparison between FIG. 23A and the above-described FIG. 22A, in the MDAC configuration according to the fourth embodiment, not only the op amp (OP1: common op amp) but also the capacitor (CSC: common capacitor) is shared between the two MDACs (MDAC1 and MDAC2).

Figure 23B:
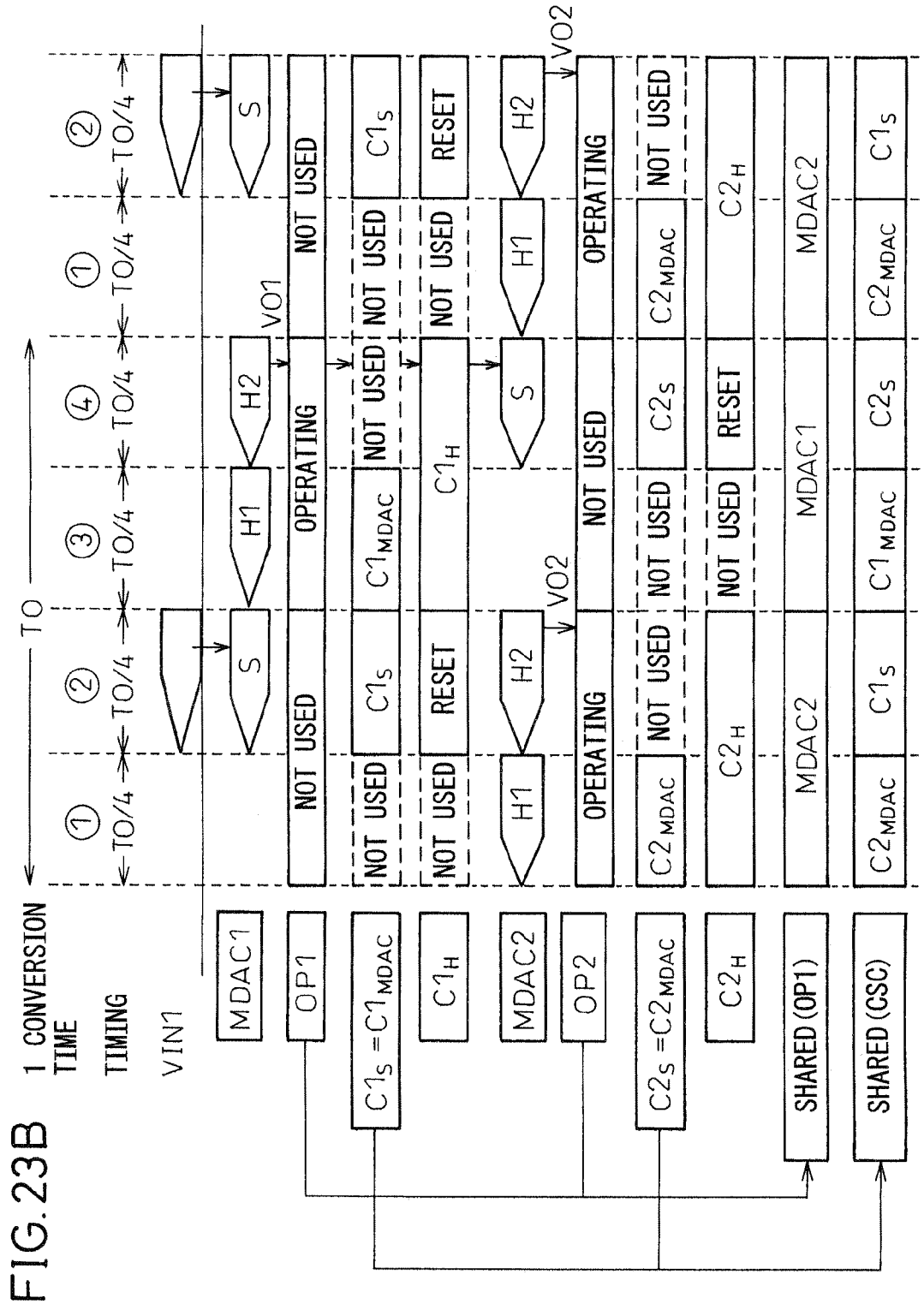
FIG. 23B is a diagram (part 2) for explaining the MDAC of the fourth embodiment and its operation.

That is, as illustrated in FIG. 23A and FIG. 23B, the capacitor CSC is used as $C2_{MDAC}$ in the period (1), as $C1_s$ in the period (2), as $C1_{MDAC}$ in the period (3), and as $C2_s$ in the period (4).

As is apparent from FIG. 23A and FIG. 238, the hold capacitors $C1_H$ and $C2_H$ need to be provided exclusively for the MDAC1 and the MDAC2, respectively, but the sampling capacitors $C1_s$ and $C2_s$ and computation capacitors $C1_{MDAC}$ and $C2_{MDAC}$ in the MDAC1 and MDAC2 may be replaced by one common capacitor.

In the MDAC of the fourth embodiment, the op amp (common op amp OP1) is shared between the MDAC1 and the MDAC2 in the same manner as earlier described with reference to FIG. 22A and FIG. 223.

In the case of a pipelined AD conversion circuit constructed by cascading a plurality of MDACs, the value of the sampling capacitor in the MDAC at the subsequent stage (for example, the capacitor $C2_s$ in the MDAC2) may be made smaller than the value of the sampling capacitor in the MDAC at its preceding stage (for example, the capacitor $C1_s$ in the MDAC1). That is, the sampling capacitor ($C2_s$) in the MDAC at the subsequent stage may be formed using a portion of the sampling capacitor ($C1_s$) in the MDAC at its preceding stage.

Figure 24A:
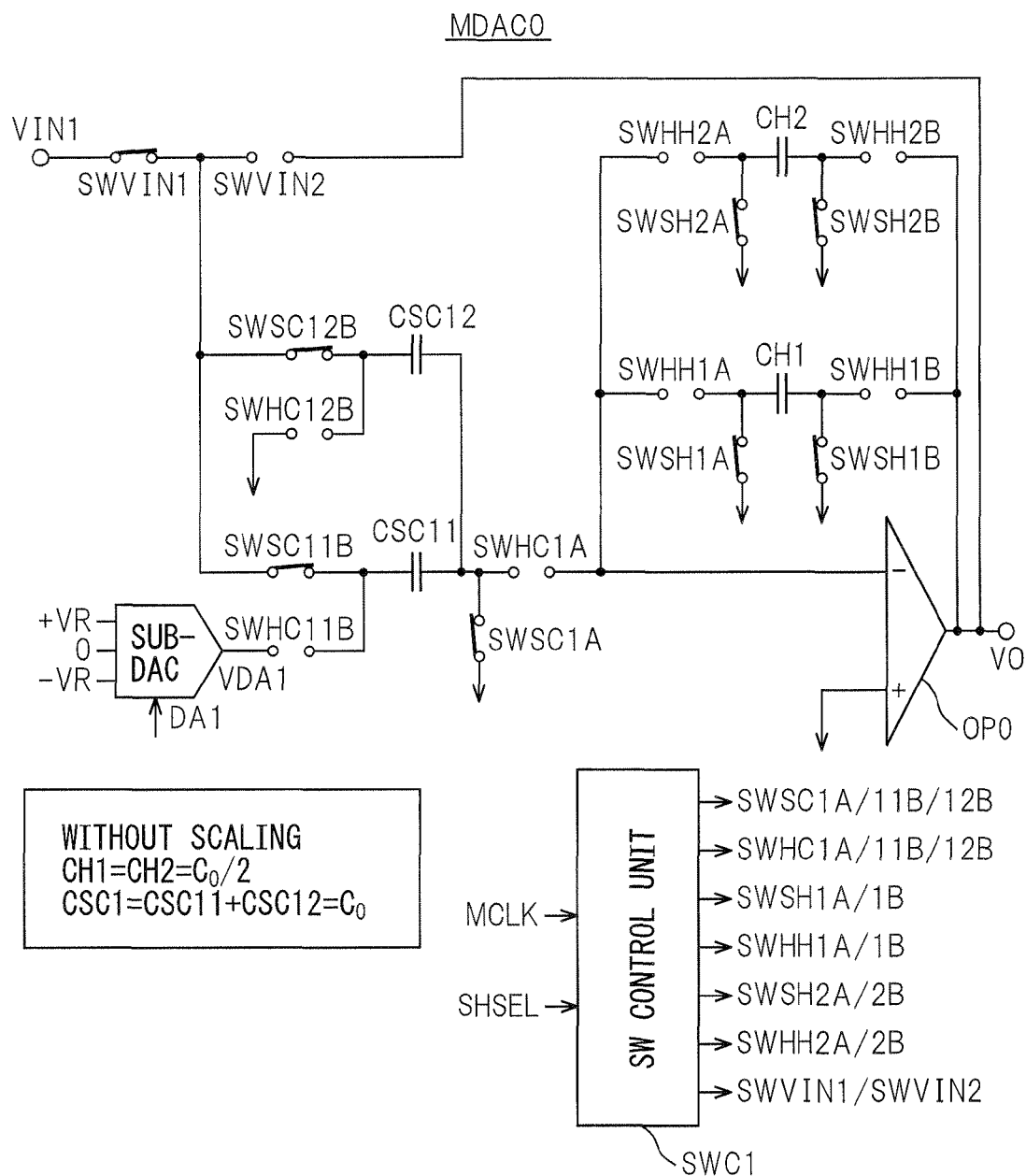
FIG. 24A is a circuit diagram illustrating one example of the MDAC of the fourth embodiment.

FIG. 24A is a circuit diagram illustrating one example of the MDAC of the fourth embodiment, and FIG. 24B is a diagram for explaining the operation of the MDAC of FIG. 24A.

In FIG. 24A, reference characters CSC11 and CSC12 designate the common capacitor (CSC) shared for use, while CH1 designates the hold capacitor ($C1_H$) when used for the first MDAC (MDAC1) and CH2 designates the hold capacitor ($C2_H$) when used for the second MDAC (MDAC2).

In the description of the MDAC of the fourth embodiment, $CH1=CH2=C_0/2$ and $CSC1=CSC11+CSC12=C_0$, assuming the case of no scaling.

As illustrated in FIG. 24A, the MDAC0 (switched capacitor circuit) includes the capacitors CH1, CH2, CSC 11, and CSC12 (two or more internal capacitors) and the op amp OP0 (one or more amplifiers). The MDAC0 further includes switches SWVIN1, SWVIN2, SWSC1A/11B/12B, SWHC1A/11B/12B, SWSH1A/1B, SWHH1A/1B, SWSH2A/2B, and SWHH2A/2B (two or more internal switches).

First, in the period (1) of FIG. 24B, the switch control unit SWC1 sets the control signals for the switches SWVIN1, SWHC1A/11B/12B, and SWHH2A/2B to a high level "H", causing these switches to turn on.

Further, in the period (1), the switch control unit SWC1 sets the control signals for the switches SWVIN2, SWSC1A/11B/12B, SWSH1A/1B, SWHH1A/1B, and SWSH2A/2B to a low level "L", causing these switches to turn off.

As a result, in the MDAC0, the capacitor CSC11 acts as the computation capacitor $C2_{MDAC}$ for the second MDAC (MDAC2), as illustrated in the period (1) of FIG. 23A. On the other hand, the capacitor CH2 is connected so as to act as the hold capacitor $C2_H$ for the second MDAC (MDAC2).

Next, in the period (2) of FIG. 24B, the switch control unit SWC1 sets the control signals for the switches SWSC1A/11B/12B and SWSH1A/1B to "H", causing these switches to turn on, and sets the control signal for the switches SWHC1A/11B/12B to "L", causing these switches to turn off.

In the period (2), the other switches SWVIN1, SWVIN2, SWHH1A/1B, SWSH2A/2B, and SWHH2A/2B are each held at the same level as in the period (1).

As a result, the capacitors CSC11 and CSC12 act as the sampling capacitor $C1_s$ for the first MDAC (MDAC1), as illustrated in the period (2) of FIG. 23A. The capacitor CH2 remains connected so as to act as the hold capacitor $C2_H$ for the second MDAC (MDAC2), while the capacitor CH1 is reset.

Next, in the period (3) of FIG. 24B, the switch control unit SWC1 sets the control signals for the switches SWVIN2, SWHC1A/11B/12B, and SWHH1A/1B to "H", causing these switches to turn on. Further, the switch control unit SWC1 sets the control signals for the switches SWVIN1, SWSC1A/11B/12B, SWSH1A/1B, and SWHH2A/2B to "L", causing these switches to turn off. In the period (3), the control signal for the SWSH2A/2B is held at the same level as in the period (2).

As a result, in the MDAC0, the capacitor CSC11 acts as the computation capacitor $C1_{MDAC}$ for the first MDAC (MDAC1), as illustrated in the period (3) of FIG. 23A. On the other hand, the capacitor CH1 is connected so as to act as the hold capacitor $C1_H$ for the first MDAC (MDAC1).

Then, in the period (4) of FIG. 24B, the switch control unit SWC1 sets the control signals for the switches SWSC1A/11B/12B and SWSH2A/2B to "H", causing these switches to turn on, and sets the control signal for the switches SWHC1A/11B/12B to "L", causing these switches to turn off.

In the period (4), the other switches SWVIN1, SWVIN2, SWSH1A/1B, SWHH1A/1B, and SWHH2A/2B are each held at the same level as in the period (3).

As a result, in the MDAC0, the capacitors CSC11 and CSC12 act as the sampling capacitor $C2_s$ for the second MDAC (MDAC2), as illustrated in the period (4) of FIG. 23A. The capacitor CH1 remains connected so as to act as the hold capacitor $C1_H$ for the first MDAC (MDAC1), while the capacitor CH2 is reset.

In the MDAC of the fourth embodiment, the op amp OP1 (common op amp) may be shared between the MDAC1 and the MDAC2 in the same manner as earlier described with reference to FIG. 22A and FIG. 22B.

In this way, according to the MDAC configuration of the fourth embodiment, not only the op amp but the capacitor (CSC: CSC11 and CSC12) may also be shared between the two MDACs, thus making is possible to further reduce the footprint of the switched capacitor circuit or AD conversion circuit.

In the above-described fourth embodiment, scaling may be applied, and the sampling capacitor $C2_s$ in the MDAC2 at the subsequent stage, for example, may be made smaller in size than the sampling capacitor $C1_s$ in the MDAC1 at its preceding stage.

More specifically, when the scaling factor is denoted by γ, generally γ=½ in the case of a 1.5bMDAC and γ=¼ in the case of a 2.5bMDAC; accordingly, the sampling capacitor $C2_s$ in the MDAC2 at the subsequent stage may be formed using a portion of the sampling capacitor $C1_s$ in the MDAC1 at its preceding stage.

Next, before describing the MDAC configuration according to the fifth embodiment, two configuration examples of a parallel MDAC (double-sampling MDAC) system will be described below with reference to FIG. 25, FIG. 26A, and FIG. 263.

The double-sampling AD conversion circuit includes two paralleled MDACs and operates them in interleaved fashion thereby aiming to double the conversion speed of the AD conversion circuit without increasing the power consumption.

FIG. 25 is a diagram for explaining the basic operation of the MDAC of the first configuration example (type I) as applied in the parallel MDAC system. The double-sampling MDAC (parallel MDAC) system depicted here corresponds, for example, to one that performs processing by paralleling two MDACs (MDAC1 and MDAC2) which perform processing in time sequential fashion as described above.

Further, since channel 1 and channel 2 operate 180 degrees out of phase of each other, the double-sampling MDAC system depicted in FIG. 25 may be implemented, for example, by reconfiguring the MDAC1 and MDAC2 in the earlier described FIG. 18A to operate as MDAC1(E: Even mode) and MDAC2(O: Odd mode), respectively.

More specifically, as illustrated in FIG. 25, in the period (1)+(2), the MDAC1(E) samples the input voltage VIN1(E) by using the sampling capacitor $C1_{n1}(E)+C1_{n2}(E)$, while on the other hand, the MDAC1(O) performs computation.

Here, the computation capacitor in the MDAC1(O) is $C1_{n1}(O)$, and the hold capacitor is $C1_{n2}(O)$. In the period (1)+(2), only the op amp OP1(O) in the MDAC1(O) that performs computation is used, and the op amp OP1(E) in the MDAC1(E) that performs the sampling is not used.

Next, in the period (3)+(4), the MDAC1(E) performs computation, and the MDAC1(O) samples the input voltage VIN1 (O) by using the sampling capacitor $C1_{n1}(O)+C1_{n2}(O)$.

Here, the computation capacitor in the MDAC1(E) is $C1_{n1}(E)$, and the hold capacitor is $C1_{n2}(E)$. In the period (3)+(4), only the op amp OP1(E) in the MDAC1(E) that performs computation is used, and the op amp OP1(O) in the MDAC1 (O) that performs the sampling is not used.

In view of the above, the op amp (OP1(E)) is configured to act at the op amp OP1(O) in the period (1)+(2) and as the op amp OP1(E) in the period (3)+(4). However, while the op amp may thus be shared between the MDAC1(E) and the MDAC1 (O), it is not possible to share the capacitors in the parallel MDAC configuration of type I depicted in FIG. 25.

Figure 26A:
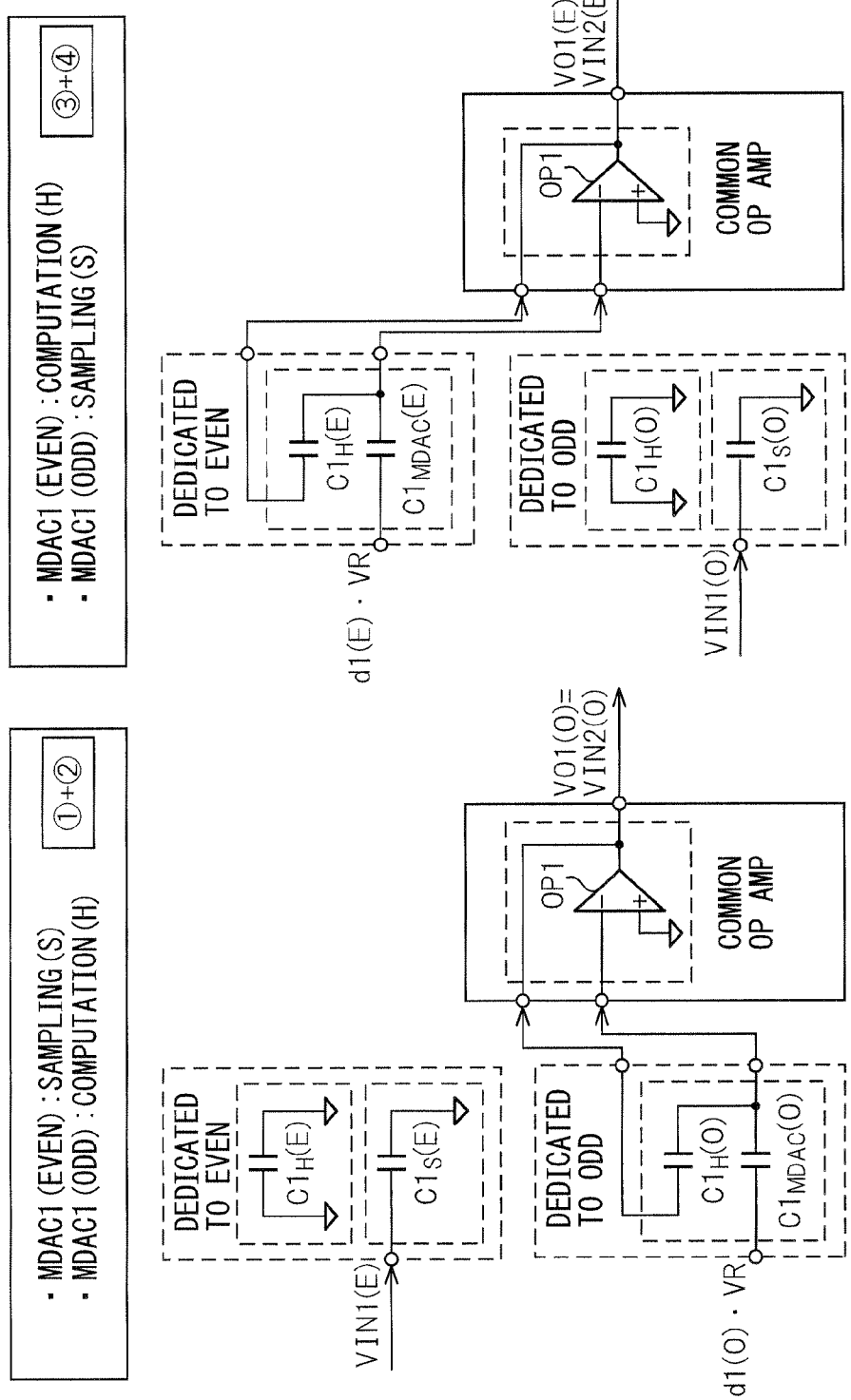
FIG. 26A is a diagram (part 1) for explaining the basic operation of the MDAC of the second configuration example as applied in the parallel MDAC system.
Figure 26B:
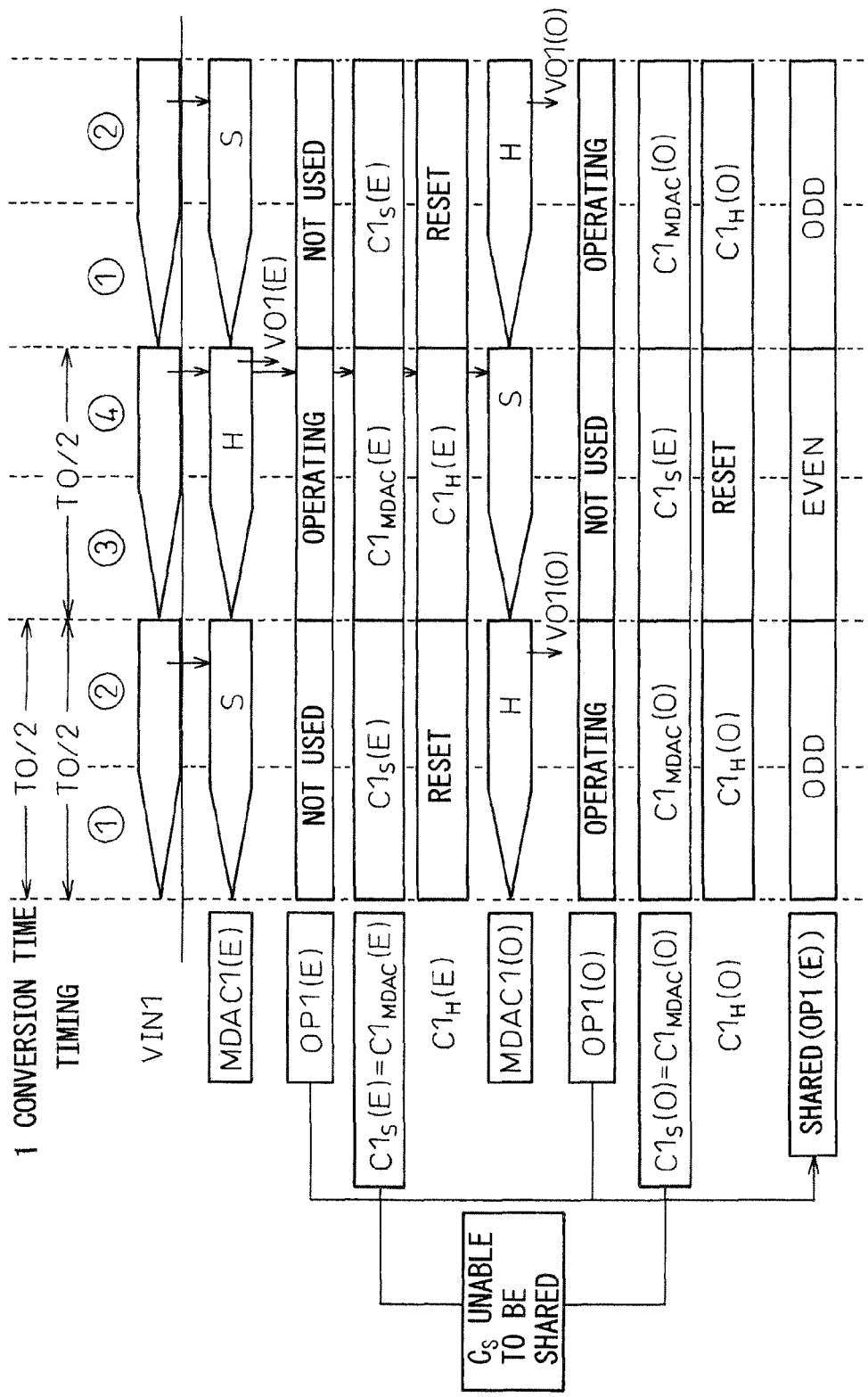
FIG. 26B is a diagram (part 2) for explaining the basic operation of the MDAC of the second configuration example as applied in the parallel MDAC system.

FIG. 26A and FIG. 26B are diagrams for explaining the basic operation of the MDAC of the second configuration example (type II) as applied in the parallel MDAC system. Here, the double-sampling MDAC (parallel MDAC) system depicted in FIG. 26A and FIG. 26B may be implemented, for example, by reconfiguring the MDAC1 and MDAC2 in the earlier described FIG. 22A and FIG. 22B to operate as MDAC1(E) and MDAC2(O), respectively.

That is, as illustrated in the left half of FIG. 26A and in the period (1)+(2) of FIG. 26B, when the MDAC1(E) is in the sampling (S) mode and the MDAC1(O) in the computation (H) mode, the op amp (OP1(E)) in the MDAC1(E) is not used, but the op amp (OP1(0)) in the MDAC1(O) is used (operating).

Further, in the period (1)+(2), the capacitor $C1_s(E)$ in the MDAC1(E) and the capacitors $C1_{MDAC}(O)$ and $C1_H(O)$ in the MDAC1(O) are used, while the capacitor $C1_H(E)$ in the MDAC1(E) is reset.

On the other hand, as illustrated in the right half of FIG. 26A and in the period (3)+(4) of FIG. 26B, when the MDAC1 (E) is in the computation mode and the MDAC1(O) in the sampling mode, the op amp (OP1(E)) in the MDAC1(E) is used, but the op amp (OP1(0)) in the MDAC1(O) is not used.

Further, in the period (3)+(4), the capacitors $C1_{MDAC}(E)$ and $C1_H(E)$ in the MDAC1(E) and the capacitor $C1_s(O)$ in the MDAC1(O) are used, while the capacitor $C1_H(O)$ in the MDAC1(O) is reset.

In view of the above, the op amp (OP1: common op amp) is shared between the two MDACs (MDAC1(E) and MDAC1 (O)). However, in the MDAC configuration of FIG. 26A and FIG. 26B, it is not possible to share the capacitors between the MDAC1(E) and the MDAC1(O).

Figure 27A:
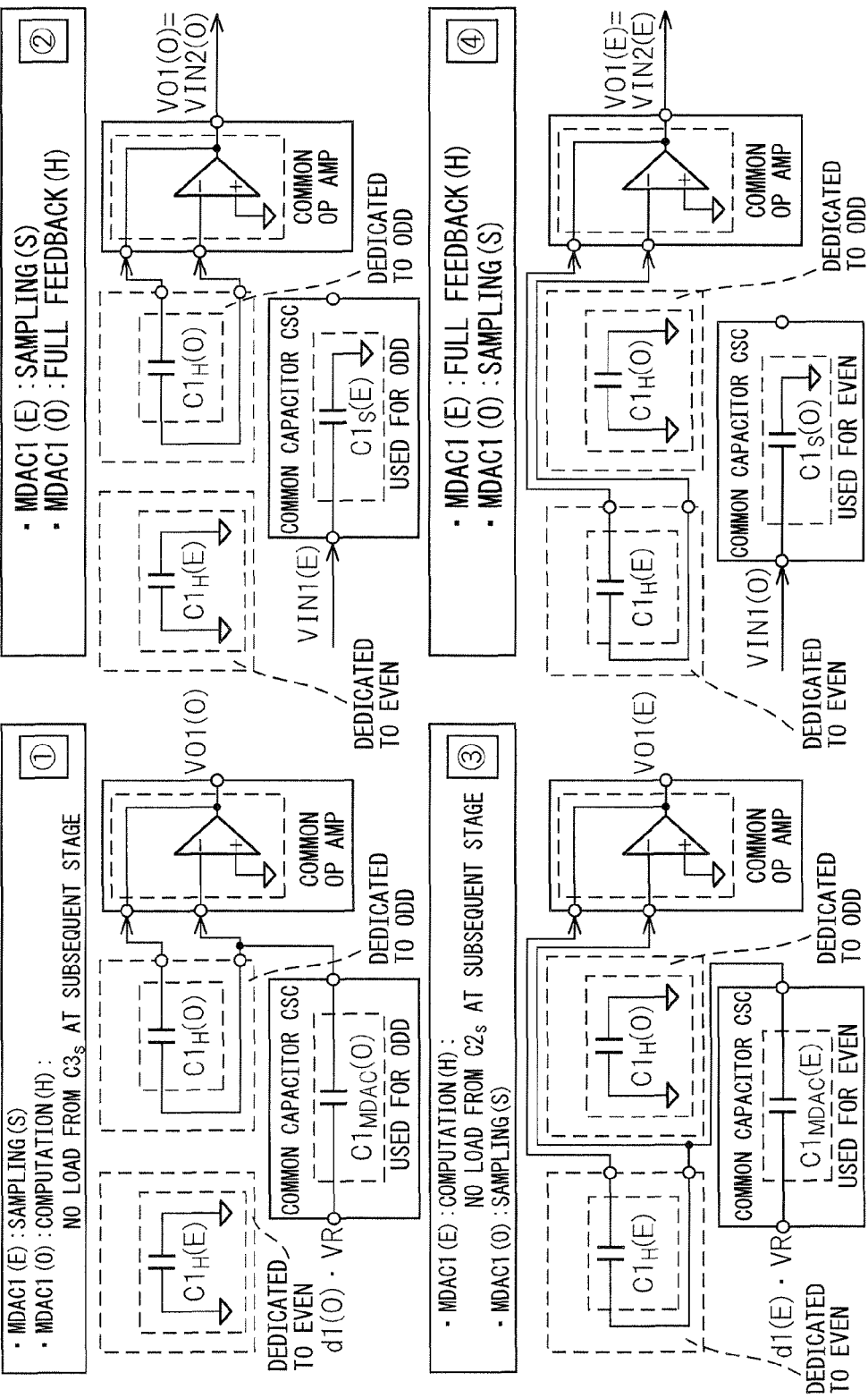
FIG. 27A is a diagram (part 1) for explaining an MDAC according to a fifth embodiment and its operation.

FIG. 27A and FIG. 27B are diagrams for explaining the MDAC of the fifth embodiment and its operation; the MDAC illustrated here is a MDAC of the second configuration example (type II).

The MDAC of the fifth embodiment is implemented by applying the MDAC of the fourth embodiment to a double-sampling MDAC (parallel MDAC) system. More specifically, in FIG. 27A, FIG. 27B, FIG. 28A, and FIG. 28B, the MDAC1 and MDAC2 in the earlier described FIG. 23A, FIG. 23B, FIG. 24A, and FIG. 24B are reconfigured to operate as MDAC1(E) and MDAC1(O), respectively.

That is, as illustrated in FIG. 27A and FIG. 27B, the capacitor CSC is used as $C1_{MDAC}(O)$ in the period (1), as $C1_s(E)$ in the period (2), as $C1_{MDAC}(E)$ in the period (3), and as $C1_s(O)$ in the period (4).

As is apparent from FIG. 27A and FIG. 27B, the hold capacitors $C1_H(E)$ and $C1_H(O)$ need to be provided exclusively for the MDAC1(E) and the MDAC1(O), respectively. However, the sampling capacitors $C1_s(E)$ and $C1_s(O)$ and computation capacitors $C1_{MDAC}(E)$ and $C1_{MDAC}(O)$ in the MDAC1(E) and MDAC1(O) may be replaced by one common capacitor.

In the MDAC of the fifth embodiment, the op amp (common op amp OP1(E)) is shared between the MDAC1(E) and the MDAC1(O) in the same manner as earlier described.

Figure 28A:
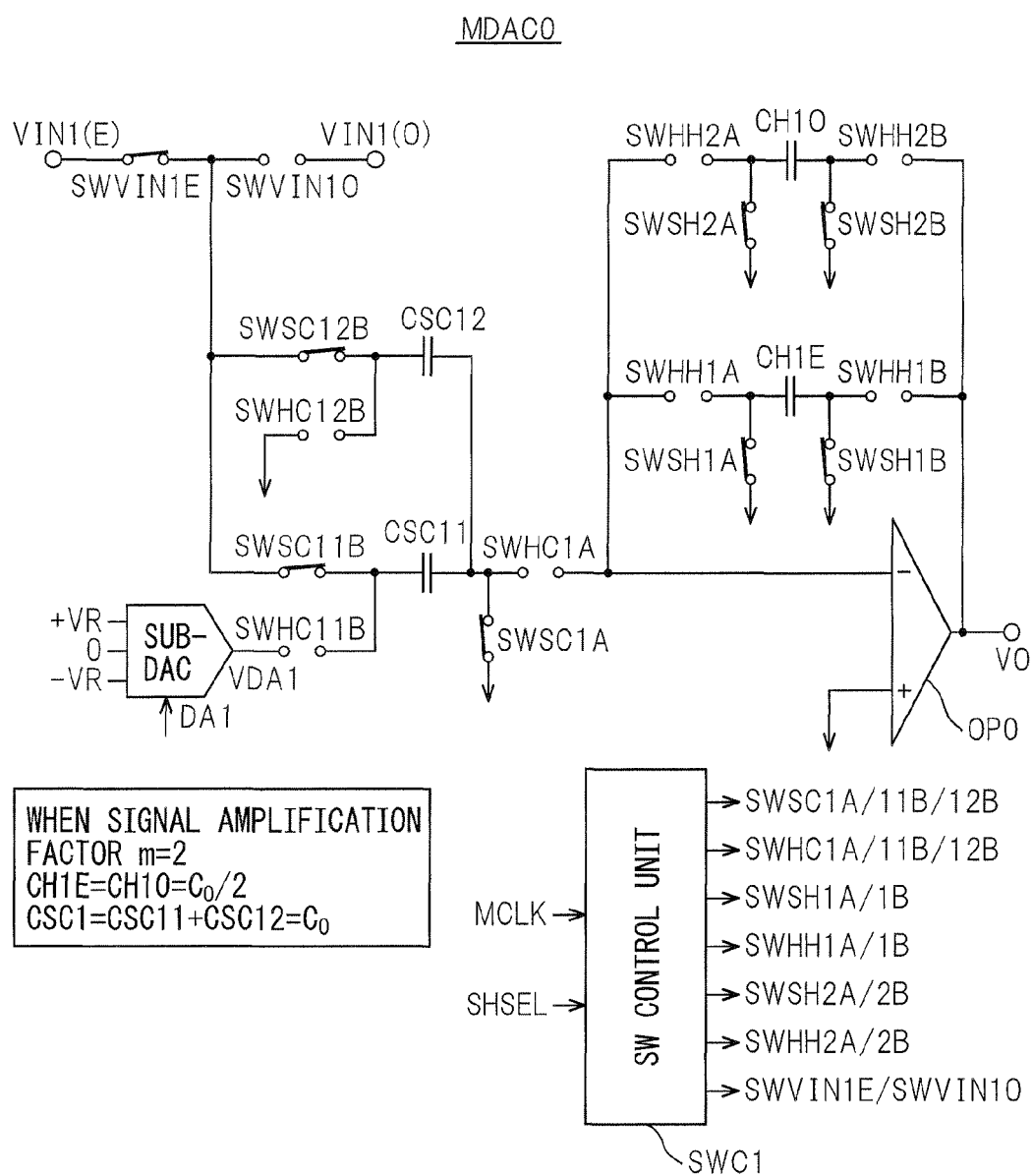
FIG. 28A is a circuit diagram illustrating one example of the MDAC of the fifth embodiment.
Figure 28B:
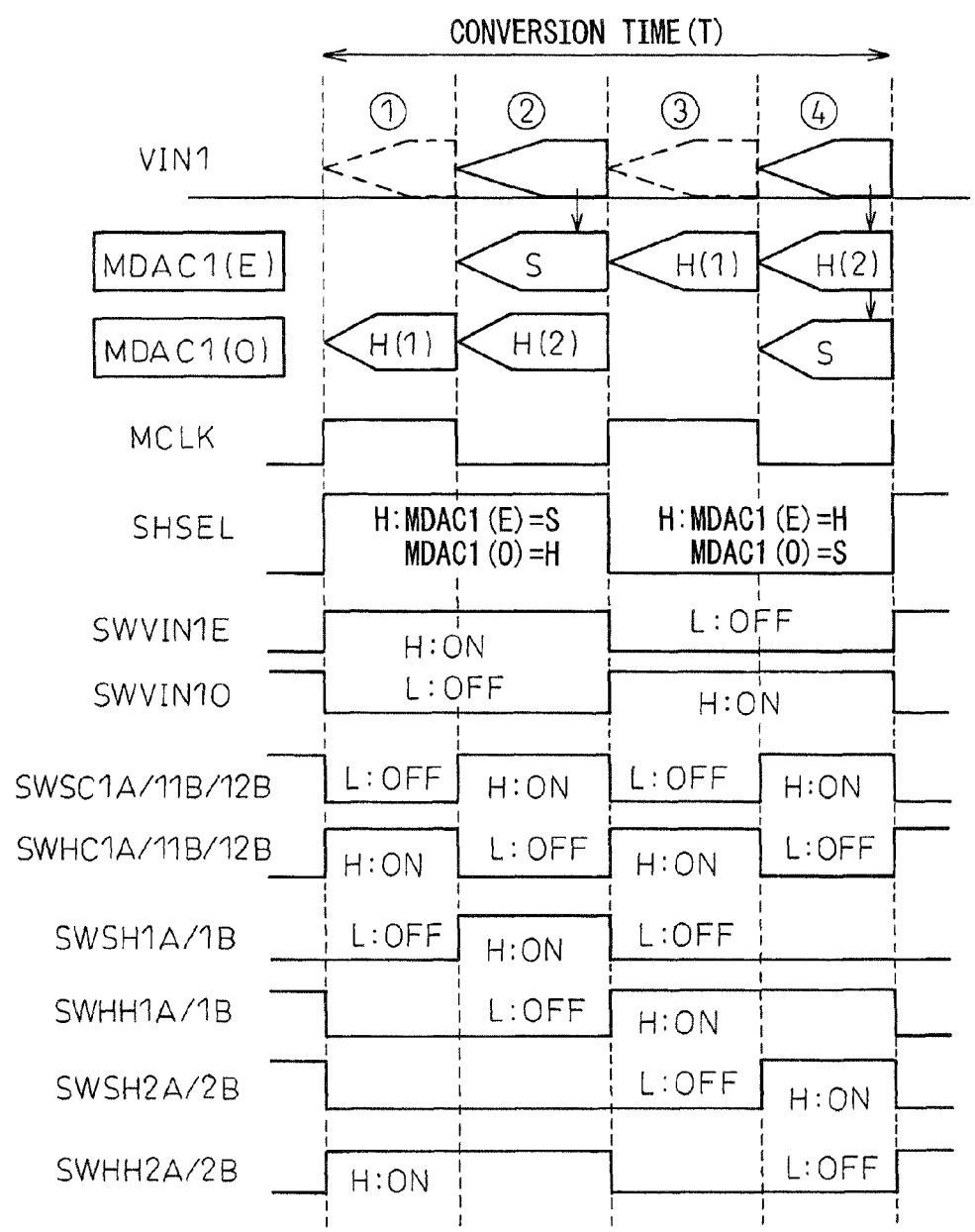
FIG. 28B is a diagram for explaining the operation of the MDAC of FIG. 28A.

FIG. 28A is a circuit diagram illustrating one example of the MDAC of the fourth embodiment, and FIG. 28B is a diagram for explaining the operation of the MDAC of FIG. 28A.

In FIG. 28A, reference characters CSC11 and CSC12 designate the common capacitor (CSC) shared for use, while CH1E designates the hold capacitor ($C1_H(E)$) when used for the first MDAC (MDAC1(E)) and CH1O designates the hold capacitor ($C1_H(O)$) when used for the second MDAC (MDAC1(O)).

In the description of the MDAC of the fifth embodiment, CH1E=CH1O=$C_0$/2 and CSC1=CSC11+CSC12=$C_0$, assuming the case of the signal amplification factor m=2.

As illustrated in FIG. 28A, the MDAC0 (switched capacitor circuit) includes the capacitors CH1E, CH1O, CSC 11, and CSC12 (two or more internal capacitors) and the op amp OP0 (one or more amplifiers). The MDAC0 further includes switches SWVIN1E, SWVIN1O, SWSC1A/11B/12B, SWHC1A/11B/12B, SWSH1A/1B, SWHH1A/1B, SWSH2A/2B, and SWHH2A/2B (two or more internal switches).

First, in the period (1) of FIG. 28B, the switch control unit SWC1 sets the control signals for the switches SWVIN1E, SWHC1A/11B/12B, and SWHH2A/2B to a high level "H", causing these switches to turn on.

Further, in the period (1), the switch control unit SWC1 sets the control signals for the switches SWVIN1O, SWSC1A/11B/12B, SWSH1A/1B, SWHH1A/1B, and SWSH2A/2B to a low level "L", causing these switches to turn off.

As a result, in the MDAC0, the capacitor CSC11 acts as the computation capacitor $C1_{MDAC}(O)$ for the second MDAC (MDAC1(O)), as illustrated in the period (1) of FIG. 27A. On the other hand, the capacitor CH1O is connected so as to act as the hold capacitor $C1_H(O)$ for the second MDAC (MDAC1 (O)).

Next, in the period (2) of FIG. 28B, the switch control unit SWC1 sets the control signals for the switches SWSC1A/11B/12B and SWSH1A/1B to "H", causing these switches to turn on, and sets the control signal for the switches SWHC1A/11B/12B to "L", causing these switches to turn off.

In the period (2), the other switches SWVIN1E, SWVIN1O, SWHH1A/1B, SWSH2A/2B, and SWHH2A/2B are each held at the same level as in the period (1).

As a result, the capacitors CSC11 and CSC12 act as the sampling capacitor $C1_s(E)$ for the first MDAC (MDAC1(E)), as illustrated in the period (2) of FIG. 27A. The capacitor CH1O remains connected so as to act as the hold capacitor $C1_H(O)$ for the second MDAC (MDAC1(O)), while the capacitor CH1E is reset.

Next, in the period (3) of FIG. 28B, the switch control unit SWC1 sets the control signals for the switches SWVIN1O, SWHC1A/11B/12B, and SWHH1A/1B to "H", causing these switches to turn on. Further, the switch control unit SWC1 sets the control signals for the switches SWVIN1E, SWSC1A/11B/12B, SWSH1A/1B, and SWHH2A/2B to "L", causing these switches to turn off. In the period (3), the control signal for the SWSH2A/2B is held at the same level as in the period (2).

As a result, in the MDAC0, the capacitor CSC11 acts as the computation capacitor $C1_{MDAC}(E)$ for the first MDAC (MDAC1(E)), as illustrated in the period (3) of FIG. 27A. On the other hand, the capacitor CH1E is connected so as to act as the hold capacitor $C1_H(E)$ for the first MDAC (MDAC1(E)).

Then, in the period (4) of FIG. 28B, the switch control unit SWC1 sets the control signals for the switches SWSC1A/11B/12B and SWSH2A/2B to "H", causing these switches to turn on, and sets the control signal for the switches SWHC1A/11B/12B to "L", causing these switches to turn off.

In the period (4), the other switches SWVIN1E, SWVIN1O, SWSH1A/1B, SWHH1A/1B, and SWHH2A/2B are each held at the same level as in the period (3).

As a result, in the MDAC0, the capacitors CSC11 and CSC12 act as the sampling capacitor $C1_s(O)$ for the second MDAC (MDAC1(O)), as illustrated in the period (4) of FIG. 27A. The capacitor CH1E remains connected so as to act as the hold capacitor $C1_H(E)$ for the first MDAC (MDAC1(E)), while the capacitor CH1O is reset.

In the MDAC of the fifth embodiment, the op amp OP1(E) may be shared between the MDAC1(E) and the MDAC1(O) in the same manner as earlier described.

In this way, according to the MDAC configuration of the fifth embodiment, not only the op amp but the capacitor (CSC: CSC11 and CSC12) may also be shared between the two MDACs, thus making is possible to further reduce the footprint of the switched capacitor circuit or AD conversion circuit.

FIG. 29 is a diagram illustrating the performance of the MDACs of the fourth and fifth embodiments for comparison with the performance of the MDACs depicted in FIGS. 22A and 26A. FIG. 29 provides data not only for the case of the signal amplification factor m=2 but also for the case of m=4.

While the MDACs depicted in FIGS. 22A and 26A and the MDACs of the fourth and fifth embodiments have each been described by dealing with a 1.5bMDAC with m=2, FIG. 29 also deals with 2.5bMDACs with m=4 such as described with reference to FIG. 4A, FIG. 4B, and FIG. 4C.

That is, FIG. 29 also provides data for the m=4 version of the MDACs depicted in FIGS. 22A and 26A and the m=4 version of the MDACs of the fourth and fifth embodiments.

In FIG. 29, for the fourth embodiment, data is provided for the case of no scaling applied as well as the case of scaling applied, and the coefficient 2 is given by considering the capacitance for two MDACs. Further, for the input voltage (signal amplitude), data has been obtained by calculating $(C1_{MDAC}+C1_H)\times$coefficient 2, without regard to the magnitude of the input voltage.

As is apparent from FIG. 29, the MDAC of the fourth embodiment achieves, by virtue of the capacitor sharing, a reduction in capacitance, i.e., the footprint of the capacitors (the circuit), by about 33% in the case of no scaling applied and about 22% in the case of scaling applied.

It is also seen that the m=4 version of the MDAC of the fourth embodiment achieves a reduction in capacitance, i.e., the footprint of the circuit, by about 40% in the case of no scaling applied and about 16% in the case of scaling applied.

It is further seen that the MDAC of the fifth embodiment achieves a reduction in capacitance, i.e., the footprint of the circuit, by about 33% and also that the m=4 version of the MDAC of the fifth embodiment achieves a reduction in capacitance, i.e., the footprint of the circuit, by about 40%.

Here, the signal amplification factors m=2 and m=4 are only examples, and it will be appreciated that larger bit-width versions of the MDACs of the fourth and fifth embodiment also achieve the effect of reducing the footprint of the circuit.

Figure 30:
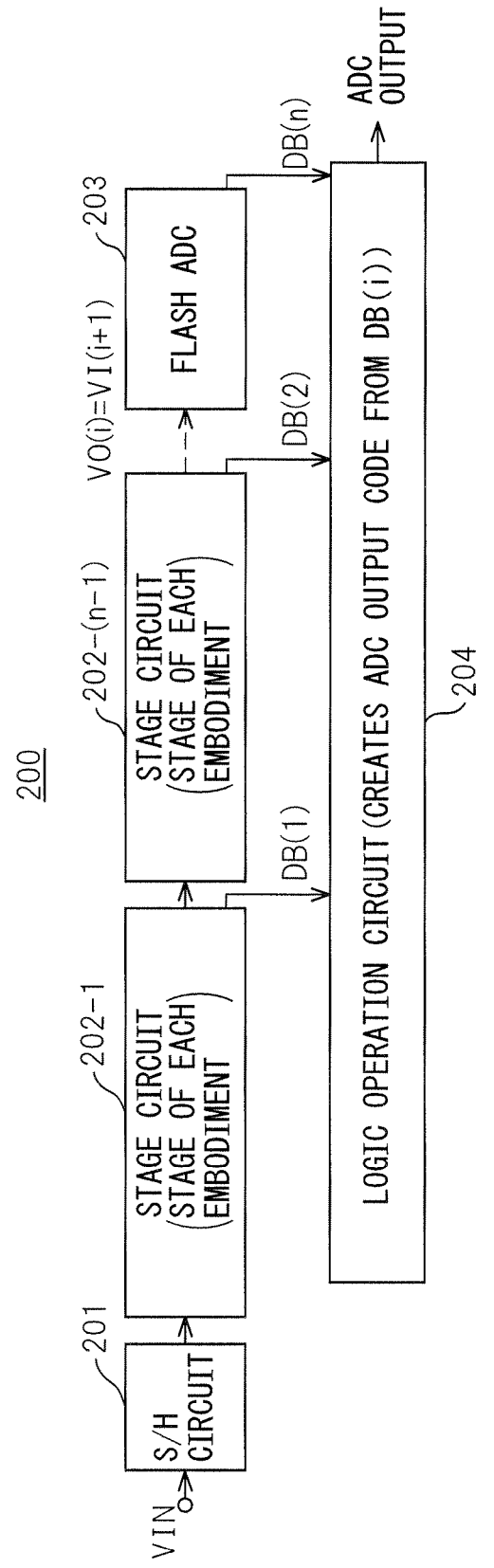
FIG. 30 is a block diagram schematically illustrating one example of a pipelined AD conversion circuit to which the stage circuit that has the MDAC of each embodiment or the sub-ADC of each embodiment is applied.

FIG. 30 is a block diagram schematically illustrating one example of a pipelined AD conversion circuit to which the stage circuit that has the MDAC of each embodiment or the sub-ADC of each embodiment is applied, and FIG. 31 is a block diagram schematically illustrating one example of a cyclic AD conversion circuit to which the stage circuit that has the MDAC of each embodiment or the sub-ADC of each embodiment is applied.

The MDAC of any one of the first to fifth embodiments described above may be applied, for example, as an MDAC in a cascade of MDAC circuits 202-1 to 202-(n−1) such as used in the pipelined AD conversion circuit 200 of FIG. 30.

As illustrated in FIG. 30, the pipelined AD conversion circuit 200 includes a sample-and-hold (S/H) circuit 201, (n−1) stages of MDAC circuits 202-1 to 202-(n−1), a flash ADC 203 at the last stage, and a logic operation circuit (digital correction circuit) 204.

The sample-and-hold circuit 201 samples the input voltage VIN and holds it, and supplies its output signal to the MDAC circuits 202-1 to 202-(n−1).

The logic operation circuit 204 receives the output signals DB(1) to DB(n−1) of the MDAC circuits 202-1 to 202-(n−1) as well as the output signal DB(n) of the flash ADC 203 at the last stage, and produces an output code (ADC output) by analog-to-digital converting the input voltage VIN with a resolution corresponding to the number of stages of the MDAC circuits.

Further, the MDAC of any one of the first to fifth embodiments described above may be applied, for example, as an MDAC circuit 303 such as used in the cyclic AD conversion circuit 300 of FIG. 31.

That is, as illustrated in FIG. 31, the cyclic AD conversion circuit 300 includes, in addition to the MDAC circuit 303, a switch 301, a sample-and-hold (S/H) circuit 302, and a logic operation circuit 304. The sample-and-hold circuit 302 may be omitted.

The sample-and-hold circuit 302 samples the input voltage VIN or the output voltage VO(i)=VI(i+1) of the MDAC circuit 303, whichever is selected by the switch 301, and holds the sampled voltage, and the switch 301 causes the output voltage VO(i) of the MDAC circuit 303 to cycle a plurality of times.

The signal DB(i) output from the MDAC circuit 303 in each cycle is supplied to the logic operation circuit 304, and the logic operation circuit 304 produces an output code (ADC output) by analog-to-digital converting the voltage with a resolution corresponding to the number of cycles through the MDAC circuit.

While the MDACs (switched capacitor circuits) of the first to fifth embodiments have been described in detail above, it will be appreciated that various modifications may be made, for example, to the number of switches or capacitors in each MDAC or their connections or to the switch timing of each switch controlled by the switch control unit.

It will also be appreciated that the MDACs of the first to fifth embodiments may be applied not only to pipelined AD conversion circuits and cyclic AD conversion circuits but also extensively to various other circuits such as DA converts and filters.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A switched capacitor circuit configured to be operable in two or more kinds of operation modes including a first operation mode and a second operation mode, wherein
    the switched capacitor circuit comprises an amplifier and two or more internal capacitors with switches for controlling connection/disconnection of the capacitor;
    in the first operation mode that precedes the second operation mode, the switched capacitor circuit generates a first analog output voltage by using the first internal capacitor connected between an input terminal and output terminal of the amplifier by using its switches, the other internal capacitances connected between an input terminal of the amplifier and each analog input voltage supply by using its switches; and
    in the second operation mode that follows the first operation mode, the switched capacitor circuit generates a second analog output voltage with larger feedback factor of the amplifier than it in the first operation mode, by disconnecting some of the internal capacitors, except the first internal capacitor, from the first operation mode.

2. The switched capacitor circuit as claimed in claim 1, wherein
    the amplifier is an operational amplifier; and
    in the second operation mode, the switched capacitor circuit generates the second analog output voltage in a full feedback mode with a feedback ratio of unity, by removing all internal capacitors, except the first internal capacitor, from the first operation mode.

3. The switched capacitor circuit as claimed in claim 1, wherein
    the ratio between the duration of the first operation mode and the duration of the second operation mode is varied.

4. The switched capacitor circuit as claimed in claim 1, wherein
    supply current to the amplifier is set to different values between the first operation mode and the second operation mode.

5. The switched capacitor circuit as claimed in claim 1, wherein
the switched capacitor circuit is included in one or more load circuits;
the switched capacitor circuit is included in one or more load circuits;
each of the load circuits includes a load capacitor with switches for controlling connection/disconnection to the amplifier output terminal for sampling its output voltage; and
at least one of the load capacitors is disconnected from the amplifier output terminal in the first operation mode, and is connected with the amplifier output terminal in the second operation mode by using its switches.

6. A switched capacitor circuit comprising a first switched capacitor circuit and a second switched capacitor circuit as a pair of circuits each being identical to the switched capacitor circuit, the switched capacitor circuit being configured to be operable in two or more kinds of operation modes including a first operation mode and a second operation mode, wherein
the switched capacitor circuit comprises an amplifier and two or more internal capacitors with switches for controlling connection/disconnection of the capacitor;
in the first operation mode that precedes the second operation mode, the switched capacitor circuit generates a first analog output voltage by using the first internal capacitor connected between an input terminal and output terminal of the amplifier by using its switches, the other internal capacitances connected between an input terminal of the amplifier and each analog input voltage supply by using its switches;
in the second operation mode that follows the first operation mode, the switched capacitor circuit generates the second analog output voltage with larger feedback factor of the amplifier than it in the first operation mode, by disconnecting some of the internal capacitors, except the first internal capacitor, from the first operation mode;
the first and second switched capacitor circuits perform analog computation in the first operation mode and the second operation mode during respectively different periods;
the internal capacitors in each of the first and second switched capacitor circuits include a sampling capacitor array for sampling an input signal at the time of sampling, and first and second analog computation capacitor arrays for performing the analog computation;
in the first operation mode of the analog computation, the first analog computation capacitor array and a second analog computation capacitor array are connected to the amplifier, while in the second operation mode of the analog computation, the first analog computation capacitor array is disconnected from the amplifier and the sampling capacitor array is entirely contained in the first analog computation capacitor array or is the same as the first analog computation capacitor array; and
at least a portion of the sampling capacitor array in the first switched capacitor circuit and a portion of the sampling capacitor array in the second switched capacitor circuit are shared therebetween.

7. The switched capacitor circuit as claimed in claim 6, wherein
the sampling capacitor array and the first analog computation capacitor array in the first switched capacitor circuit are the same capacitor arrays as the sampling capacitor array and the first analog computation capacitor array in the second switched capacitor circuit, respectively; and
the second analog computation capacitor array in the first switched capacitor circuit and the second analog computation capacitor array in the second switched capacitor circuit are controlled so as to reset a charge stored thereacross when the first switched capacitor circuit and the second switched capacitor circuit, respectively, perform a sampling operation.

8. The switched capacitor circuit as claimed in claim 6, wherein
the amplifiers in the first and second stage circuits are shared therebetween.

9. A stage circuit for AD converter comprising:
an MDAC circuit and a sub-AD converter, wherein
the MDAC circuit includes the switched capacitor circuit, the switched capacitor circuit being configured to be operable in two or more kinds of operation modes including a first operation mode and a second operation mode, wherein
the switched capacitor circuit comprises an amplifier and two or more internal capacitors with switches for controlling connection/disconnection of the capacitor;
in the first operation mode that precedes the second operation mode, the switched capacitor circuit generates a first analog output voltage by using the first internal capacitor connected between an input terminal and output terminal of the amplifier by using its switches, the other internal capacitances connected between an input terminal of the amplifier and each analog input voltage supply by using its switches;
in the second operation mode that follows the first operation mode, the switched capacitor circuit generates the second analog output voltage with larger feedback factor of the amplifier than it in the first operation mode, by disconnecting some of the internal capacitors, except the first internal capacitor, from the first operation mode;
the sub-AD converter includes one or more comparators for AD-converting an input signal;
the sub-ADC converter generates AD codes for the stage input signal, and
the MDAC circuit generates the first and second stage output signals a result of an addition or subtraction performed on a reference voltage based on the amplified stage input signal, by using the following proceeding:
in the sampling mode, that precedes the first operation mode, one or more internal capacitances are sampled the stage input signal and the other internal capacitances are set constant voltage including reset by using each switches;
in the first operation mode that precedes the second operation mode, the switched capacitor circuit generates the first analog output voltage by using the first internal capacitor connected between an input terminal and output terminal of the amplifier by using its switches, the other internal capacitances connected between an input terminal of the amplifier and each analog input voltage supply that is selected one of the reference power supplies by using the AD codes from the sub-ADC; and
in the second operation mode that follows the first operation mode, the switched capacitor circuit generates a second analog output voltage with larger feedback factor of the amplifier than it in the first operation mode, by removing some of the internal capacitors, except the first internal capacitor, from the first operation mode.

10. The stage circuit for AD converter as claimed in claim 9, the stage circuit is a first stage circuit connecting the following stage circuit, wherein
the following stage input signal of the following stage circuit are used with the first and/or second stage output signal of the first stage circuit;
the internal sampling capacitance array of the MDAC of the following stage is connected the first stage output terminal for sampling the stage input signal in only the second operation mode of the first MDAC, but disconnected from the first stage circuit in the first operation mode.

11. The stage circuit for AD converter comprising a first stage circuit and a second stage circuit as a pair of circuits each being identical to the stage circuit as claimed in claim 9, wherein
the analog input signal of the second stage circuit is used the analog output signal of the first stage circuit; and
the second sub-ADC compares and judges a voltage of the analog input signal by using the results that the first MDAC circuit outputs in the first or the second operation mode.

12. The stage circuit for AD converter as claimed in claim 11, wherein
one or more of the comparators are used in both the first operation mode and the second operation mode.

13. The stage circuit for AD converter comprising a first stage circuit and a second stage circuit as a pair of circuits each being identical to the stage circuit as claimed in claim 9, wherein
the analog input signal of the second stage circuit is used the analog output signal of the first stage circuit;
the comparator circuit of the second sub-ADC compares and judges a voltage of the analog input signal by using the results that the first MDAC circuit outputs in the first operation mode and the second operation mode, respectively; and
a comparison level with which the comparator compares the voltage of the input signal in the second operation mode is changed in accordance with the result of the comparison that the comparator made for the voltage of the input signal in the first operation mode.

14. The stage circuit for AD converter as claimed in claim 9, wherein
the first MDAC circuit in the first stage circuit and the second MDAC circuit in the second stage circuit perform analog computation in the first operation mode and the second operation mode during respectively different periods;
the internal capacitors in each of the first and second MDAC circuits include a sampling capacitor array for sampling an input signal at the time of sampling, and first and second analog computation capacitor arrays for performing the analog computation;
in the first operation mode of the analog computation, the first analog computation capacitor array and the second analog computation capacitor array are connected to the amplifier, while in the second operation mode of the analog computation, the first analog computation capacitor array is disconnected from the amplifier and the sampling capacitor array is entirely contained in the first analog computation capacitor array or is the same as the first analog computation capacitor array; and
at least a portion of the sampling capacitor array in the first MDAC circuit and a portion of the sampling capacitor array in the second MDAC circuit are shared therebetween.

15. The stage circuit for AD converter as claimed in claim 14, wherein
the sampling capacitor array and the first analog computation capacitor array in the first MDAC circuit are the same capacitor arrays as the sampling capacitor array and the first analog computation capacitor array in the second MDAC circuit, respectively; and
the second analog computation capacitor array in the first MDAC circuit and the second analog computation capacitor array in the second MDAC circuit are controlled so as to reset a charge stored thereacross when the first switched capacitor circuit and the second switched capacitor circuit, respectively, perform a sampling operation.

16. The stage circuit for AD converter as claimed in claim 15, wherein
the first and second stage circuits are cascaded with each other.

17. The stage circuit for AD converter as claimed in claim 16, wherein
the amplifiers in the first and second stage circuits are shared therebetween.

18. The stage circuit for AD converter as claimed in claim 14, wherein
the first and second stage circuits are connected in parallel with each other.

19. A pipelined AD conversion circuit comprising two or more stage circuits each being identical to the stage circuit as claimed in claim 9.

20. A cyclic AD conversion circuit comprising one or more stage circuits each being identical to the stage circuit as claimed in claim 9.

* * * * *